(12) United States Patent
Lee et al.

(10) Patent No.: US 12,057,391 B2
(45) Date of Patent: Aug. 6, 2024

(54) SEMICONDUCTOR DEVICE AND MASSIVE DATA STORAGE SYSTEM INCLUDING THE SAME

(71) Applicant: SAMSUNG ELECTRONICS CO., LTD., Suwon-si (KR)

(72) Inventors: Yohan Lee, Incheon (KR); Chaehoon Kim, Gwacheon-si (KR); Jaeduk Yu, Seoul (KR); Jiho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 121 days.

(21) Appl. No.: 17/933,770

(22) Filed: Sep. 20, 2022

(65) Prior Publication Data

US 2023/0307353 A1    Sep. 28, 2023

(30) Foreign Application Priority Data

Mar. 28, 2022    (KR) .................. 10-2022-0037903

(51) Int. Cl.
*H01L 27/115*    (2017.01)
*H01L 23/522*    (2006.01)
*H10B 43/27*    (2023.01)

(52) U.S. Cl.
CPC ......... *H01L 23/5226* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 9,530,794 B2 | 12/2016 | Ramaswamy et al. | |
| 10,804,295 B2 | 10/2020 | Yoo et al. | |
| 11,164,890 B2 | 11/2021 | Zhang et al. | |
| 11,177,284 B2 | 11/2021 | Rabkin et al. | |
| 2011/0143524 A1 | 6/2011 | Son et al. | |
| 2018/0040553 A1* | 2/2018 | Tak | H10B 41/41 |
| 2020/0098786 A1* | 3/2020 | Park | H01L 23/481 |

(Continued)

OTHER PUBLICATIONS

Katsunori Onishi, et al., "Effects of High-Temperture Forming Gas Anneal on HfO2 MOSFET Performance," 2002, Symposium on VLSI Technology Digest of Technical Papers, Jun. 11-13, 2022, (pp. 22-23), XP032411320.

(Continued)

*Primary Examiner* — Benjamin P Sandvik
(74) *Attorney, Agent, or Firm* — F. CHAU & ASSOCIATES, LLC

(57) ABSTRACT

A semiconductor device includes a CSL driver on a substrate, a CSP on the CSL driver, a gate electrode structure on the CSP and including gate electrodes spaced apart from each other in a first direction perpendicular to an upper surface of the substrate, each of the gate electrodes extends in a second direction parallel to the upper surface of the substrate, a memory channel structure on the CSP and extending through the gate electrode structure and is connected to the CSP, a first upper wiring structure contacting an upper surface of the CSP, a first through via extending through the CSP in the first direction and is electrically connected to the first upper wiring structure and the CSL driver but does not contact the CPS, and a dummy wiring structure contacting the upper surface of the CSP but is not electrically connected to the CSL driver.

20 Claims, 53 Drawing Sheets

(56) References Cited

U.S. PATENT DOCUMENTS

| | | | |
|---|---|---|---|
| 2020/0194453 A1 | 6/2020 | Lim | |
| 2020/0357821 A1 | 11/2020 | Chen | |
| 2020/0373321 A1* | 11/2020 | Kwak | H01L 23/528 |
| 2021/0020669 A1 | 1/2021 | Chen | |
| 2021/0036013 A1* | 2/2021 | Lee | H10B 43/10 |
| 2021/0128013 A1 | 4/2021 | Lai et al. | |
| 2021/0183879 A1* | 6/2021 | Ahn | H01L 27/0255 |
| 2021/0193872 A1 | 6/2021 | Kim et al. | |
| 2021/0217765 A1* | 7/2021 | Kim | G11C 7/12 |
| 2021/0242241 A1 | 8/2021 | Rajashekhar et al. | |
| 2021/0272983 A1 | 9/2021 | Gilbert et al. | |
| 2022/0093630 A1* | 3/2022 | Koh | H10B 43/27 |
| 2023/0009932 A1* | 1/2023 | Lee | H10B 41/50 |

OTHER PUBLICATIONS

Extended European Search Report Dated Jul. 26, 2023 For European Appln. Serial No. 22200752.8.

* cited by examiner

SEMICONDUCTOR DEVICE AND MASSIVE DATA STORAGE SYSTEM INCLUDING THE SAME

CROSS-REFERENCE TO RELATED APPLICATIONS

This application claims priority under 35 USC § 119 from Korean Patent Application No 10-2022-0037903, filed on Mar. 28, 2022 in the Korean Intellectual Property Office (KIPO), the contents of which are herein incorporated by reference in their entirety.

TECHNICAL FIELD

Embodiments of the inventive concepts are directed to a semiconductor device and a massive data storage system including the same.

DISCUSSION OF RELATED ART

An electronic system that uses data storage needs a high capacity semiconductor device that can store high capacity data. Thus, a method of increasing the data storage capacity of the semiconductor device has been studied. For example, a semiconductor device that includes memory cells that can be 3-dimensionally stacked has been suggested.

In a semiconductor device, gate electrodes are stacked vertically on a substrate and a memory channel structure extends through the gate electrodes. The channel in the memory channel structure can be damaged by a deposition process, an etching process, and thermal processes that form other structures thereafter, and electrical properties of the channel may be degraded.

SUMMARY

Exemplary embodiments provide a semiconductor device that has improved characteristics.

Exemplary embodiments provide a massive data storage system that includes a semiconductor device that has improved characteristics.

According to an embodiment of the inventive concept, there is provided a semiconductor device. The semiconductor device includes a common source line (CSL) driver disposed on a substrate, a common source plate (CSP) disposed on the CSL driver, a gate electrode structure disposed on the CSP and that includes gate electrodes spaced apart from each other in a first direction substantially perpendicular to an upper surface of the substrate, where each of the gate electrodes extends in a second direction substantially parallel to the upper surface of the substrate, a memory channel structure disposed on the CSP, where memory channel structure extends through the gate electrode structure and is connected to the CSP, a first upper wiring structure that contacts an upper surface of the CSP, a first through via disposed on the substrate, wherein the first through via extends through the CSP in the first direction and is electrically connected to the first upper wiring structure and the CSL driver but does not contact the CPS, and a dummy wiring structure that contacts the upper surface of the CSP and is not electrically connected to the CSL driver.

According to an embodiment of the inventive concept, there is provided a semiconductor device. The semiconductor device includes a lower circuit pattern disposed on a substrate, a common source plate (CSP) disposed on the lower circuit pattern, a gate electrode structure disposed on the CSP, wherein the gate electrode structure includes gate electrodes spaced apart from each other in a first direction substantially perpendicular to an upper surface of the substrate, wherein each of the gate electrodes extends in a second direction substantially parallel to the upper surface of the substrate, a memory channel structure disposed on the CSP and that extends through the gate electrode structure, where the memory channel structure is connected to the CSP, a first upper wiring structure that contacts an upper surface of the CSP, a second upper wiring structure that contacts the upper surface of the CSP, where the second upper wiring structure is spaced apart from the first upper wiring structure, a through via disposed on the substrate, wherein the through via extends through the CSP in the first direction and is electrically connected to the lower circuit pattern but does not contact the CSP, and a third upper wiring structure that contacts an upper surface of the through via. The first upper wiring structure is connected to the third upper wiring structure, and the second upper wiring structure is not connected to the third upper wiring structure, and does not receive an electric signal from the lower circuit pattern.

According to an embodiment of the inventive concept, there is provided a semiconductor device. The semiconductor device includes a common source line (CSL) driver disposed on a substrate, a page buffer disposed on the substrate, a common source plate (CSP) disposed on the CSL driver and the page buffer, a filling layer formed at a same level as and that extends through the CSP, a gate electrode structure disposed on the CSP, wherein the gate electrode structure includes gate electrodes spaced apart from each other in a first direction substantially perpendicular to an upper surface of the substrate, where each of the gate electrodes extends in a second direction substantially parallel to the upper surface of the substrate, a memory channel structure disposed on the CSP, wherein the memory channel structure extends through the gate electrode structure and is connected to the CSP, a first upper wiring structure that contacts an upper surface of the CSP, a second upper wiring structure that contacts the upper surface of the CSP, where the second upper wiring structure is spaced apart from the first upper wiring structure, a first through via disposed on the substrate, wherein first through via extends through the filling layer in the first direction on the substrate and is electrically connected to the CSL driver, a second through via disposed on the substrate, wherein second through via extends through the filling layer in the first direction and is electrically connected to the page buffer, a third upper wiring structure electrically connected to the gate electrode structure, and a bit line electrically connected to the second through via and the memory channel structure. The first upper wiring structure is connected to the first though via, and the second upper wiring structure is not connected to the first though via and does not receive an electric signal from the lower circuit pattern.

According to an embodiment of the inventive concept, there is provided a massive data storage system. The massive data storage system includes a semiconductor device and a controller. The semiconductor device includes a lower circuit pattern disposed on a substrate, a common source plate (CSP) disposed on the lower circuit pattern, a gate electrode structure disposed on the CSP, wherein the gate electrode structure includes gate electrodes that are spaced apart from each other in a first direction substantially perpendicular to an upper surface of the substrate, where each of the gate electrodes extends in a second direction substantially parallel to the upper surface of the substrate, a memory channel structure disposed on the CSP, wherein memory channel structure extends through the gate electrode structure on the CSP and is connected to the CSP, a first upper wiring structure that contacts an upper surface of the CSP, a second upper wiring structure that contacts the upper surface of the CSP, where the second upper wiring structure is spaced apart from the first upper wiring structure, a through via disposed on the substrate, wherein the through via extends through the CSP in the first direction and is electrically connected to the lower circuit pattern but does not contact the CPS, a third upper wiring structure that contacts an upper surface of the through via, and an input/output pad that is electrically connected to the lower circuit pattern. The first upper wiring structure is connected to the third upper wiring structure, and the second upper wiring structure is not connected to the third upper wiring structure and does not receive an electric signal from the lower circuit pattern. The controller is electrically connected to the semiconductor device through the input/output pad and controls the semiconductor device.

In a semiconductor device in accordance with exemplary embodiments, if a channel that includes polysilicon is damaged by a deposition process, an etching process, and/or various thermal processes that form other structures thereafter, electrical characteristics of the channel may be degraded. However, hydrogen that moves through a dummy wiring structure that connects the channel connection pattern to the channel can cure the channel, and the electrical characteristics of the channel can be secured. In addition, connecting a portion of the dummy wiring structure to the upper wiring structure that is electrically connected to the CSL driver can improve the skew due to the change of CSL noise, and thus cost and time may be reduced.

DETAILED DESCRIPTION

Hereinafter, a semiconductor device, a method for manufacturing the same, and a mass data storage system that includes a semiconductor device in accordance with exemplary embodiments will be described in detail with reference to the accompanying drawings. It will be understood that, although the terms "first," "second," and/or "third" may be used herein to describe various elements, these elements should not be limited by these terms. These terms are only used to distinguish one element from another element.

FIGS. 1 to 35 are plan views and cross-sectional views that illustrate a method of manufacturing a semiconductor device, such as a vertical channel NAND flash memory device, in accordance with exemplary embodiments. In particular, FIGS. 1-2, 4, 7, 12-13, 18, 25 and 28 are plan views, and FIGS. 3, 5-6, 8-11, 14-17, 19-24, 26-27 and 29-35 are cross-sectional views.

Figure 31:
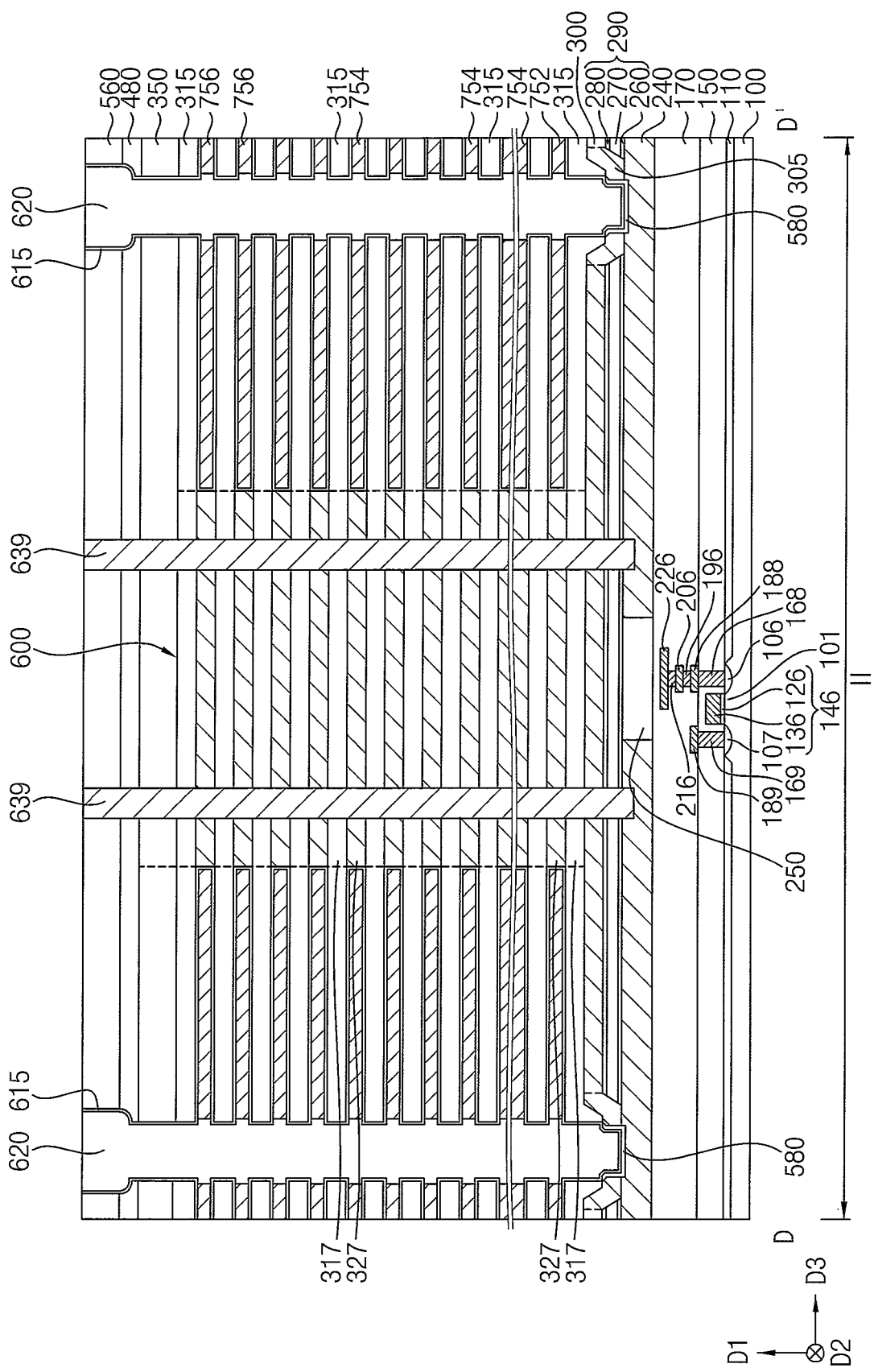
Figure 32:
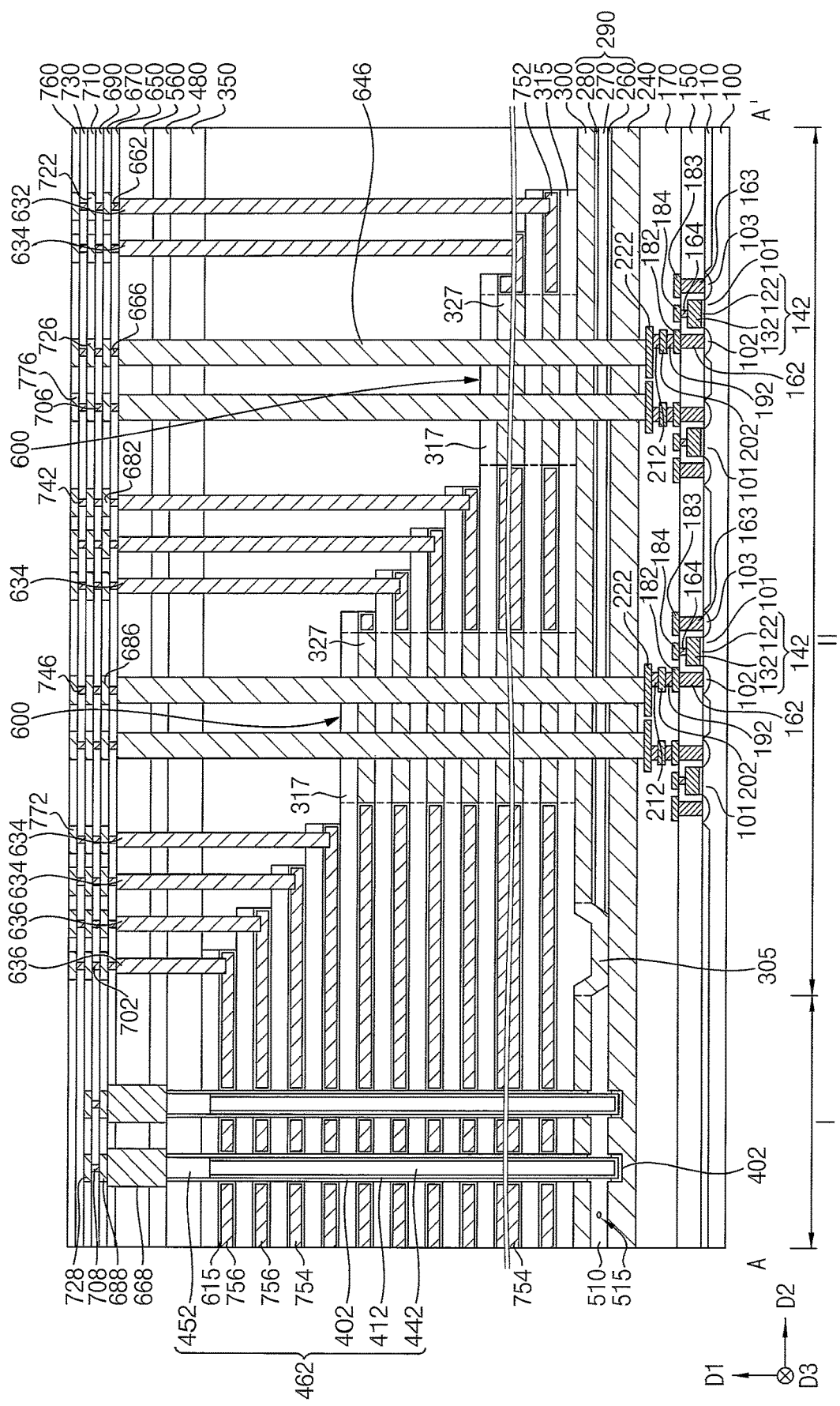
Figure 35:
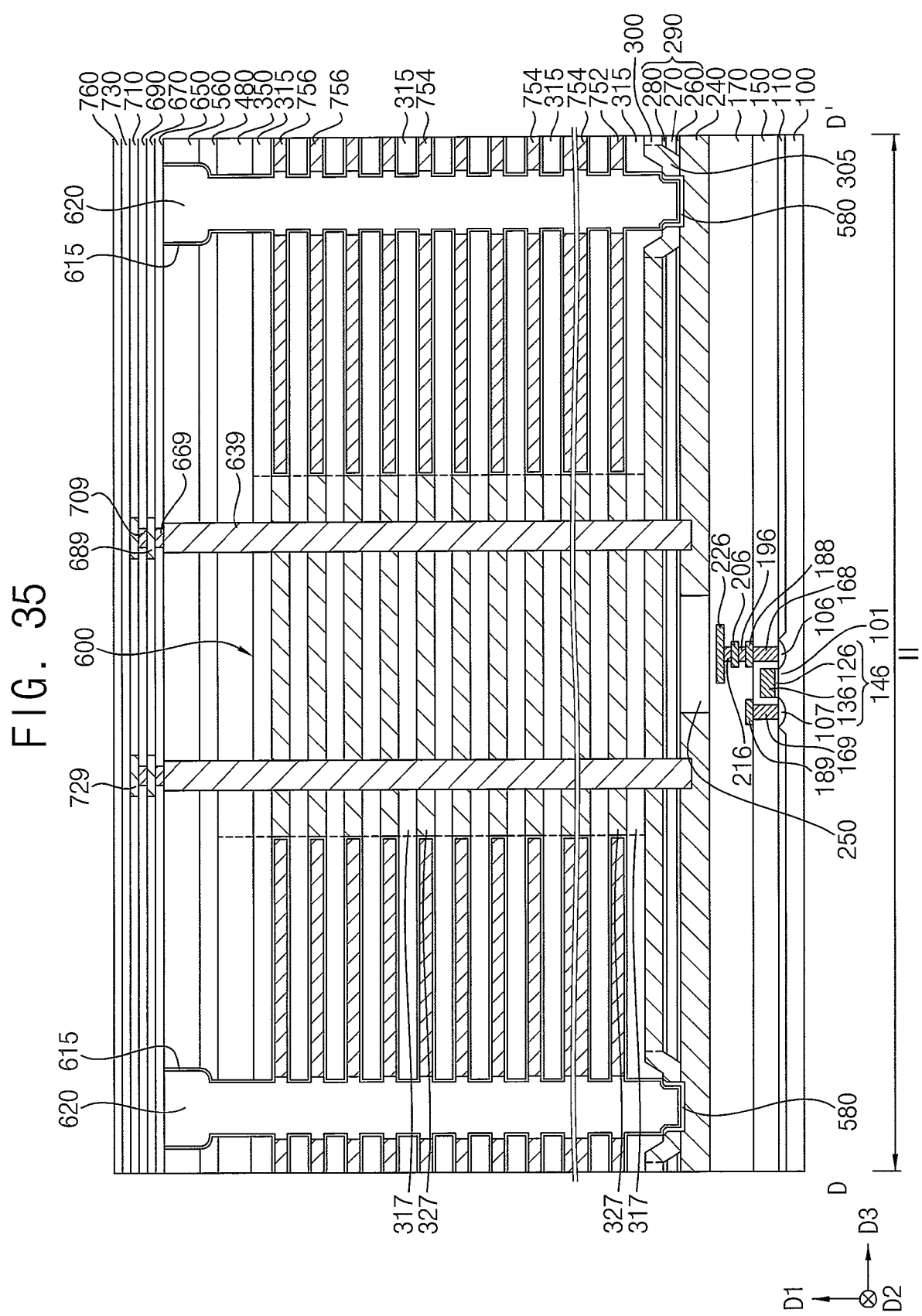

FIGS. 3, 5-6, 8, 29 and 32 are cross-sectional views taken along lines A-A' of the corresponding plan views, respectively, FIGS. 9-11, 14-17, 19-21, 23, 26 and 33 are cross-sectional views taken along lines B-B' of the corresponding plan views, respectively, FIGS. 22, 24, 27, 30 and 34 are cross-sectional views taken along lines C-C' of the corresponding plan views, respectively, and FIGS. 31 and 35 are cross-sectional views taken along lines D-D' of the corresponding plan views, respectively. FIGS. 2 to 35 are drawings of a region X of FIG. 1, and FIG. 11 is an enlarged cross-sectional view of a region Y of FIG. 10.

Hereinafter, a direction substantially perpendicular to an upper surface of a substrate 100 is defined as a first direction D1, and two directions substantially parallel to the upper surface of the substrate 100 and that cross each other are defined as second and third directions D2 and D3, respectively. In exemplary embodiments, the second and third directions D2 and D3 are substantially perpendicular to each other.

Figure 1:
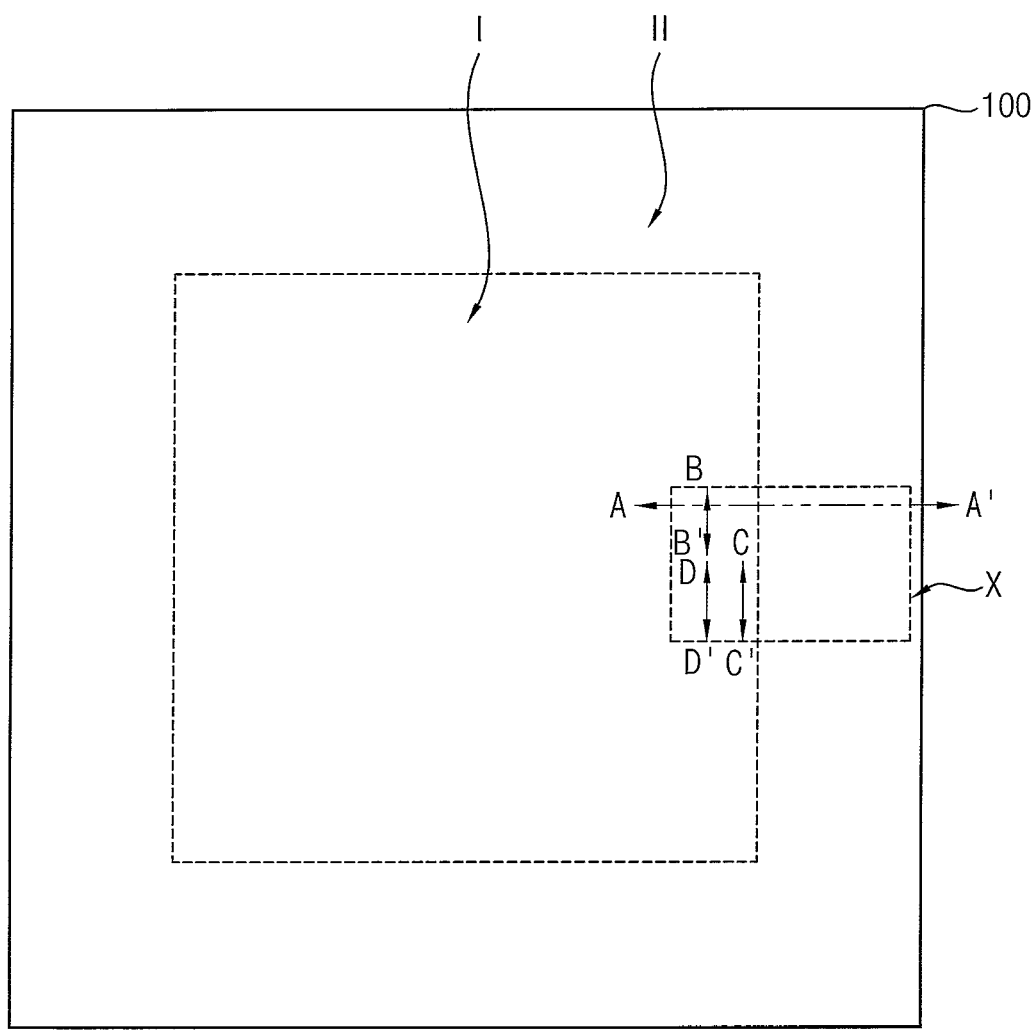
FIGS. 1 to 35 are plan views and cross-sectional views that illustrate a method of manufacturing a semiconductor device in accordance with exemplary embodiments.

Referring to FIG. 1, in an embodiment, the substrate 100 includes a first region I and a second region II that surrounds the first region I.

In exemplary embodiments, the first and second regions I and II of the substrate 100 are a cell array region and a pad region (or an extension region), respectively, both of which together form a cell region. For example, each memory cell of the first region I includes a gate electrode, a channel, and a charge storage structure, and each memory cell of the second region II includes upper contact plugs that transmit electrical signals to the memory cells and pads that contact the upper contact plugs. FIG. 1 shows that the second region II of the substrate 100 entirely surrounds the first region I of the substrate 100, however, embodiments of the inventive concepts are not necessarily limited thereto. For example, in an embodiment, the second region II of the substrate 100 is formed on opposite sides of the first region I of the substrate 100 in the second direction D2.

A third region further surrounds the second region II of the substrate 100, and includes an upper circuit pattern that transmits electrical signals to the memory cells through the upper contact plugs.

Hereinafter, a region X that includes portions of the first and second regions I and II of the substrate 100 will be described.

Figure 2:
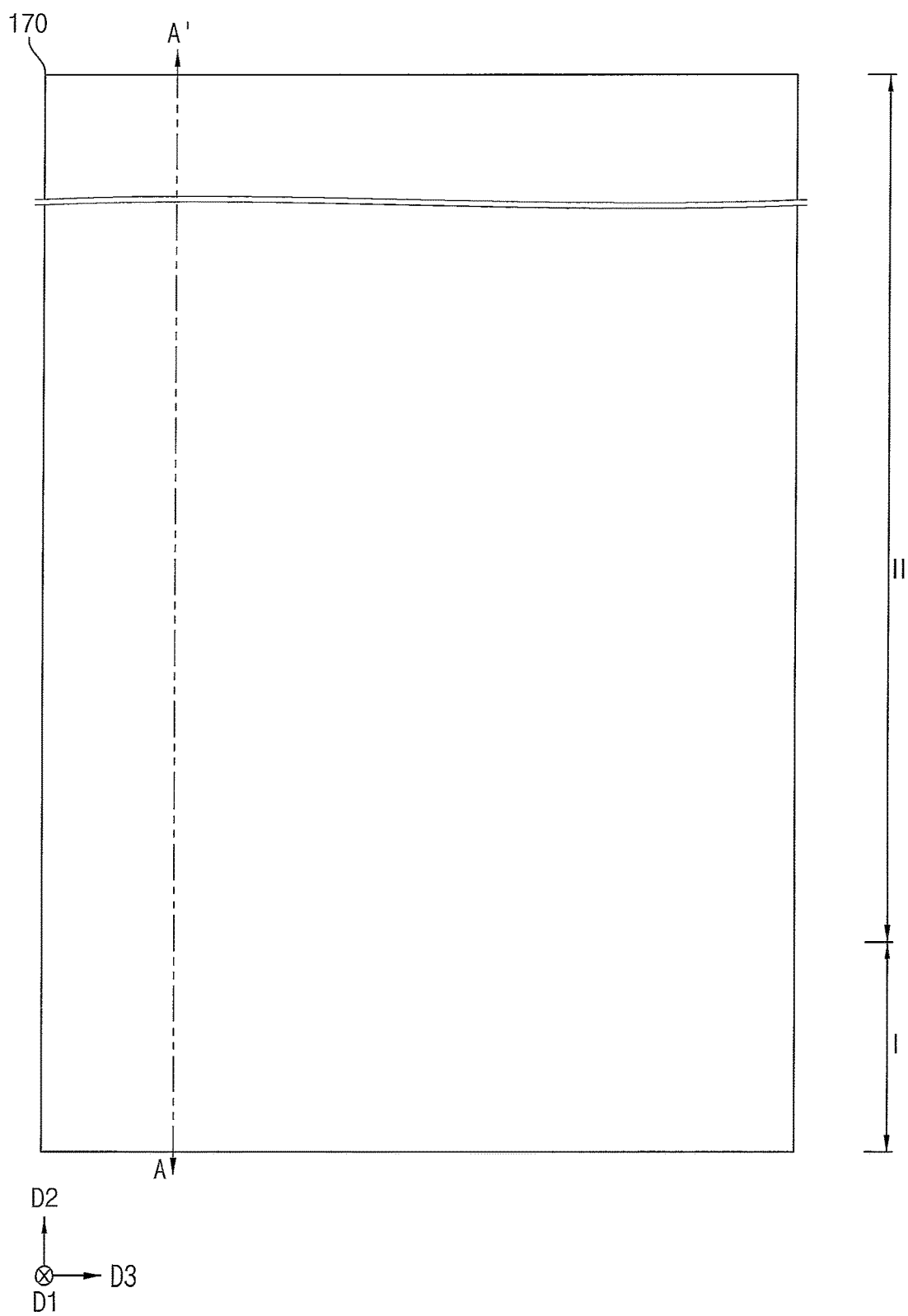
Figure 3:
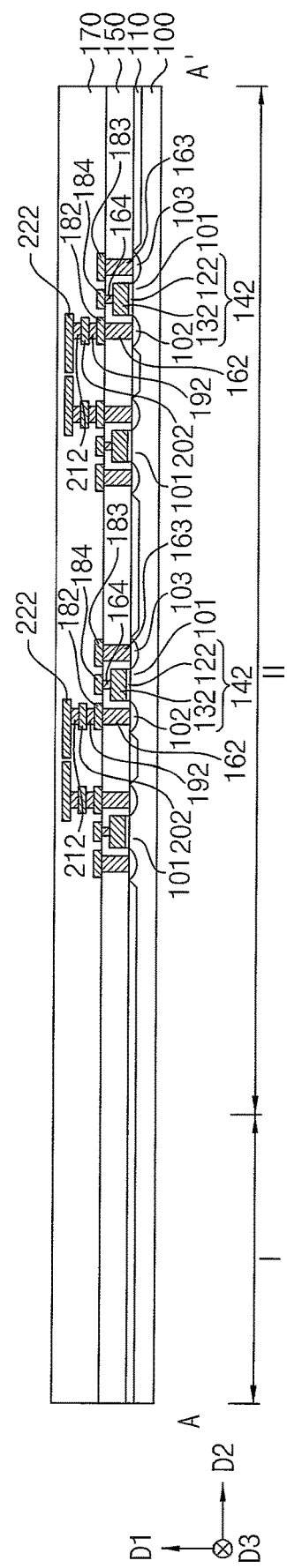

Referring to FIGS. 2 and 3, in an embodiment, a lower circuit pattern is formed on the substrate 100, and first and second insulating interlayers 150 and 170 are sequentially formed on the substrate 100 and cover the lower circuit pattern. The first and second insulating interlayers 150 and 170 include an oxide, such as silicon oxide.

The substrate 100 includes a field region on which an isolation pattern 110 is formed, and an active region on which no isolation pattern 110 is formed. The isolation pattern 110 includes an oxide, such as silicon oxide.

In exemplary embodiments, the semiconductor device has a cell over periphery (COP) structure. That is, the lower circuit pattern is formed on the substrate 100, and memory cells, upper contact plugs, and an upper circuit pattern are formed over the lower circuit pattern. The lower circuit pattern includes, for example, transistors, lower contact plugs, lower wirings, lower vias, etc.

Figure 9:
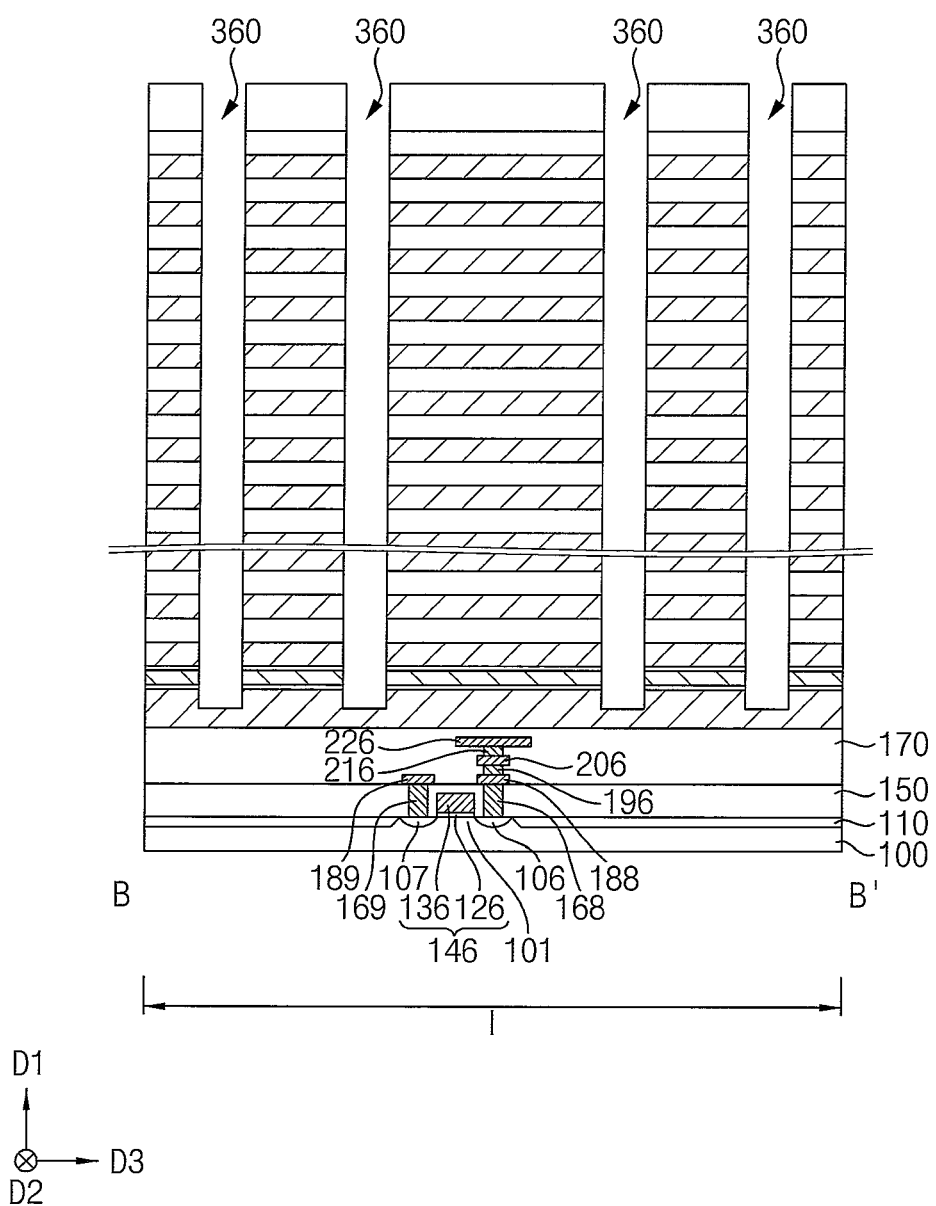

Referring to FIGS. 1, 2 and 3 together with FIG. 9, in an embodiment, first and second transistors are formed on the second and first regions II and I, respectively, of the substrate 100. The first transistor includes a first lower gate structure 142 on the substrate 100 and first and second impurity regions 102 and 103 at upper portions of the active region 101 adjacent to the first lower gate structure 142 and that serve as source/drain regions. The second transistor includes a second lower gate electrode 146 on the substrate 100 and third and fourth impurity regions 106 and 107 at upper portions of the active region 101 adjacent to the second lower gate electrode 146 and that serve as source/drain regions.

The first lower gate structure 142 includes a first lower gate insulation pattern 122 and a first lower gate electrode 132 sequentially stacked on the substrate 100, and the second lower gate electrode 146 includes a second lower gate insulation pattern 126 and a second lower gate electrode 136 sequentially stacked on the substrate 100.

The first insulating interlayer 150 is formed on the substrate 100 and covers the first and second transistors. First, second, fourth and fifth lower contact plugs 162, 163, 168 and 169 extend through the first insulating interlayer 150 and contact the first to fourth impurity regions 102, 103, 106 and 107, respectively, and a third lower contact plug 164 extends through the first insulating interlayer 150 and contacts the first lower gate electrode 132. A sixth lower contact plug also extends through the first insulating interlayer 150 and contacts the second lower gate electrode 136.

First to fifth lower wirings 182, 183, 184, 188 and 189 are formed on the first insulating interlayer 150 that contact upper surfaces of the first to fifth lower contact plugs 162, 163, 164, 168 and 169, respectively. A first lower via 192, a sixth lower wiring 202, a third lower via 212 and an eighth lower wiring 222 are sequentially stacked on the first lower wiring 182, and a second lower via 196, a seventh lower wiring 206, a fourth lower via 216 and a ninth lower wiring 226 are sequentially stacked on the fourth lower wiring 188.

The second insulating interlayer 170 is formed on the first insulating interlayer 150 and covers the first to ninth lower wirings 182, 183, 184, 188, 189, 202, 206, 222 and 226 and the first to fourth lower via 192, 196, 212 and 216.

The elements of the lower circuit pattern are formed by a patterning process or a damascene process.

Each of the first and second transistors is a part of the lower circuit pattern, which may be, for example, a page buffer, a decoder, or a common source line driver (CSL driver) circuit, etc. The first and second transistors shown in FIGS. 3 and 9 are non-limiting examples of a part of the circuit pattern, and a greater number of and more types of transistors may be formed on the first and second regions I and II.

Figure 4:
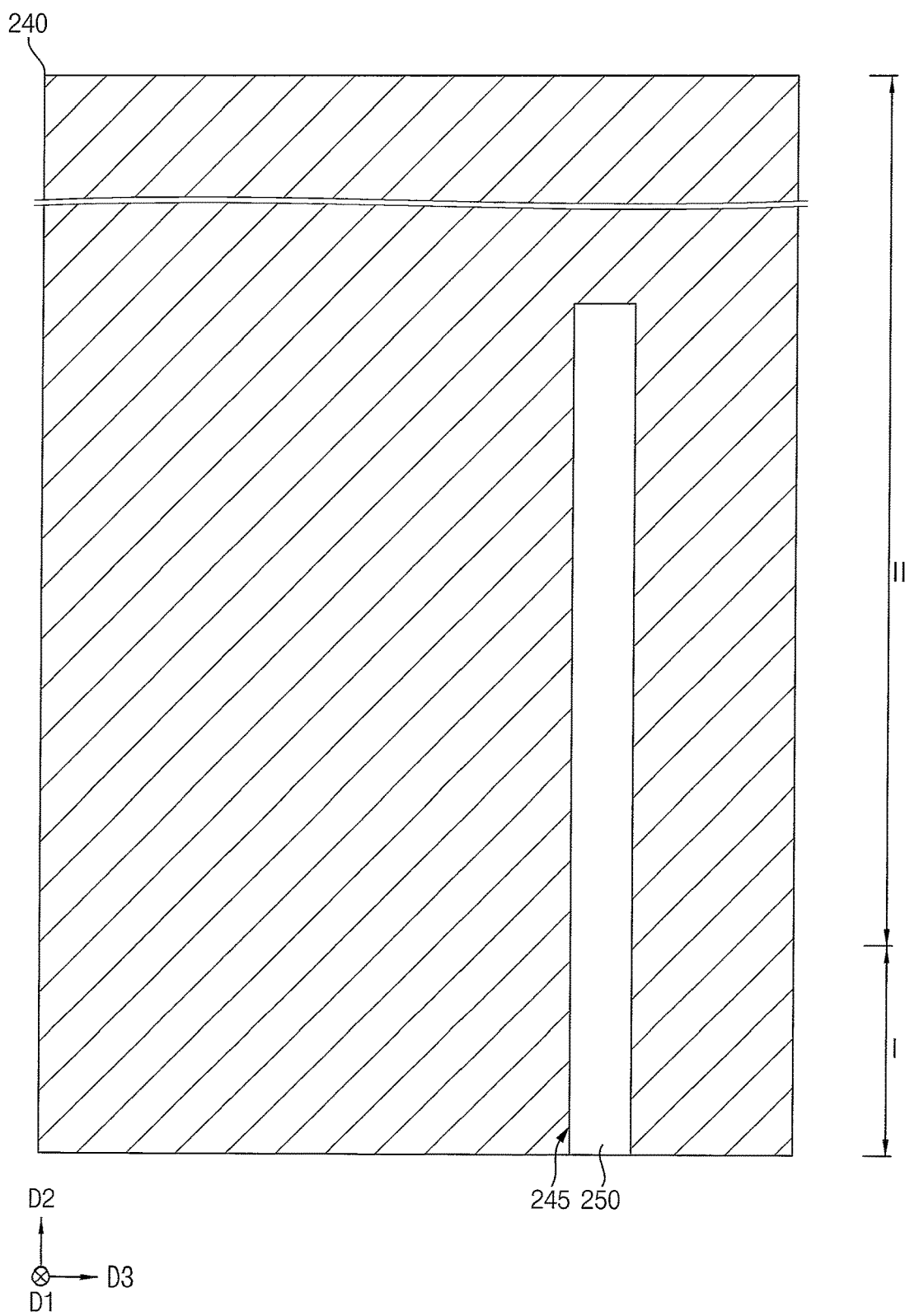

Referring to FIG. 4, in an embodiment, a common source plate (CSP) 240 that supplies a common source voltage is formed on the second insulating interlayer 170. A portion of the CSP 240 is removed to form a first opening 245 that exposes an upper portion of the second insulating interlayer 170, and a filling layer 250 is formed that fills the first opening 245.

The CSP 240 includes, for example, polysilicon doped with n-type impurities. Alternatively, the CSP 240 includes a metal silicide layer and a polysilicon layer doped with n-type impurities that are sequentially stacked. The metal silicide layer includes, for example, tungsten silicide.

In exemplary embodiments, the filling layer 250 extends in the second direction D2. One filling layer 250 or a plurality of filling layers 250 may be formed on the first and second regions I and II, and the plurality of filling layers are spaced apart from each other in the third direction D3. One of the plurality of filling layers 250 is shown in FIG. 4. In an exemplary embodiment, the filling layer 250 does not extend to opposite ends in the second direction D2 of the second region II of the substrate 100, and thus the CSP 240 is not completely separated in the third direction D3 by the filling layer 250. However, embodiments of the inventive concept are not necessarily limited thereto, and in some embodiments, the filling layer 250 extends to the opposite ends in the second direction D2 of the second region II on the first and second regions I and II of the substrate 100 and separates the CSP 240 in the third direction D3 into disjoint components.

The filling layer 250 includes, for example, an insulating material such as oxide or nitride.

Figure 5:
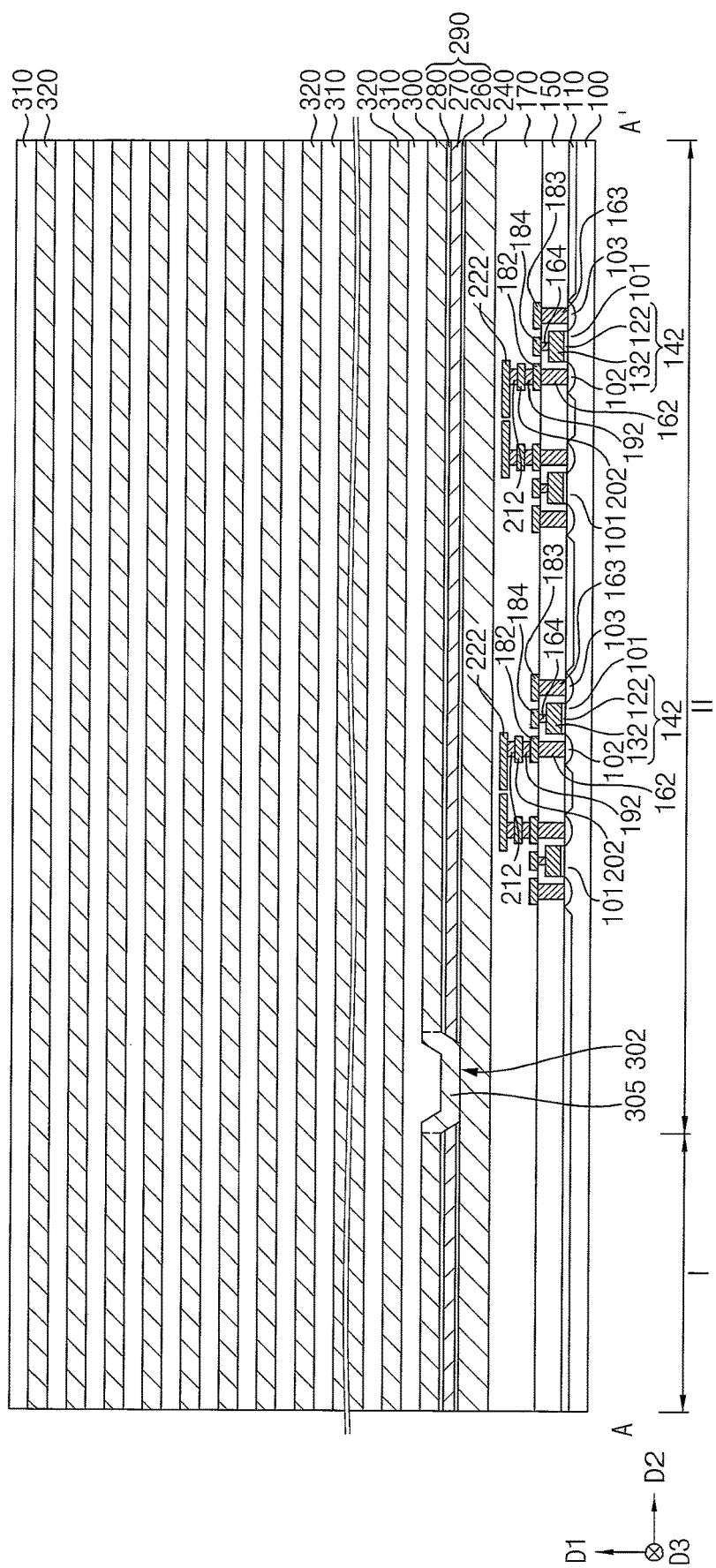

Referring to FIG. 5, in an embodiment, a first sacrificial layer structure 290 is formed on the CSP 240 and the filling layer 250, and the first sacrificial layer structure 290 is partially removed to form a second opening 302 that exposes upper surfaces of the CSP 240 and/or the filling layer 250. A first support layer 300 is formed on an upper surface of the first sacrificial layer structure 290 and the upper surfaces of CSP 240 and/or the filling layer 250 exposed by the second opening 302.

The first sacrificial layer structure 290 includes first to third sacrificial layers 260, 270, and 280 that are sequentially stacked. Each of the first and third sacrificial layers 260 and 280 includes, for example, an oxide such as silicon oxide, and the second sacrificial layer 270 includes, for example, a nitride such as silicon nitride.

The second opening 302 may have various layouts in a plan view on the first and second regions I and II of the substrate 100, and FIG. 5 shows that the second opening 302 extends in the third direction D3 on a portion of the second region II adjacent to the first region I.

The first support layer 300 includes a material has an etch selectivity with respect to the first to third sacrificial layers 260, 270, and 280, such as polysilicon doped with n-type impurities. The first support layer 300 has a constant thickness, and accordingly, a first recess is formed on a portion of the first support layer 300 in the second opening 302. Hereinafter, a portion of the first support layer 300 in the second opening 302 may be referred to as a support pattern 305.

Insulating layers 310 and fourth sacrificial layers 320 are alternately and repeatedly stacked in the first direction D1 on the first support layer 300 and the support pattern 305, and accordingly, a mold layer that includes the insulating layers 310 and the fourth sacrificial layers 320 is formed. The insulating layers 310 include, for example, an oxide such as silicon oxide, and the fourth sacrificial layers 320 include a material that has an etch selectivity with respect to the insulating layer 310, such as a nitride such as silicon nitride.

Figure 7:
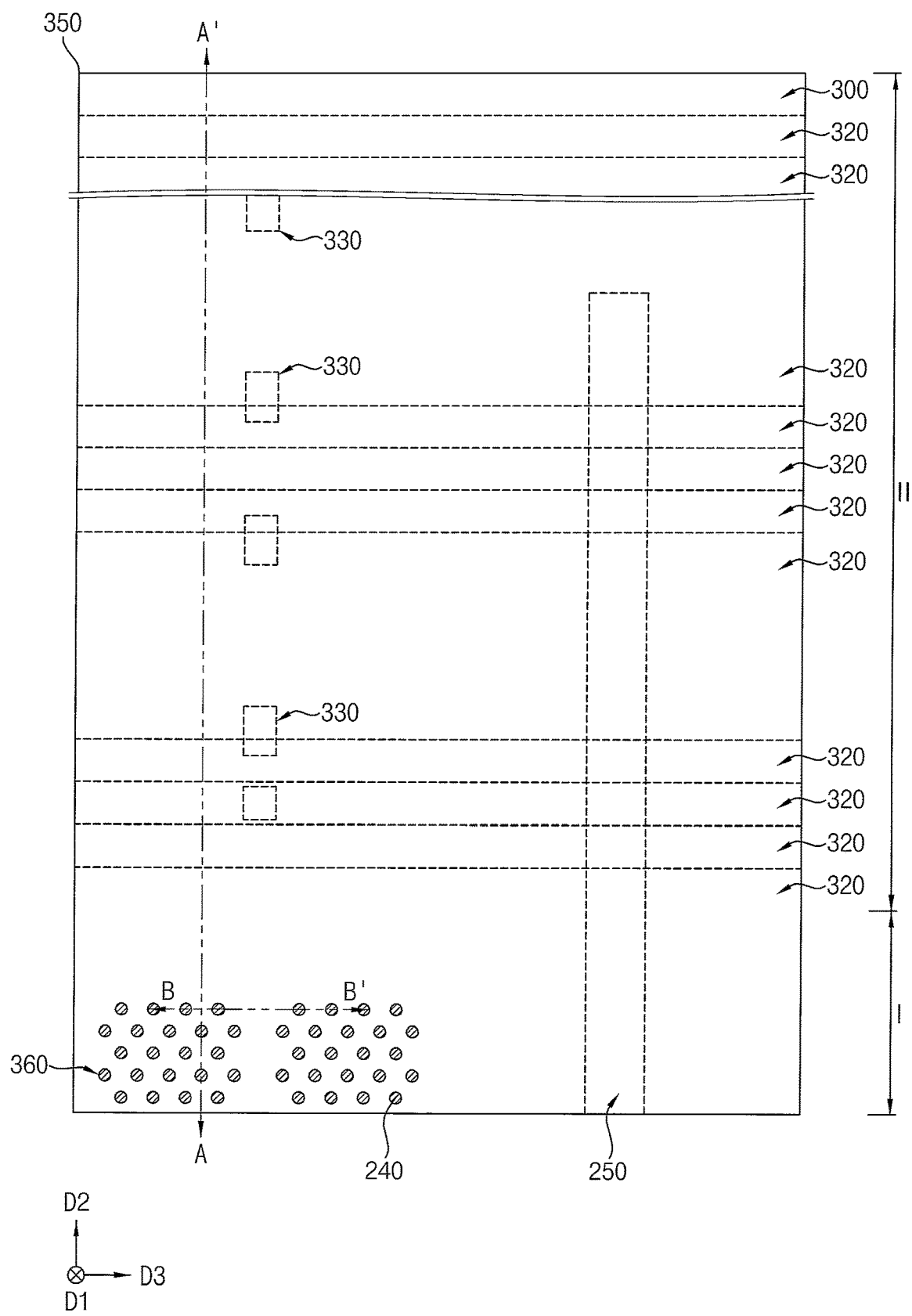

Referring to FIG. 5 together with FIG. 7, in an embodiment, a first division pattern 330 is further formed through a portion of a lowermost fourth sacrificial layer 320. The first division pattern 330 is formed on the second region II of the substrate 100, and includes, for example, an oxide such as silicon oxide. In exemplary embodiments, a plurality of first division patterns 330 are spaced apart from each other in each of the second and third directions D2 and D3.

Figure 6:
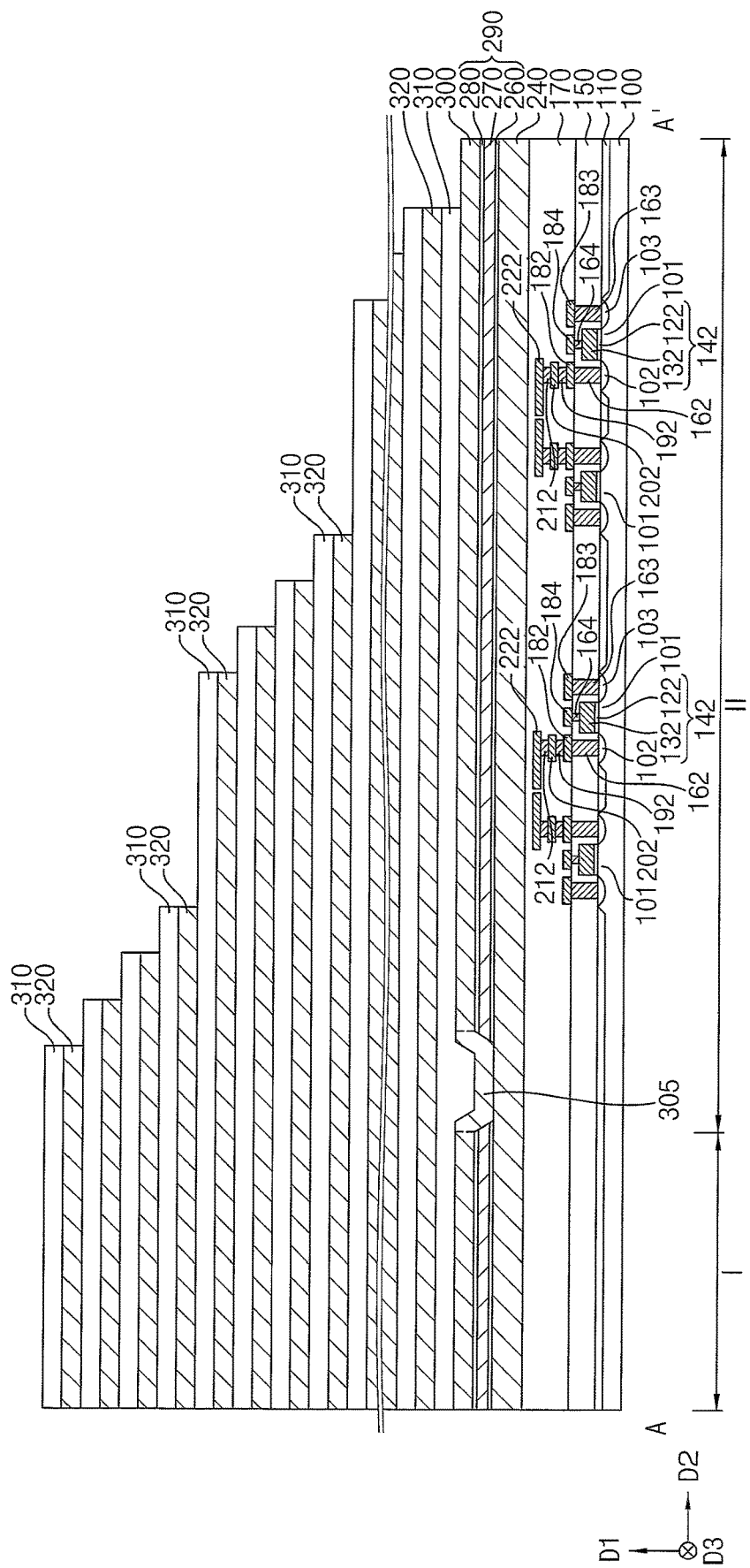

Referring to FIG. 6, in an embodiment, a photoresist pattern is formed on an uppermost insulating layer 310 that partially covers the uppermost insulating layer 310, and the uppermost insulating layer 310 and an uppermost fourth sacrificial layer 320 are etched using the photoresist pattern as an etching mask. Thus, a portion of an insulating layer 310 directly under the uppermost fourth sacrificial layer 320 is exposed.

After performing a trimming process that reduces an area of the photoresist pattern, the uppermost insulating layer 310, the uppermost fourth sacrificial layer 320, the exposed insulating layer 310, and one of the fourth sacrificial layers 320 directly under the exposed insulating layer 310 are etched using the reduced photoresist pattern as an etching mask. The trimming process and the etching process are repeatedly performed to form a mold. The mold has a staircase shape that includes a plurality of step layers that are sequentially stacked, and each step includes one of the fourth sacrificial layers 320 and one of the insulating layers 310.

Hereinafter, each of the "step layers" not only includes an exposed portion but also a portion thereof covered by upper step layers, and thus an entire portion of the fourth sacrificial layer 320 at the same level and an entire portion of the insulating layer 310 at the same level is referred to as the step layer. The exposed portion of the step layer not covered by upper step layers is referred to as a "step." In exemplary embodiments, the steps are arranged in the second direction D2. Alternatively, the steps are arranged in the third direction D3.

In exemplary embodiments, lengths in the second direction D2 of some of the steps in the mold are constant. The length of some of the steps in the second direction D2 is greater than the length of other steps in the second direction D2. Hereinafter, relatively shorter steps may be referred to as first steps, and relatively longer steps may be referred to as second steps. FIG. 6. shows two of the second steps. In each of the plan views after FIG. 7, the steps are indicated by dotted lines.

The mold is formed on the first support layer 300 and the support pattern 305 on the first and second regions I and II of the substrate 100, and a portion of an upper surface of an edge of the first support layer 300 is not covered but rather is exposed by the mold. Each of the steps in the mold is formed on the second region II of the substrate 100.

Figure 8:
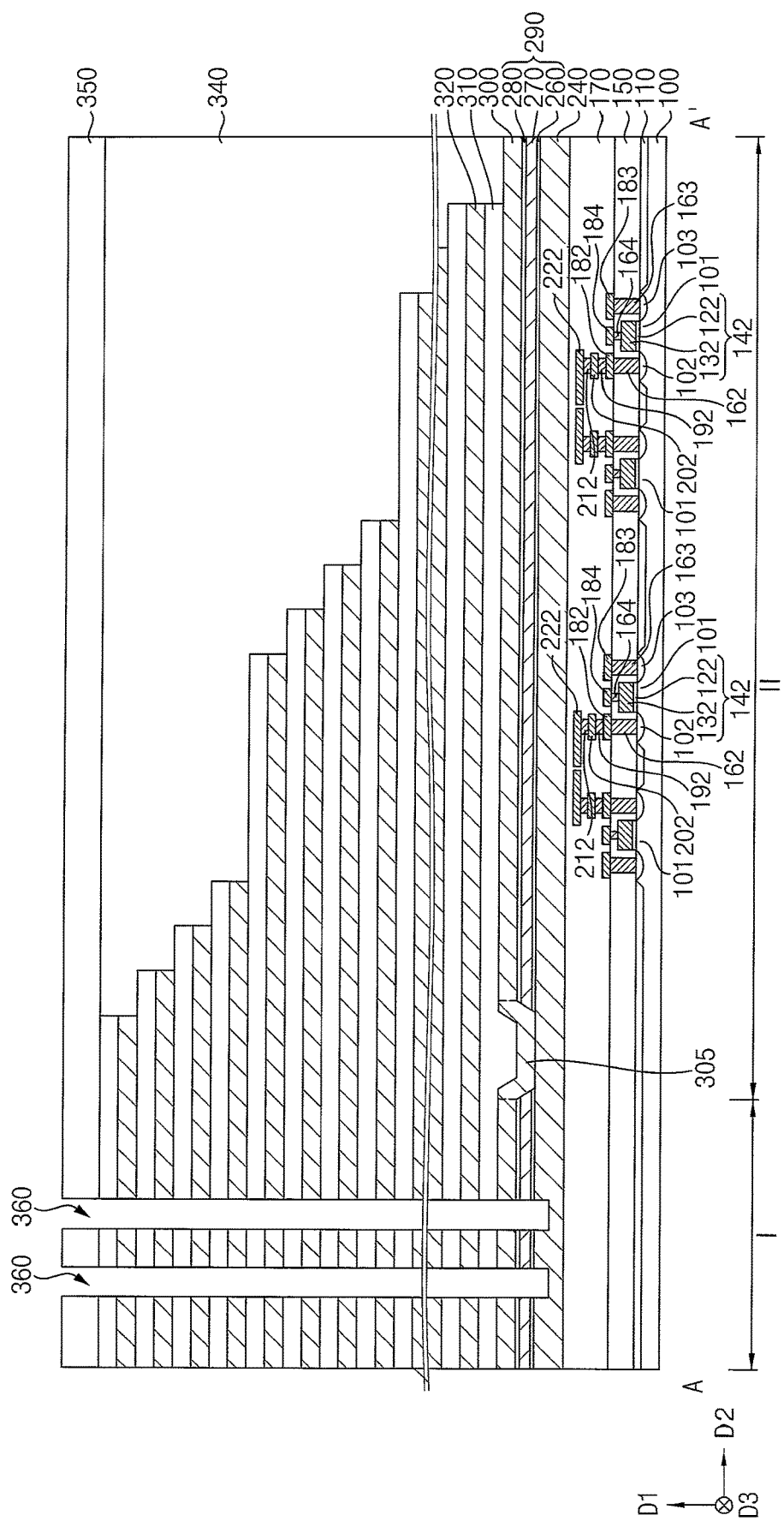

Referring to FIGS. 7 to 9, in an embodiment, a third insulating interlayer 340 is formed on the CSP 240 that covers the mold and the exposed upper surface of the first support layer 300, and the third insulating interlayer 340 includes, for example, an oxide such as silicon. The third insulating interlayer 340 is planarized until an upper surface of the uppermost insulating layer 310 is exposed. Accordingly, a sidewall of the mold is covered by the third insulating interlayer 340. A fourth insulating interlayer 350 that includes, for example, an oxide such as silicon oxide, is formed on upper surfaces of the mold and the third insulating interlayer 340.

An etching process is performed that forms a channel hole 360 in the first region I of the substrate 100. The channel hole 360 extends in the first direction D1 through the fourth insulating interlayer 350, the mold, the first support layer 300 and the first sacrificial layer structure 290, and into and below an upper surface of the CSP 240 and exposes a portion of the CSP 240. In exemplary embodiments, a plurality of channel holes 360 are formed in the first region I of the substrate 100 that are spaced apart in the second and third directions D2 and D3.

Figure 10:
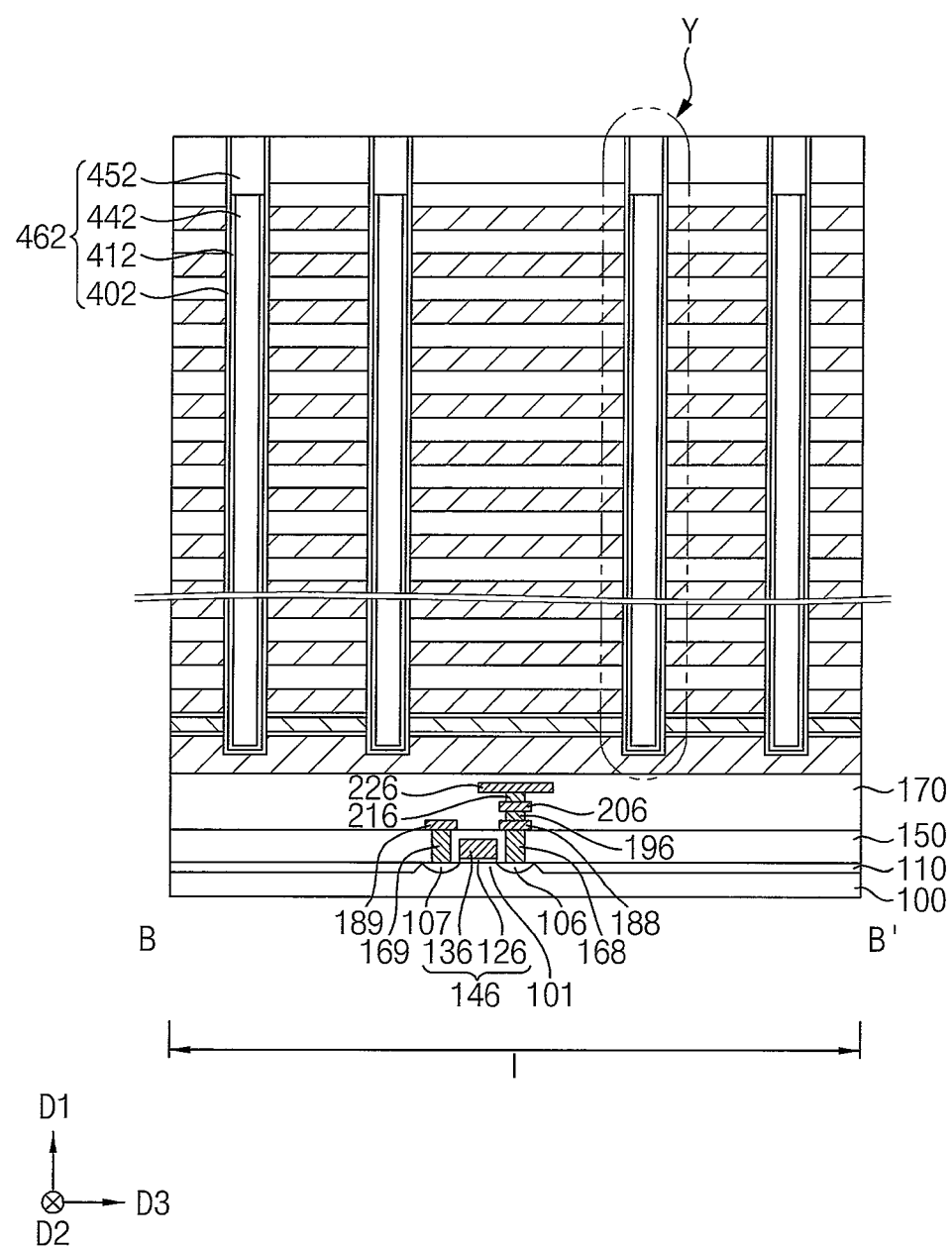
Figure 11:
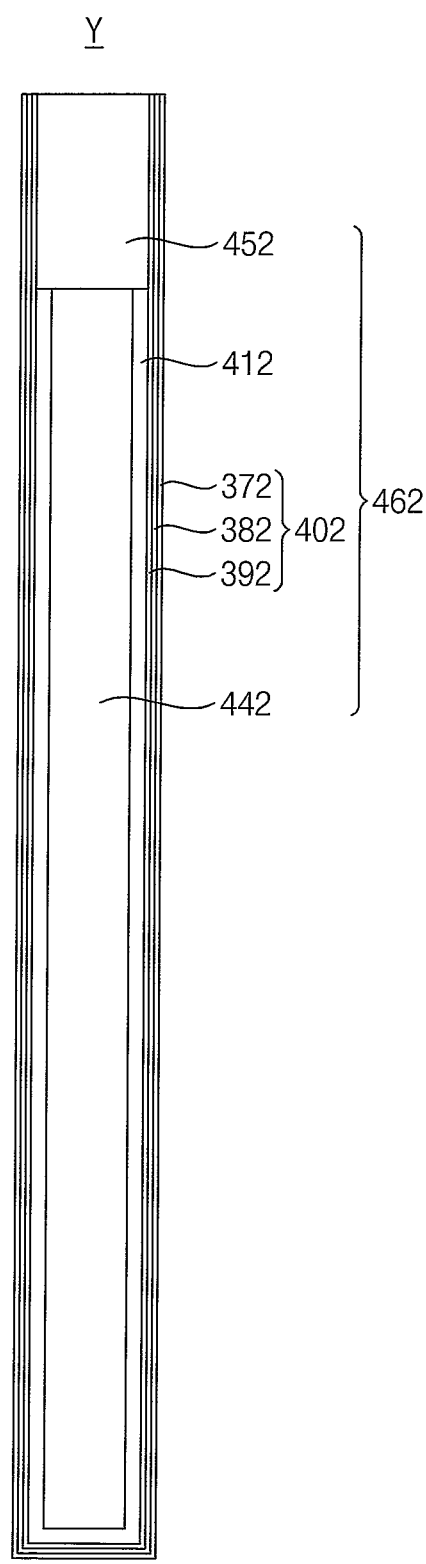

Referring to FIGS. 10 and 11, in an embodiment, a charge storage structure layer and a channel layer are sequentially formed on a sidewall of the channel hole 360, the exposed portion of the CSP 240 and an upper surface of the fourth insulating interlayer 350, and a filling layer is formed on the channel layer that fills a remaining portion of the channel hole 360.

The charge storage structure includes a first blocking layer, a charge storage layer and a tunnel insulation layer that are sequentially stacked. The first blocking layer and the tunnel insulation layer include an oxide, such as silicon oxide, and the charge storage layer includes a nitride, such as silicon nitride. The channel layer includes undoped or lightly doped polysilicon with impurities. The filling layer includes an oxide, such as silicon oxide.

The filling layer, the channel layer, and the charge storage structure layer are planarized until the upper surface of the fourth insulating interlayer 350 is exposed, so that a charge storage structure 402, a channel 412, and a filling pattern 442 are formed in the channel hole 360. The charge storage structure 402 includes a first blocking pattern 372, a charge storage pattern 382, and a tunnel insulation pattern 392 that are sequentially stacked.

Upper portions of the filling pattern 442 and the channel 412 are removed to form a second recess, and a capping pattern 452 is formed that fills the second recess. The capping pattern 452 includes, for example, doped or undoped polysilicon with impurities.

The charge storage structure 402, the channel 412, the filling pattern 442, and the capping pattern 452 in the channel hole 360 form a memory channel structure 462. In exemplary embodiments, the memory channel structure 462 has a pillar shape that extends in the first direction D1. A plurality of memory channel structures 462 are formed in the first region I of the substrate 100 that are spaced apart from each other in the second and third directions D2 and D3.

Figure 12:
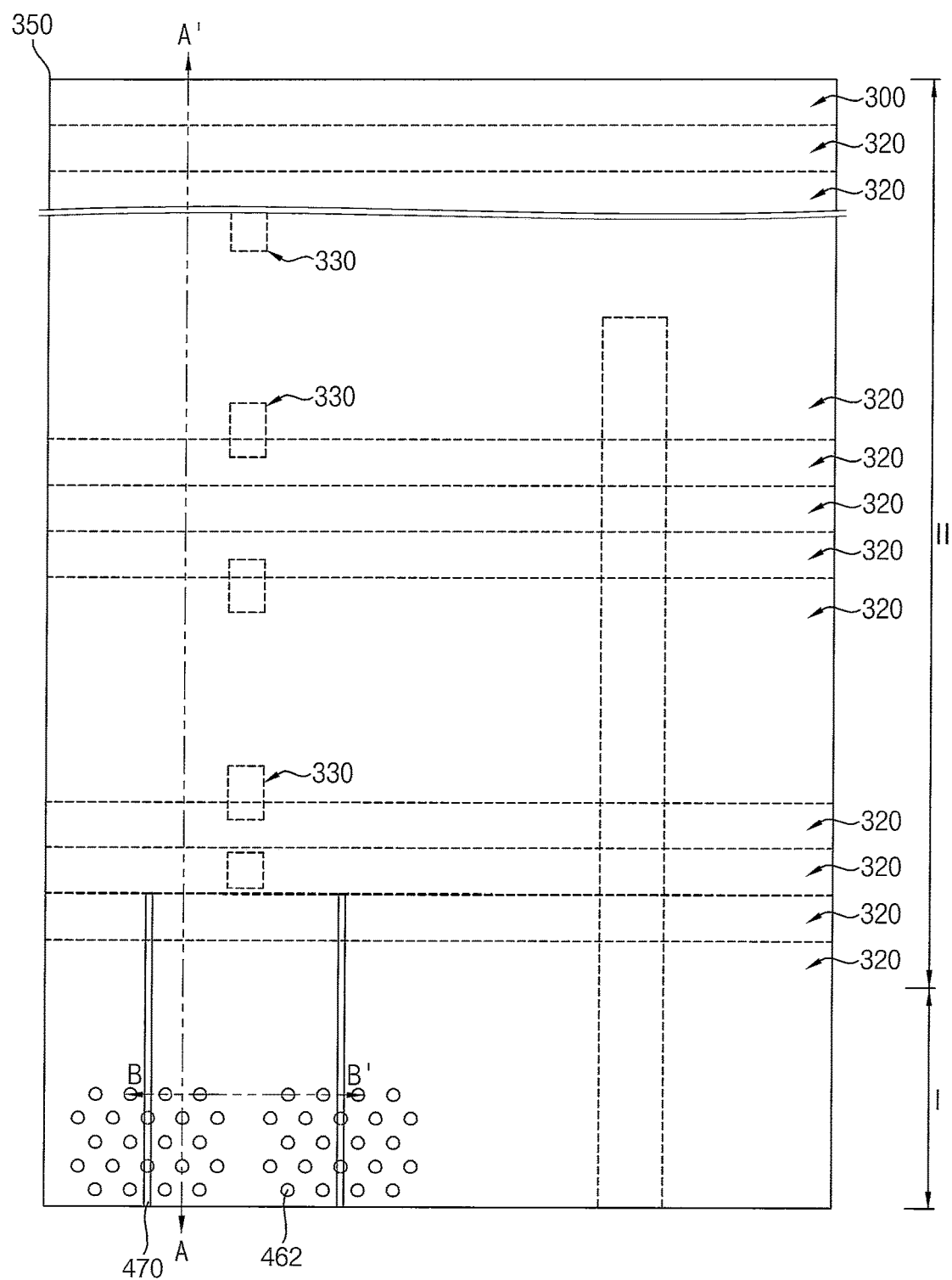

Referring to FIG. 12, in an embodiment, portions of the fourth insulating interlayer 350 and some of the insulating layers 310 and the fourth sacrificial layers 320 are etched to form a third opening that extends in the second direction D2 through the portions of the fourth insulating interlayer 350 and some of the insulating layers 310 and the fourth sacrificial layers 320, and a second division pattern 470 is formed that fills the third opening.

In an exemplary embodiment, the second division pattern 470 extends through an upper portion of the memory channel structure 462. The second division pattern 470 extends not only through the upper portion of the memory channel structure 462, but also through the fourth insulating interlayer 350, upper two levels of the fourth sacrificial layers 320, respectively, and upper two levels of the insulating layers 310, respectively, and extends partially through one of the insulating layers 310 at a third level from above. The second division pattern 470 extends in the second direction D2 in the first and second regions I and II of the substrate 100, and extends through, for example, upper two steps in the mold. Accordingly, the fourth sacrificial layers 320 at the upper two levels are divided in the third direction D3 by the second division pattern 470.

Figure 13:
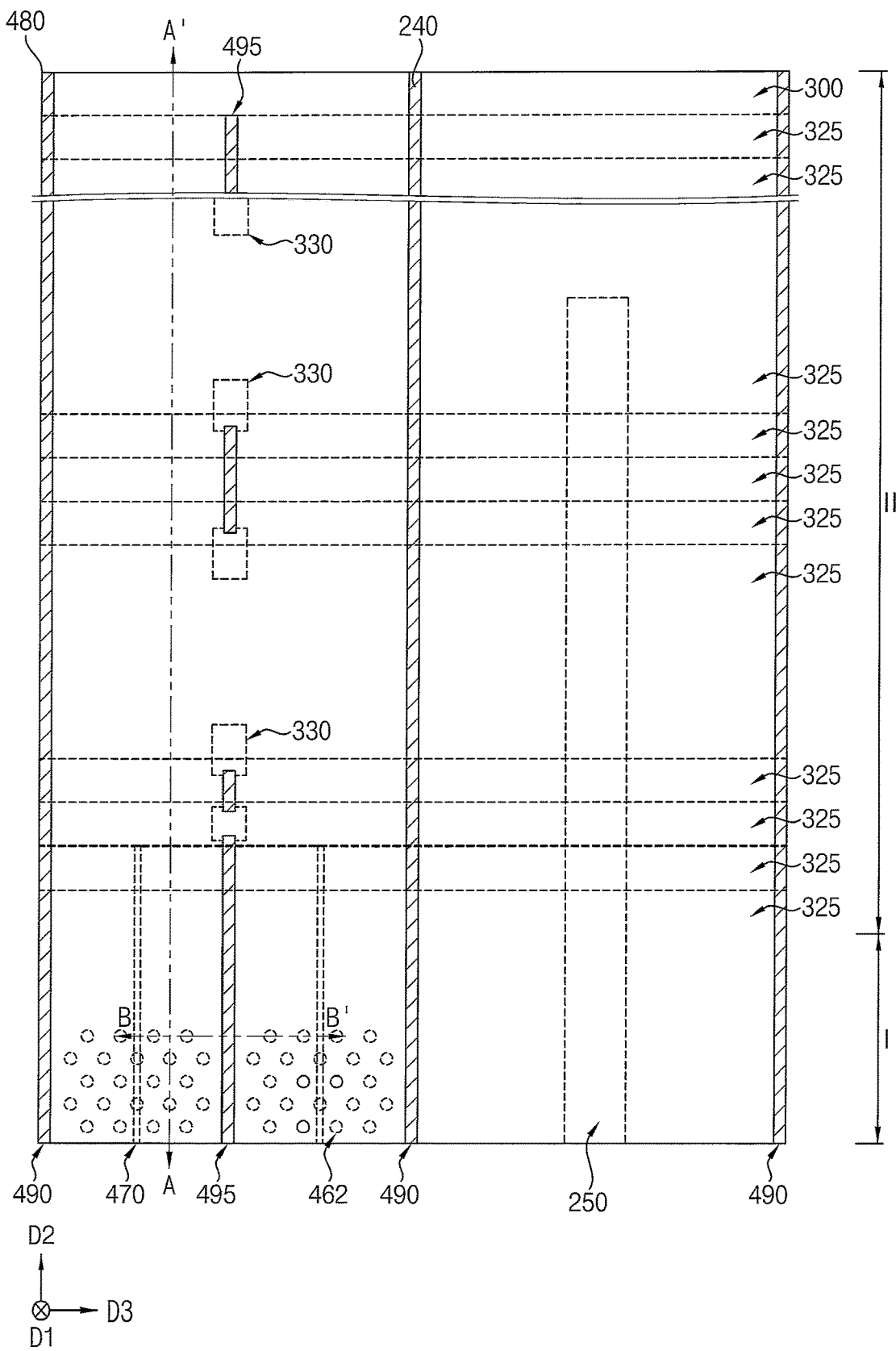
Figure 14:
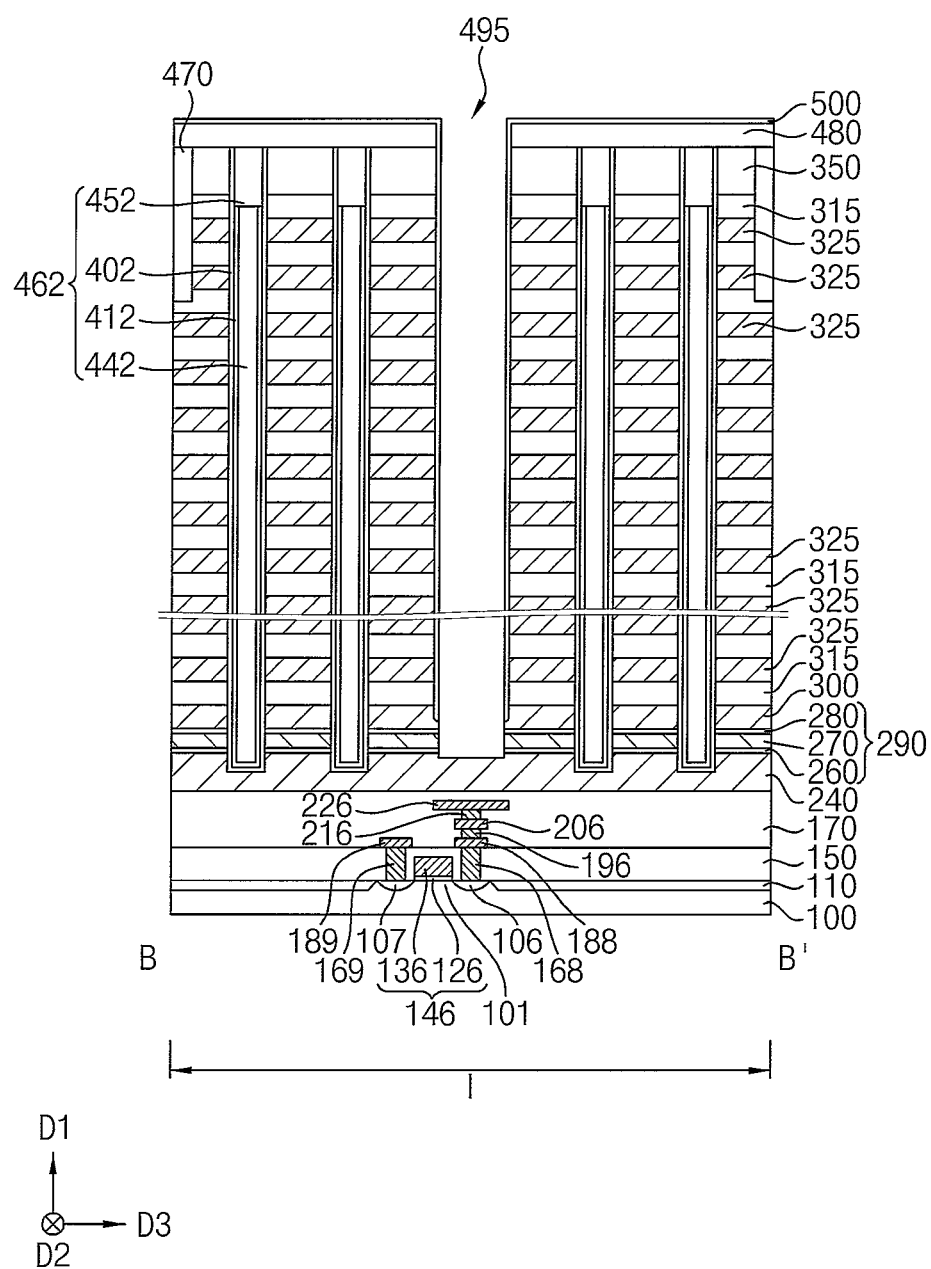

Referring to FIGS. 13 and 14, in an embodiment, a fifth insulating interlayer 480 that includes, for example, an oxide such as silicon oxide, is formed on the fourth insulating interlayer 350, the memory channel structure 462, and the second division pattern 470, and fourth and fifth openings 490 and 495 that extend through the third to fifth insulating interlayers 340, 350 and 480 and the mold are formed by an etching process.

In exemplary embodiments, the fourth opening 490 extends in the second direction D2 in the first and second regions I and II of the substrate 100 to opposite ends in the second direction D2 of the staircase-shaped mold, and a plurality of fourth openings 490 are spaced apart from each other in the third direction D3. Accordingly, the mold is divided into a plurality of parts spaced apart from each other in the third direction D3 by the fourth openings 490. As the fourth openings 490 are formed, the insulating layers 310 and the fourth sacrificial layers 320 in the mold are divided into first insulating patterns 315 and fourth sacrificial patterns 325, respectively, that each extend in the second direction D2.

In exemplary embodiments, the fifth opening 495 continuously extends in the second direction D2 in the first region I of the substrate 100. However, the fifth openings 495 are spaced apart from each other in the second direction D2 in the second region II of the substrate 100. The spaced apart fifth openings 495 are disposed between the fourth openings 490 that are adjacent to each other in the third direction D3. However, unlike the fourth openings 490, which extend to opposite ends of each of the molds in the second direction D2, the fifth openings 495 are spaced apart from each other in the second direction D2, and thus the mold is not completely separated by the fifth openings 495. In exemplary embodiments, each part of the mold between the spaced apart fifth openings 495 at least partially overlaps the first division pattern 330 in the first direction D1.

In exemplary embodiments, the fifth opening 495 is not formed over the filling layer 250 between fourth openings 490 adjacent to each other in the third direction D3.

Each of the fifth openings 495 continuously extends in the second direction D2 in the first region I of the substrate 100, and continuously extends, for example, to opposite ends of the step layers at the upper two levels of the mold in the second region II of the substrate 100. Accordingly, for example, some of the fourth sacrificial patterns 325 at the upper two levels of the mold are spaced apart from each other in the third direction D3 by the fifth opening 495 and the second division patterns 470. The second division patterns 470 are at opposite sides in the second direction D2 of the fifth opening 495.

In exemplary embodiments, the etching process is performed until the fourth and fifth openings 490 and 495 expose an upper surface of the first support layer 300 and further extend through an upper portion of the first support layer 300.

A first spacer layer is formed on sidewalls of the fourth and fifth openings 490 and 495 and on the fifth insulating interlayer 480, and portions of the first spacer layer on bottoms of the fourth and fifth openings 490 and 495 are removed by an anisotropic etching process to form a first spacer 500. Accordingly, the upper surface of the first support layer 300 is partially exposed.

Each of the fourth and fifth openings 490 and 495 is downwardly enlarged by removing the exposed portion of the first support layer 300 and a portion of the first sacrificial layer structure 290 thereunder. Accordingly, each of the fourth and fifth openings 490 and 495 exposes the upper surface of the CSP 240, and further extend into an upper portion of the CSP 240.

In exemplary embodiments, the first spacer 500 includes, for example, undoped polysilicon. The first spacer 500 covers the sidewalls of the fourth and fifth openings 490 and 495 when the first sacrificial layer structure 290 is partially removed, and thus the first insulating patterns 315 and the fourth sacrificial patterns 325 of the mold are not removed.

Figure 15:
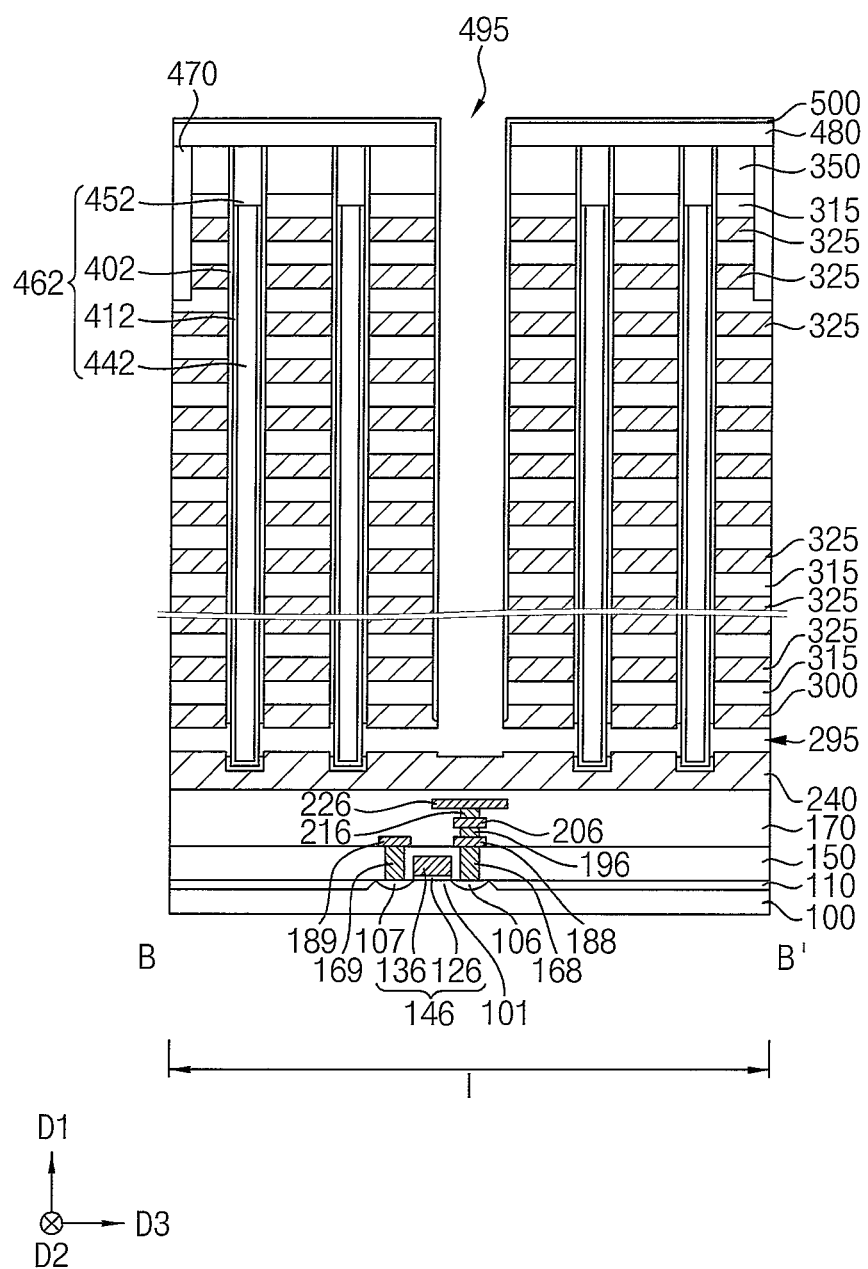

Referring to FIG. 15, in an embodiment, the first sacrificial layer structure 290 is removed through the fourth and fifth openings 490 and 495 by, for example, a wet etching process to form a first gap 295.

The wet etching process is performed using, for example, hydrofluoric acid (HF) and/or phosphoric acid ($H_3PO_4$). In exemplary embodiments, each of the fourth and fifth openings 490 and 495 in the second region II of the substrate 100 extends through the support pattern 305 instead of extending through the first support layer 300 and the first sacrificial layer structure 290 thereunder. Accordingly, a portion of the first sacrificial layer structure 290 in the second region II of the substrate 100 is not removed by the wet etching process.

As the first gap 295 is formed, a lower surface of the first support layer 300 and the upper surface of the CSP 240 are exposed. In addition, a portion of a sidewall of the charge storage structure 402 is exposed by the first gap 295, and the exposed sidewall of the charge storage structure 402 is also removed during the wet etching process to expose an outer sidewall of the channel 412. Accordingly, the charge storage structure 402 is divided into two parts. That is, an upper portion of the charge storage structure 402 extends through the mold to cover most of the upper sidewall of the channel 412, and a lower portion of the charge storage structure 402 is formed on the CSP 240 and covers a bottom surface of the channel 412.

Figure 16:
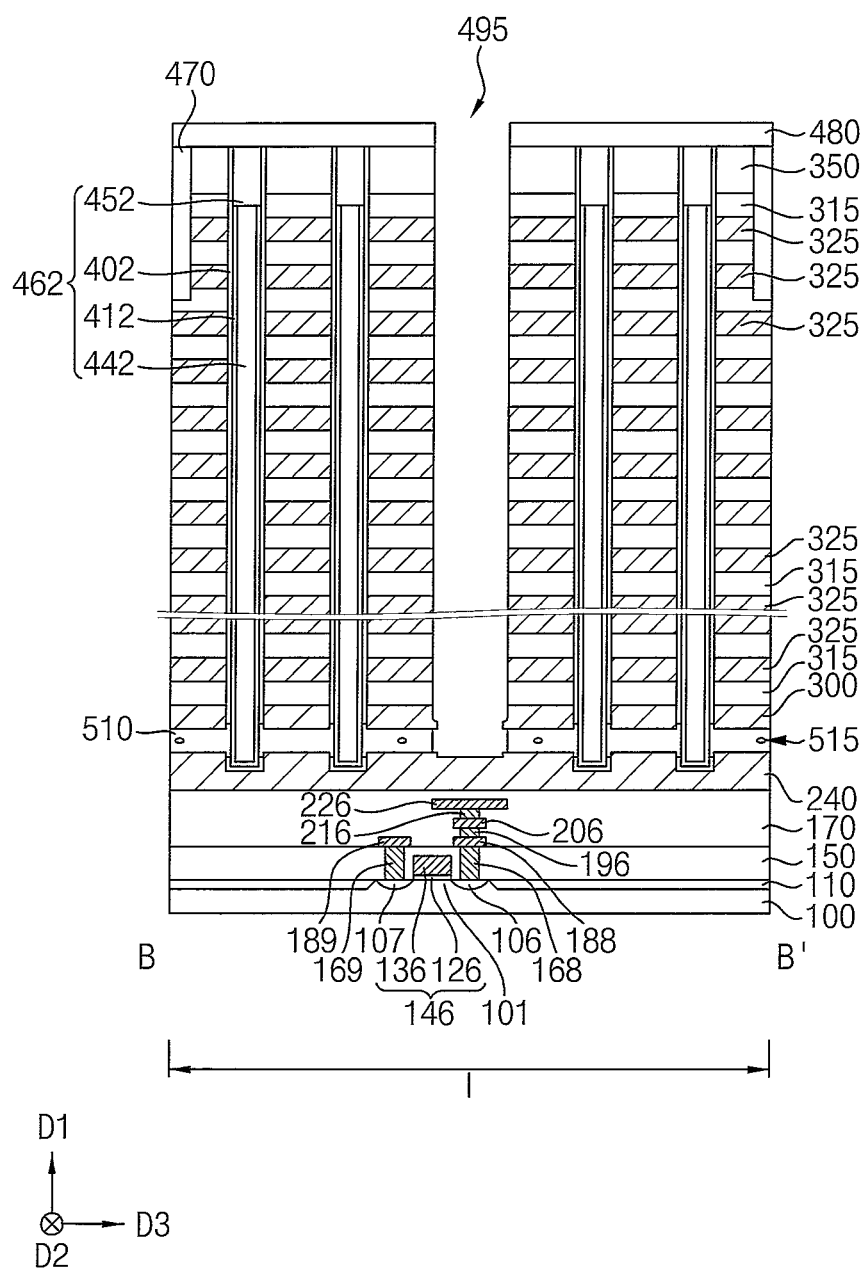

Referring to FIG. 16, in an embodiment, the first spacer 500 is removed, and a channel connecting layer or a source layer is formed on the sidewalls of the fourth and fifth openings 490 and 495 and in the first gap 295. Portions of the channel connecting layer in the fourth and fifth openings 490 and 495 are removed by an etch back process to form a channel connecting pattern (or a source pattern) 510.

As the channel connecting pattern 510 is formed, some of the plurality of channels 412 between the fourth and fifth openings 490 and 495 adjacent to each other in the third direction D3 are connected to each other. The channel connection pattern 510 includes, for example, polysilicon doped with n-type impurities or undoped polysilicon.

In an exemplary embodiment, air gaps 515 are formed in the channel connecting pattern 510.

Figure 17:
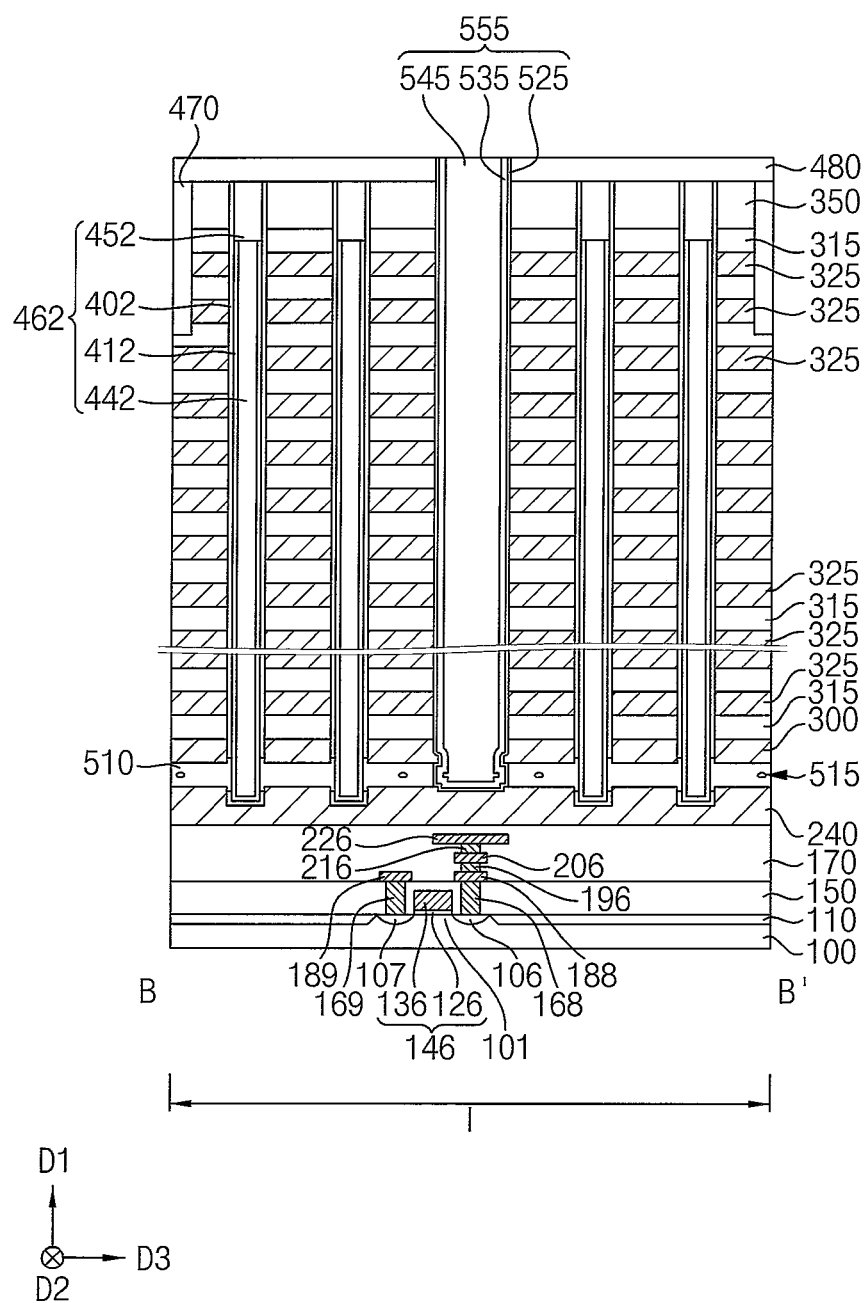

Referring to FIG. 17, in an embodiment, second and third sacrificial layer structures 550 and 555 are formed that fill the fourth and fifth openings 490 and 495 (refer to FIG. 18), respectively.

The second and third sacrificial layer structures 550 and 555 are formed by sequentially forming an etch stop layer and a second spacer layer on the sidewalls of the fourth and fifth openings 490 and 495 and the upper surface of the CSP 240 exposed by the fourth and fifth openings 490 and 495, forming a fifth sacrificial layer that fills the fourth and fifth openings 490 and 495 on the second spacer layer, and planarizing the fifth sacrificial layer, the second spacer layer, and the etch stop layer until an upper surface of the fifth insulating interlayer 480 is exposed.

The second sacrificial layer structure 550 includes a first etch stop pattern, a second spacer, and a fifth sacrificial pattern that are sequentially stacked, and the third sacrificial layer structure 555 include a second etch stop pattern 525, a third spacer 535, and a sixth sacrificial pattern 545 that are sequentially stacked.

The etch stop layer includes a material that has an etch selectivity with respect to the fourth sacrificial patterns 325, such as an oxide such as silicon oxide. The second spacer layer includes, for example, a nitride such as silicon nitride, and the fifth sacrificial layer includes, for example, polysilicon or silicon oxide.

Figure 18:
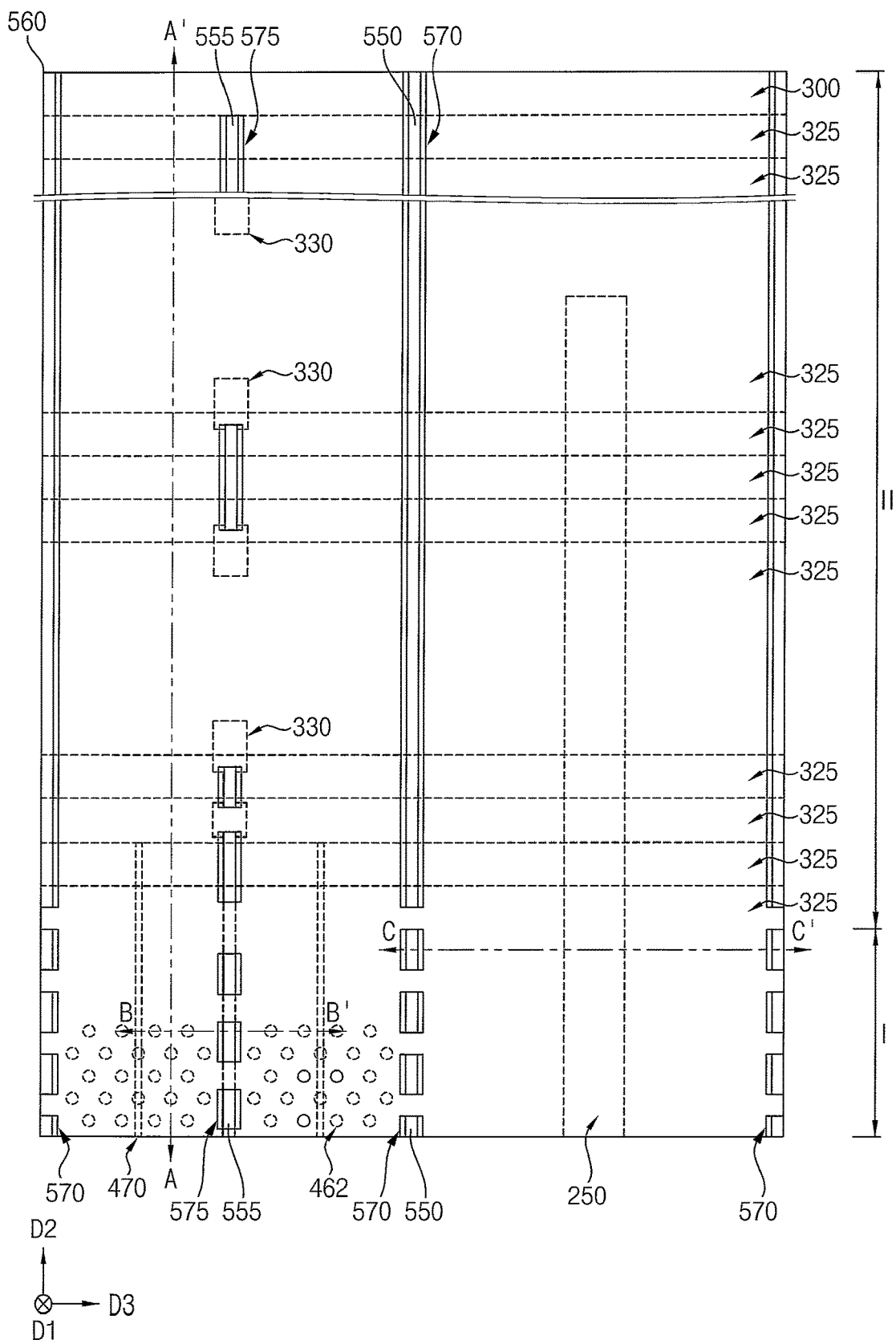
Figure 19:
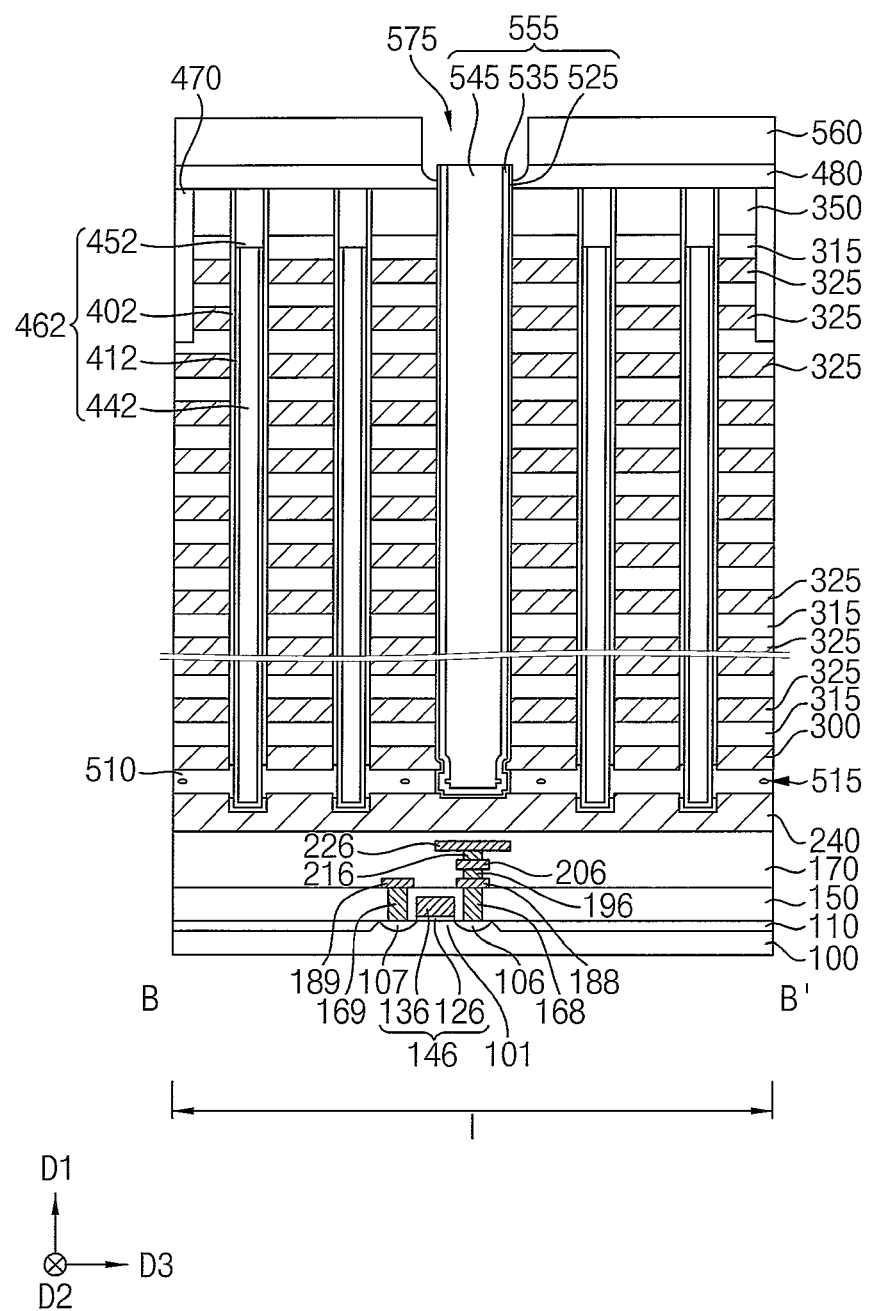

Referring to FIGS. 18 and 19, in an embodiment, a second support layer 560 is formed on the fifth insulating interlayer 480 and the second and third sacrificial layer structures 550 and 555, and is partially etched to form sixth and seventh openings 570 and 575.

In exemplary embodiments, the sixth opening 570 exposes an upper surface of the second sacrificial layer structure 550. FIG. 18 shows that the sixth opening 570 continuously extends in the second direction D2 in the second region II of the substrate 100, and that a plurality of sixth openings 570 are spaced apart from each other in the second direction D2 in the first region I of the substrate 100 over the same second sacrificial layer structure 550. However, embodiments of the inventive concept are not necessarily limited thereto, and in some embodiments, the plurality of sixth openings 570 are also spaced apart from each other in the second direction D2 in the second region II of the substrate 100. In an exemplary embodiment, a width in the third direction D3 of the sixth opening 570 is greater than that of the second sacrificial layer structure 550, but embodiments of the inventive concept are not necessarily limited thereto.

In exemplary embodiments, the seventh opening 575 exposes an upper surface of the third sacrificial layer structure 555. A plurality of seventh openings 575 are spaced apart from each other in the second direction D2 in the second region II of the substrate 100, and the plurality of seventh openings 575 are spaced apart from each other in the second direction D2 in the first region I of the substrate 100 over the same second sacrificial layer structure 550. In an exemplary embodiment, a width in the third direction D3 of the seventh opening 575 is greater than that of the third sacrificial layer structure 555, but embodiments of the inventive concept are not necessarily limited thereto. In an embodiment, a separation between seventh openings 575 in the second direction is greater in the second region II than in the first region I.

In exemplary embodiments, the sixth and seventh openings 570 and 575 are disposed in a zigzag pattern along the second direction D2 in the first region I of the substrate 100, and partially overlap each other in the third direction D3.

The second support layer 560 includes, for example, an oxide such as silicon oxide.

Figure 20:
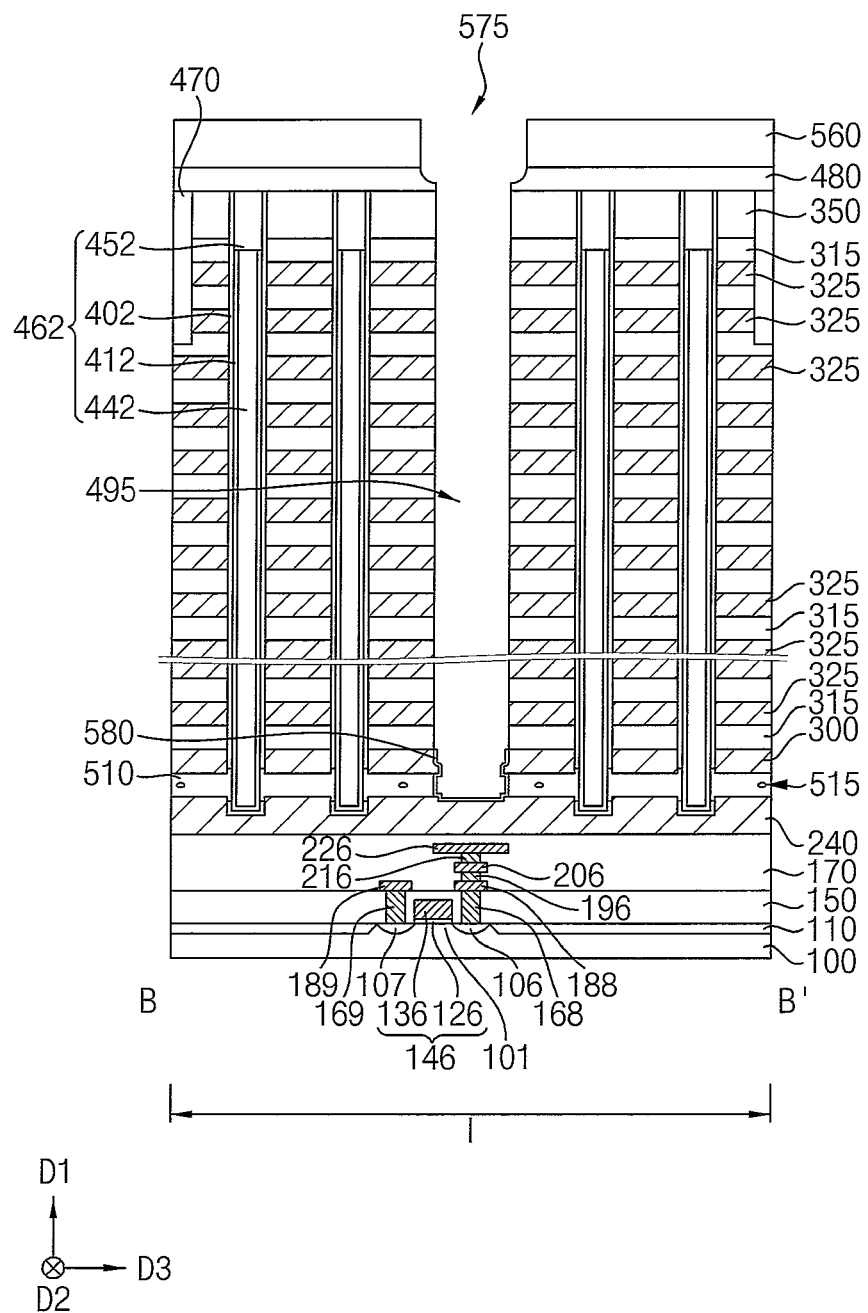

Referring to FIG. 20, in an embodiment, the second and third sacrificial layer structures 550 and 555 are removed by an etching process performed through the sixth and seventh openings 570 and 575, and thus the fourth and fifth openings 490 and 495 are formed again.

The sixth and seventh openings 570 and 575 on the second and third sacrificial layer structures 550 and 555, respectively, do not entirely expose but partially cover the upper surfaces of the second and third sacrificial layer structures 550 and 555 in the first region I of the substrate 100, and thus a probability of collapse in the third direction D3 of the mold is reduced.

In exemplary embodiments, the second and third sacrificial layer structures 550 and 555 are removed by a wet etching process.

An oxidation process is performed on a layer structure that includes silicon and is exposed by the fourth and fifth openings 490 and 495 to form a protection layer 580 that includes silicon oxide. In exemplary embodiments, as the oxidation process is performed, the protection layer 580 is formed on the upper surface of the CSP 240 exposed by the fourth and fifth openings 490 and 495, and sidewalls of the channel connecting pattern 510, the first support layer 300 and the support pattern 305.

Figure 21:
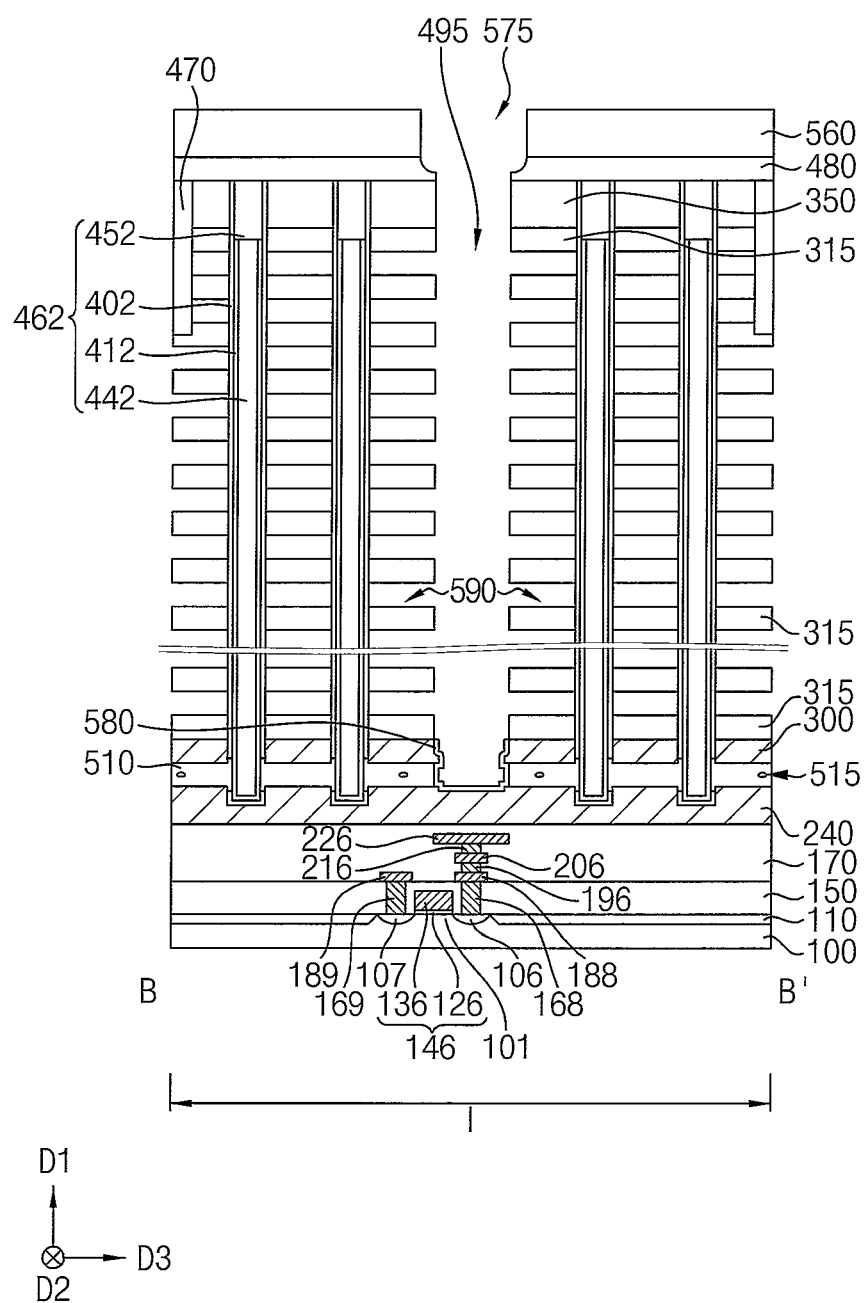
Figure 22:
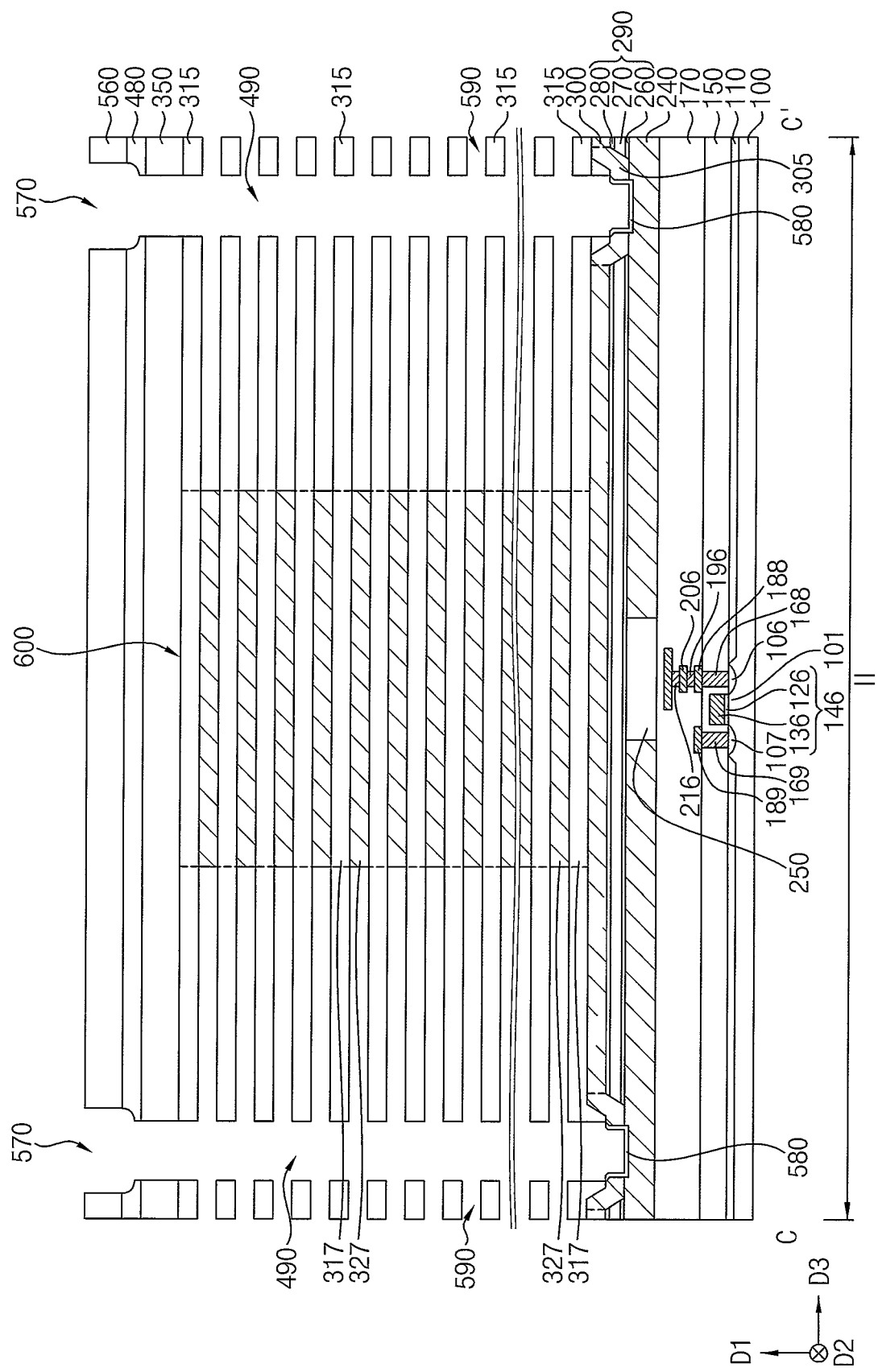

Referring to FIGS. 21 and 22, in an embodiment, the fourth sacrificial patterns 325 exposed by the fourth and fifth openings 490 and 495 are removed to form a second gap 590 between the first insulating patterns 315 at respective levels, and a portion of an outer wall of the charge storage structure 402 in the memory channel structure 462 is exposed by the second gap 590.

In exemplary embodiments, the fourth sacrificial patterns 325 are removed by a wet etching process that uses an etchant that includes phosphoric acid ($H_3PO_4$) or sulfuric acid ($H_2SO_4$).

The wet etching process is performed through the fourth and fifth openings 490 and 495, and all portions of the fourth sacrificial patterns 325 between the fourth and fifth openings 490 and 495 are removed by the etchant that flows in both directions through the fourth and fifth openings 490. However, in a region where the fifth opening 495 is not formed between the fourth openings 490, the etchant flows in only one direction through the fourth opening 490, and the fourth sacrificial patterns 325 partially remain without being completely removed. A remaining portion of the fourth sacrificial patterns 325 is referred to as a third insulating pattern 327. In addition, a portion of the first insulating patterns 315 that overlaps the third insulating patterns 327 in the first direction D1 may be referred to as a second insulating pattern 317. The second and third insulating patterns 317 and 327 are alternately and repeatedly stacked along the first direction D1 and form an insulating pattern structure 600.

In an exemplary embodiment, the insulating pattern structure 600 extends through a portion of the mold in the second region II of the substrate 100, and has, for example, a cross-sectional shape of a rectangle, an oval, a circle, or a rectangle with concave opposite sides that face each other in the second direction D2. The insulating pattern structure 600 extends through the relatively long second steps in the second direction D2 in each of the molds.

The insulating pattern structure 600 extends through a portion of the mold over the filling layer 250 in the first and second regions I and II of the substrate 100, for example, in a region in which the fifth openings 495 are not formed between the fourth openings 490 adjacent to each other in the third direction D3. The insulating pattern structure 600 has a bar shape that extends in the second direction D2 in a plan view.

Figure 23:
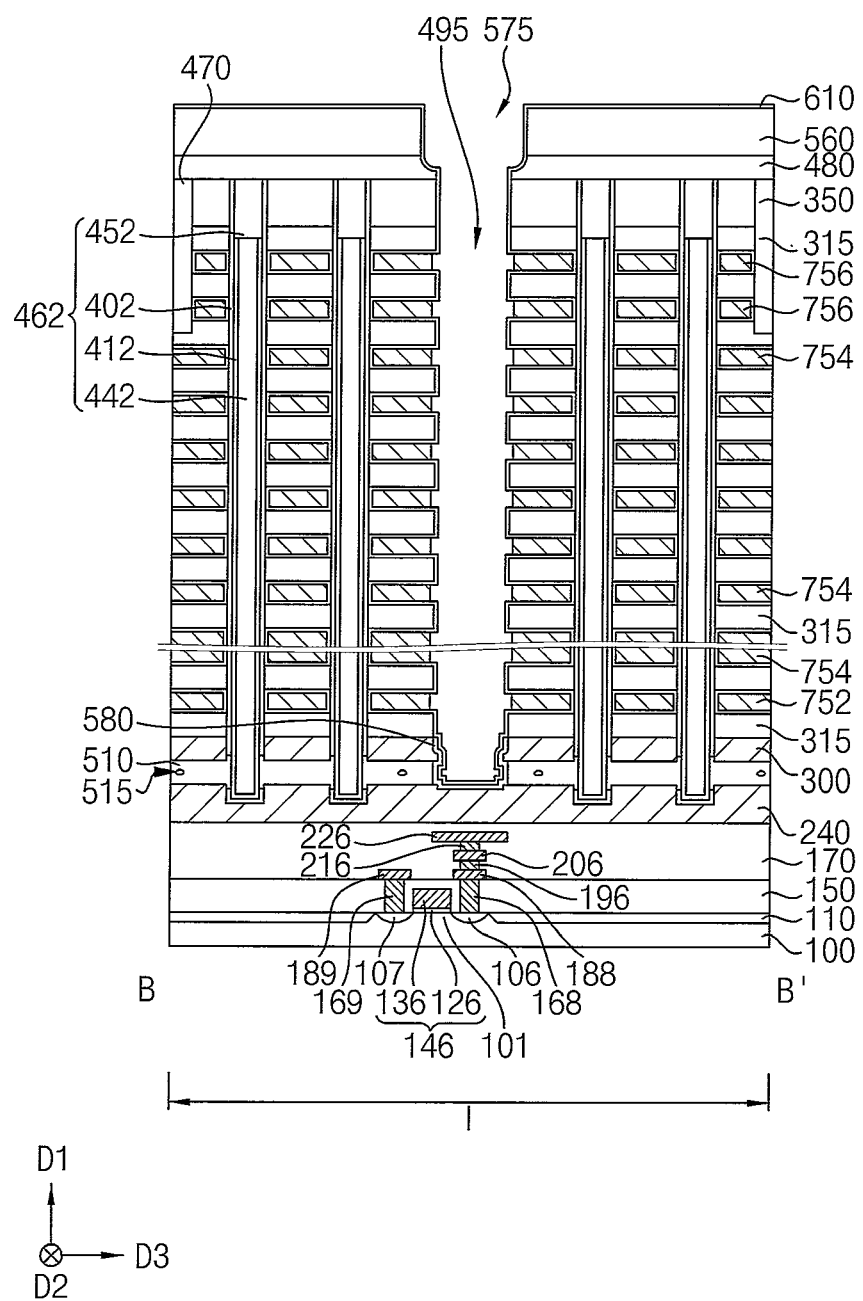
Figure 24:
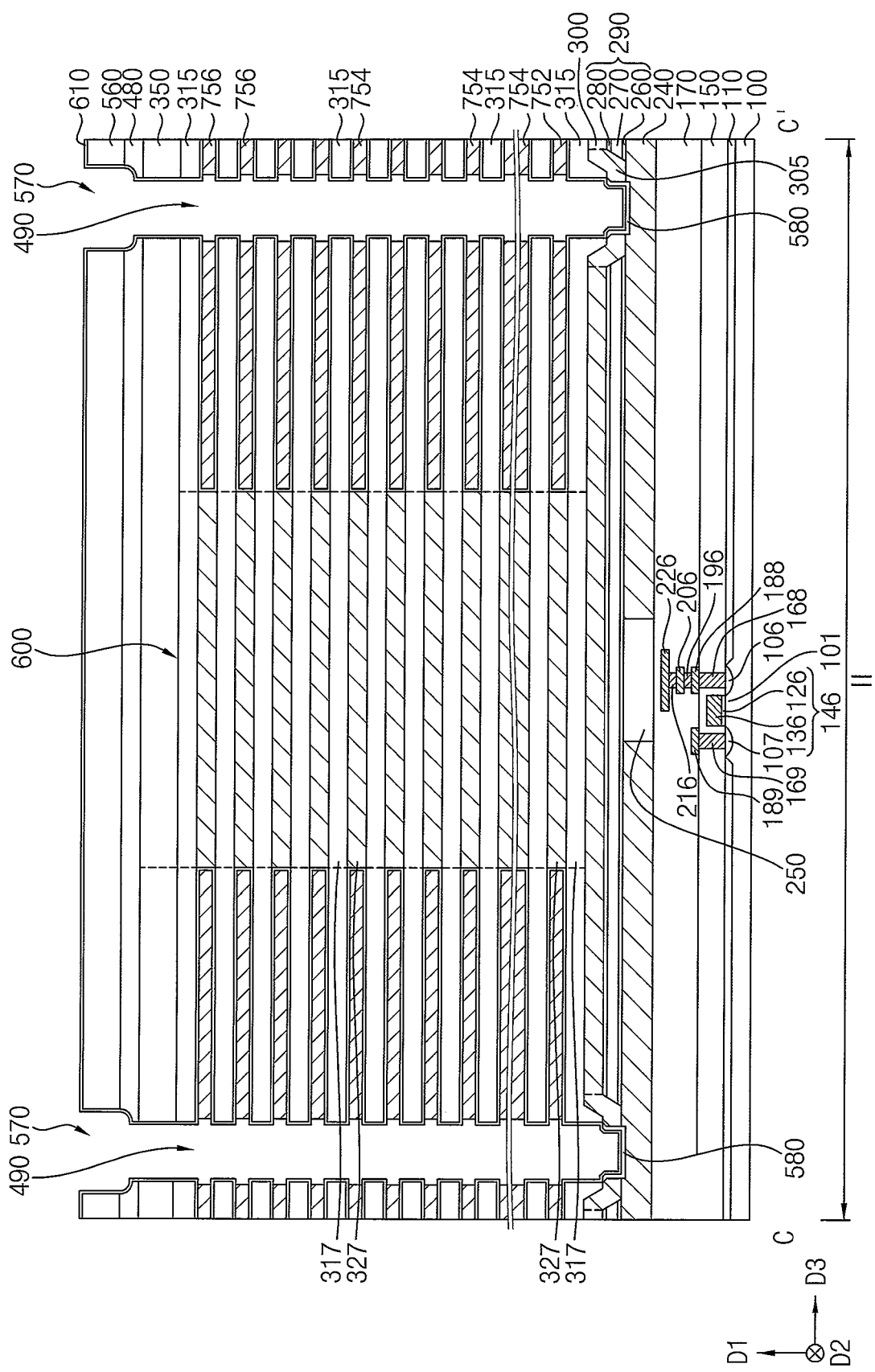

Referring to FIGS. 23 and 24, in an embodiment, a second blocking layer 610 is formed on the outer sidewall of the charge storage structure 402 exposed by the fourth and fifth openings 490 and 495, inner sidewalls of the second gaps 590, surfaces of the first insulating patterns 315, an upper surface of the protection layer 580, a sidewall and a portion of an upper surface of the fifth insulating interlayer 480, and a sidewall and an upper surface of the second support layer 560, and a gate electrode layer is formed on the second blocking layer 610.

The gate electrode layer includes a gate barrier layer and a gate conductive layer that are sequentially stacked. The gate barrier layer includes a metal nitride, and the gate conductive layer includes a metal. The second blocking layer 610 includes, for example, a metal oxide such as aluminum oxide or hafnium oxide.

The gate electrode layer is partially removed to form a gate electrode in each of the second gaps 590. In exemplary embodiments, the gate electrode layer is partially removed by a wet etching process. Thus, in the mold that includes step layers, in which each includes one fourth sacrificial layer 320 and one insulating layer 310 that are sequentially stacked and have a staircase shape, the fourth sacrificial pattern 325 is replaced by the gate electrode and the second blocking layer 610 that covers upper and lower surfaces of the gate electrode.

In exemplary embodiments, the gate electrode extends in the second direction D2, and a plurality of gate electrodes are spaced apart from each other in the first direction D1 at a plurality of levels, respectively, to form a gate electrode structure. The gate electrode structure has a staircase shape with each of the gate electrodes as a step layer. A portion of each gate electrode in the second direction D2 that is not overlapped in the first direction D1 by an upper gate electrode, for example, a portion that corresponds to a step of each step layer, may be referred to as a pad. The gate electrode structure includes first pads that are relatively short in the second direction D2 and second pads that are relatively long in the second direction D2, and the number of the first and second pads is not necessarily limited.

In addition, a plurality of the gate electrode structures are formed along the third direction D3, and are spaced apart from each other in the third direction D3 by the fourth openings 490. As illustrated above, the fifth openings 495 are spaced apart from each other without extending to opposite ends in the second direction D2 of the gate electrode structure, and thus the gate electrode structures are not completely separated from each other in the third direction D3 by the fifth openings 495. However, the lowermost gate electrodes of the gate electrode structure are separated from each other in the third direction D3 by the fifth openings 495, the first division pattern 330, and the insulating pattern structure 600 in the second region II of the substrate 100, and the gate electrodes at the upper two levels, respectively, of the gate electrode structure are separated from each other in the third direction D3 by the fifth opening 495 and also by the second division pattern 470.

As illustrated above, the fifth openings 495 are not formed over the filling layer 250, and thus the insulating pattern structure 600 is formed instead of the gate electrode structure.

The gate electrode structure includes first, second and third gate electrodes 752, 754 and 756 that are sequentially stacked in the first direction D1. In exemplary embodiments, the first gate electrode 752 is formed at a lowermost level, and serves as a ground selection line (GSL). The third gate electrode 756 is formed at upper two levels, and serves as a string selection line (SSL). The second gate electrode 754 is formed at a plurality of levels between the first and third gate electrodes 752 and 756, and serves as a word line.

In exemplary embodiments, a memory block is formed between the fourth openings 490 adjacent to each other in the third direction D3. The memory block includes the first to third gate electrodes 752, 754, and 756, the charge storage structures 402 and the channels 412. The memory block has, at each level, two GSLs, one word line and four SSLs, but embodiments of the inventive concept are not necessarily limited thereto. Only one memory block is illustrated in FIG. 25.

Figure 25:
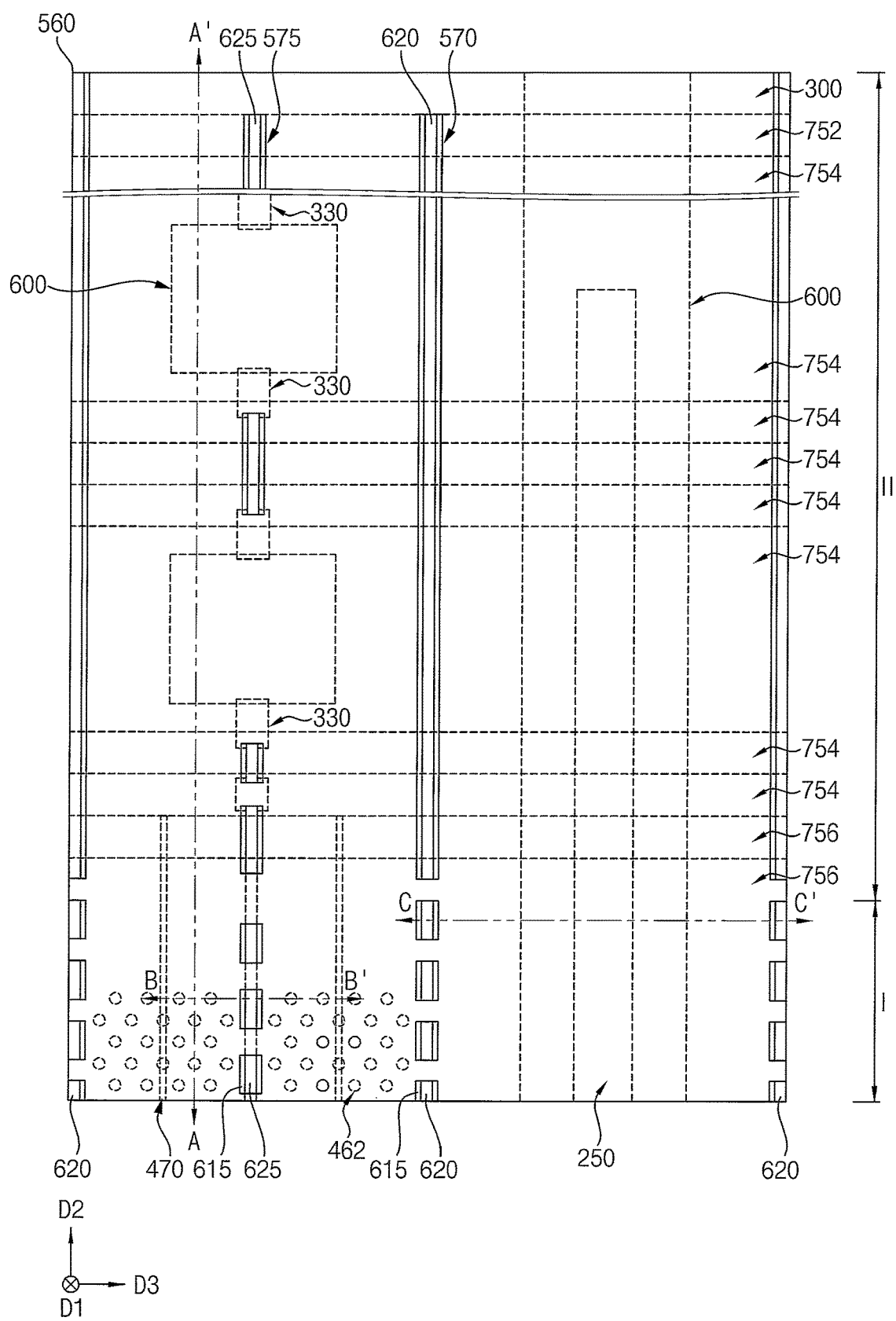
Figure 26:
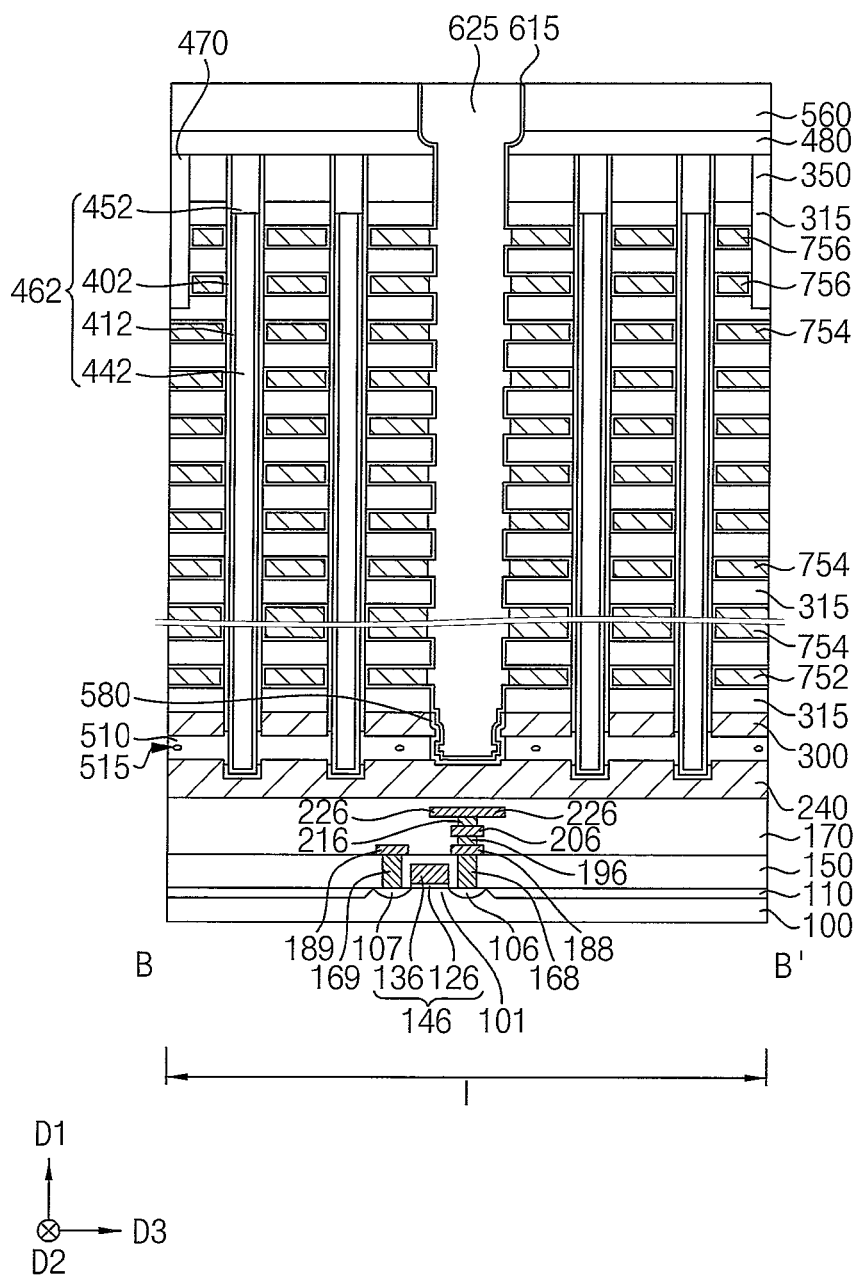
Figure 27:
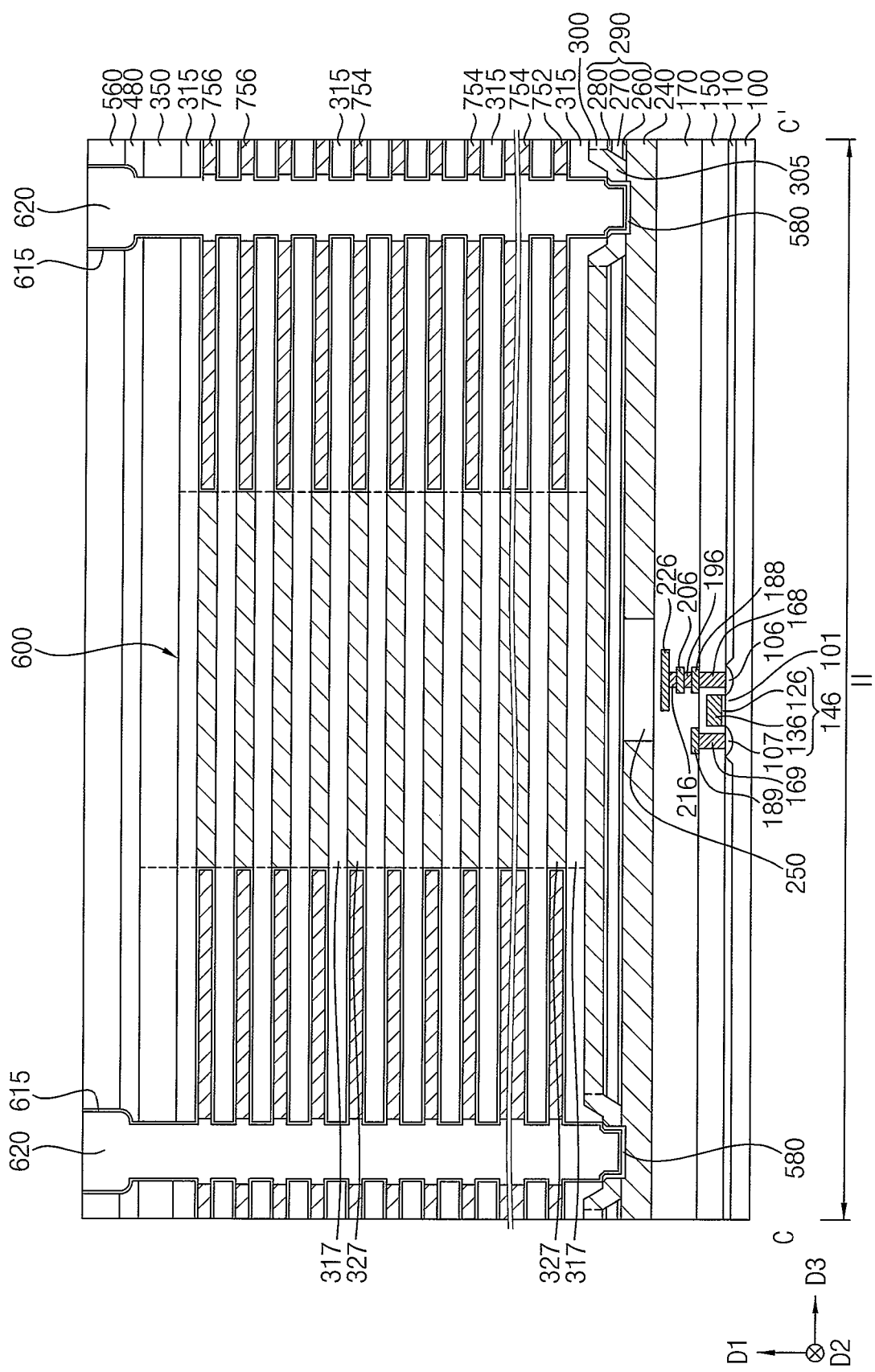

Referring to FIGS. 25 to 27, in an embodiment, a third division pattern 620 that fills the fourth and sixth openings 490 and 570, and a fourth division pattern 625 that fills the fifth and seventh openings 495 and 575 are formed on the second blocking layer 610, and are planarized until the upper surface of the second support layer 560 is exposed. Accordingly, the second blocking layer 610 is transformed into a second blocking pattern 615.

The third and fourth division patterns 620 and 625 include, for example, an oxide such as silicon oxide.

Referring to FIGS. 28 to 31, in an embodiment, first to fifth upper contact plugs 632, 634, 636, 638 and 639 that extend through the second support layer 560, the third to fifth insulating interlayers 340, 350 and 480, and the first insulating pattern 315, are formed, and first to third through vias 642, 644 and 646 that extend through the second support layer 560, the third to fifth insulating interlayers 340, 350 and 480, the insulating pattern structure 600, the first support layer 300, the first sacrificial layer structure 290, the CSP 240, and an upper portion of the second insulating interlayer 170 and contacting upper surfaces of the eighth and ninth lower wirings 222 and 226, are formed.

In exemplary embodiments, the first to third upper contact plugs 632, 634 and 636 contact pads of the first to third gate electrodes 752, 754 and 756, respectively. In addition, the fourth and fifth contact plugs 638 and 639 contact the upper surface of the CSP 240 adjacent to the filling layer 250.

In exemplary embodiments, the first through via 642 is formed in the first region I of the substrate 100 and contacts the eighth and ninth lower wirings 222 and 226 that are electrically connected to, for example, a transistor in a page buffer of the first and second transistors. The second through via 644 is formed in the first and second regions I and II of the substrate 100, and contacts the eighth and ninth lower wirings 222 and 226 that are electrically connected to, for example, a transistor in a CSL driver of the first and second transistors.

Figure 28:
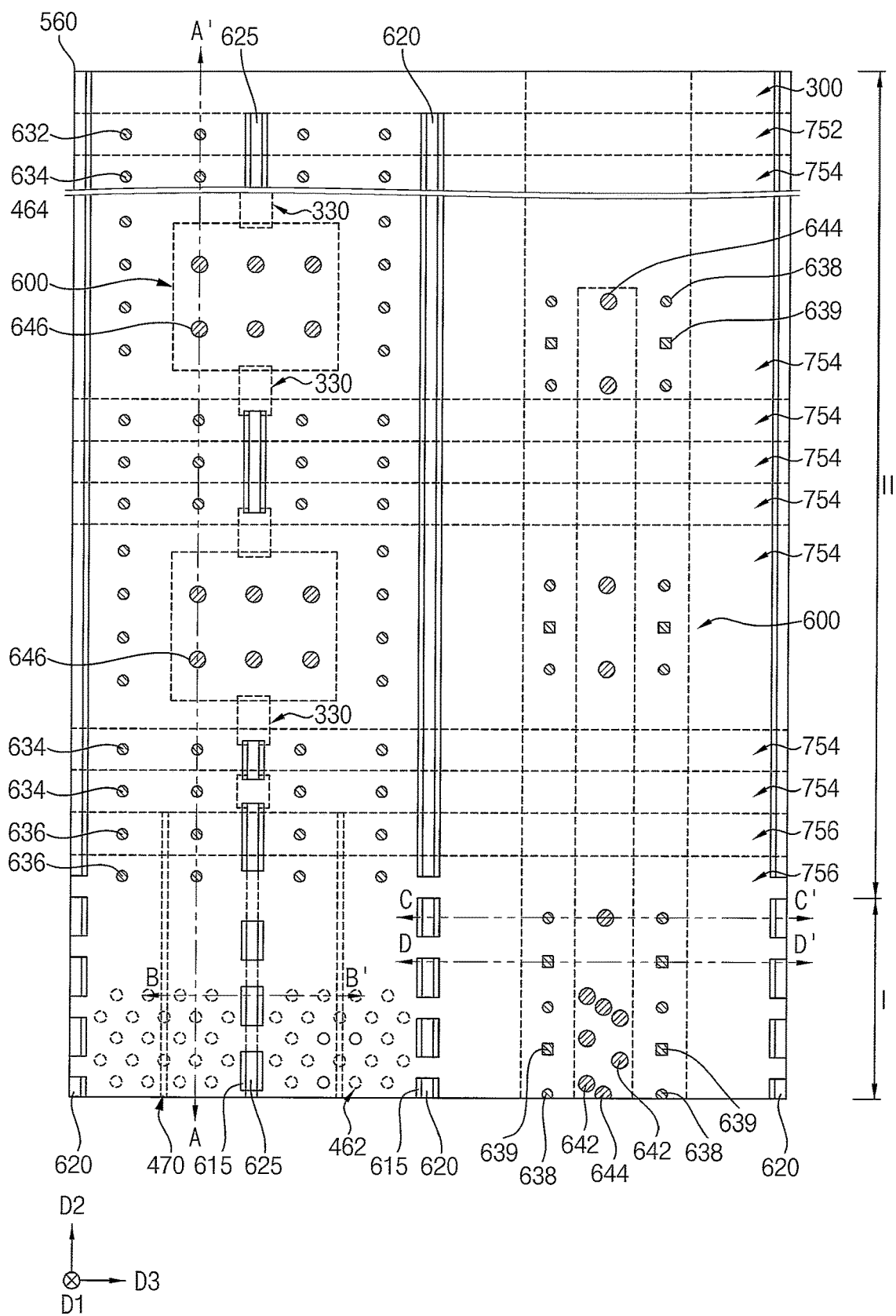
Figure 29:
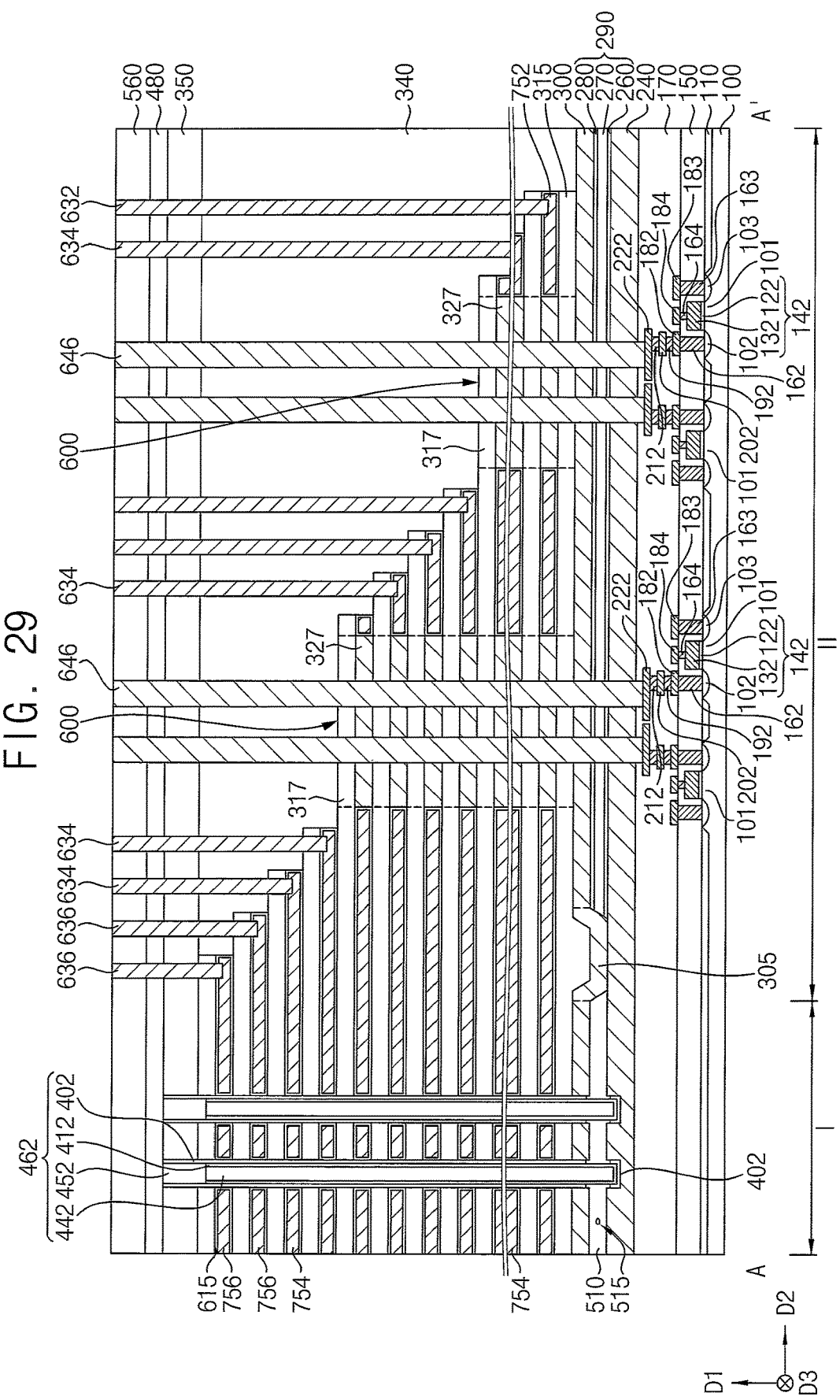
Figure 30:
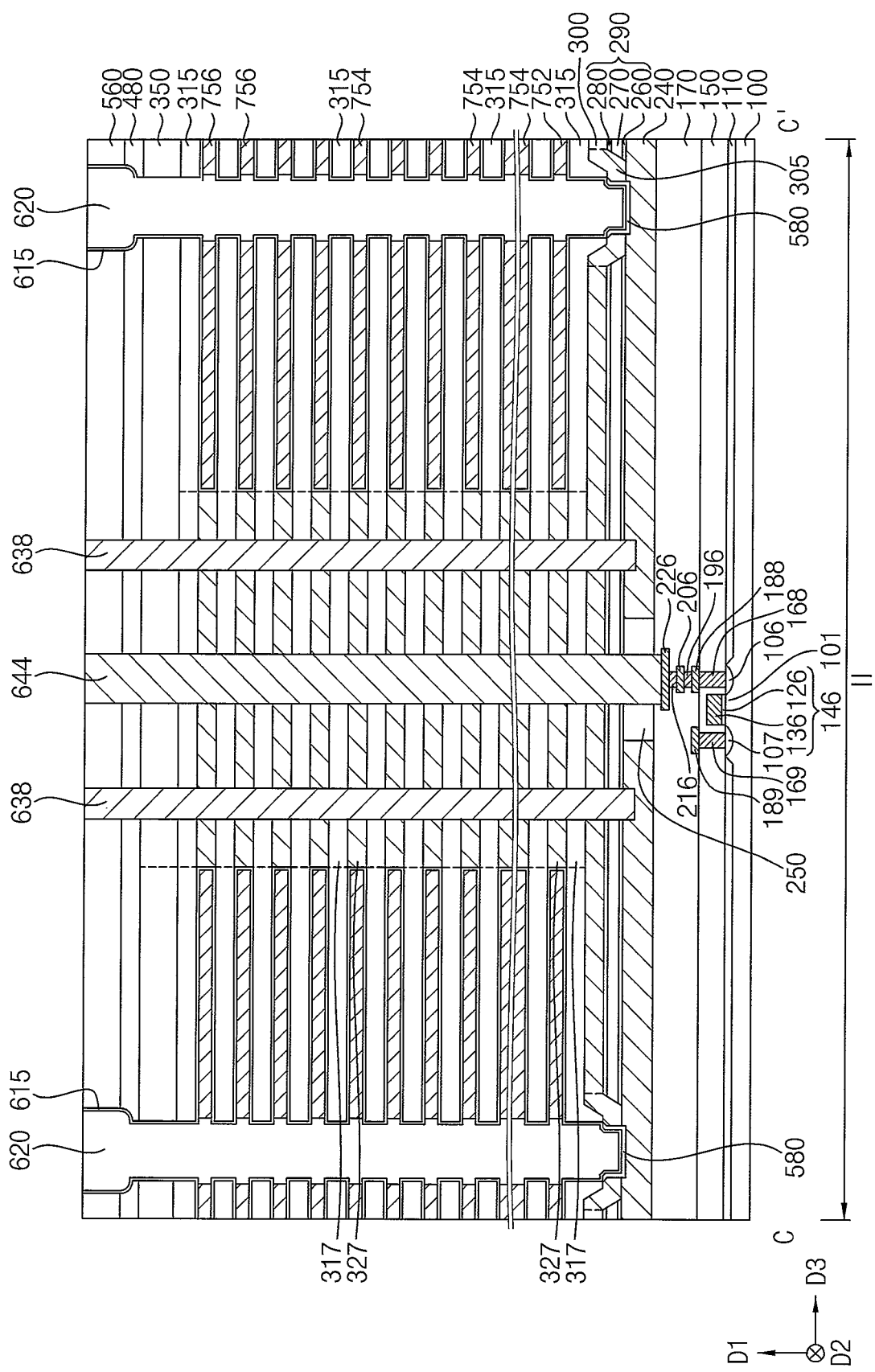

FIG. 28 shows the third through via 646 as being only formed on the second region II of the substrate 100, but embodiments of the inventive concept are not necessarily limited thereto, and in some embodiments, the third through via 646 is also formed in the first region I of the substrate 100. The third through via 646 contacts the eighth and ninth lower wirings 222 and 226 that are electrically connected to, for example, a transistor in a decoder of the first and second transistors.

Each of the first to fifth upper contact plugs 632, 634, 636, 638 and 639 and the first to third through vias 642, 644 and 646 includes, for example, at least one of a metal, a metal nitride, or a metal silicide, etc. In an exemplary embodiment, each of the first to fifth upper contact plugs 632, 634, 636, 638 and 639 and the first to third through vias 642, 644 and 646 has a metal pattern that includes a metal and a barrier pattern that includes a metal nitride and covers a lower surface and a sidewall of the metal pattern.

In exemplary embodiments, each of the first to fifth upper contact plugs 632, 634, 636, 638 and 639 and the first to third through vias 642, 644 and 646 has a shape of a circle, an oval, a polygon, or a polygon with rounded corners, in a plan view. In FIG. 28, the fourth upper contact plug 638 has a circular shape, while the fifth upper contact plug 639 has a rectangular shape, in a plan view, for ease of distinction therebetween, however embodiments of the inventive concept are not necessarily limited thereto.

Referring to FIGS. 32 to 35, in an embodiment, a sixth insulating interlayer 650 that includes, for example, an oxide such as silicon oxide, is formed on the second support layer 560, the first to fifth upper contact plugs 632, 634, 636, 638 and 639, and the first to third through vias 642, 644 and 646.

A first upper via 662 that contacts an upper surface of each of the first to third upper contact plugs 632, 634 and 636, second and third upper vias 664 and 669 that contact upper surfaces of the fourth and fifth upper contact plugs 638 and 639, respectively, a fourth upper via that contacts an upper surface of the first through via 642, a fifth upper via 665 that contacts an upper surface of the second through via 644, and a sixth upper via 666 that contacts an upper surface of the third through via 646, are formed through the sixth insulating interlayer 650.

A seventh upper via 668 is formed that extends through the fifth and sixth insulating interlayers 480 and 650 and the second support layer 560 and contacts an upper surface of the capping pattern 452 of each memory channel structure 462.

A seventh insulating interlayer 670 that includes, for example, an oxide such as silicon oxide, is formed on the sixth insulating interlayer 650, the first to third upper vias 662, 664 and 669, the fourth upper via, and the fifth to seventh upper vias 665, 666 and 668.

First to third upper wirings 682, 684, and 689 that contact upper surfaces of the first to third upper vias 662, 664 and 669, respectively, a fourth upper wiring that contacts an upper surface of the fourth upper via, and fifth to seventh upper wirings 685, 686 and 688 that contact upper surfaces of the fifth to seventh upper vias 665, 666 and 668, respectively, are formed through the seventh insulating interlayer 670.

An eighth insulating interlayer 690 that includes, for example, an oxide such as silicon oxide, is formed on the seventh insulating interlayer 670, the first to third upper wirings 682, 684 and 689, the fourth upper wiring, and the fifth to seventh upper wirings 685, 686 and 688.

Eighth to tenth upper vias 702, 704, and 709 that contact upper surfaces of the first to third upper wirings 682, 684 and 689, respectively, an eleventh upper via that contacts an upper surface of the fourth upper wiring, and twelfth to fourteenth upper vias 705, 706 and 708 that contact upper surfaces of the fifth to seventh upper wirings 685, 686 and 688, respectively, are formed through the eighth insulating interlayer 690.

A ninth insulating interlayer 710 that includes, for example, an oxide such as silicon oxide, is formed on the eighth insulating interlayer 690, the eighth to tenth upper vias 702, 704 and 709, the eleventh upper via, and the twelfth to fourteenth upper vias 705, 706 and 708.

Eighth to tenth upper wirings 722, 724 and 729 that contact upper surfaces of the eighth to tenth upper vias 702, 704 and 709, respectively, an eleventh upper wiring 728 that commonly contacts upper surfaces of the eleventh upper via and the fourteenth upper via 708, and twelfth and thirteenth upper wirings 725 and 726 that contact upper surfaces of the twelfth and thirteenth upper vias 705 and 706, respectively, are formed through the ninth insulating interlayer 710.

A tenth insulating interlayer 730 that includes, for example, an oxide such as silicon oxide, is formed on the ninth insulating interlayer 710 and the eighth to thirteenth upper wirings 722, 724, 729, 728, 725 and 726.

Fifteenth and sixteenth upper vias 742 and 744 that contact upper surfaces of the eighth and ninth upper wirings 722 and 724, respectively, and seventeenth and eighteenth upper vias 745 and 746 that contact upper surfaces of the twelfth and thirteenth upper wirings 725 and 726, respectively, are formed through the tenth insulating interlayer 730.

A eleventh insulating interlayer 760 that includes, for example, an oxide such as silicon oxide, is formed on the tenth insulating interlayer 730 and the fifteenth to eighteenth upper vias 742, 744, 745 and 746.

A fourteenth upper wiring 772 that contacts an upper surface of the fifteenth upper via 742, a fifteenth upper wiring 774 that commonly contacts upper surfaces of the sixteenth and seventeenth upper vias 744 and 745, and a sixteenth upper wiring 776 that contacts an upper surface of the eighteenth upper via 746, are formed through the eleventh insulating interlayer 760.

Each of the first to third upper vias 662, 664 and 669, the fourth upper via, the fifth to tenth upper vias 665, 666, 668, 702, 704 and 709, the eleventh upper via, twelfth to eighteenth upper vias 705, 706, 708, 742, 744, 745 and 746, first to third upper wirings 682, 684 and 689, the fourth upper wiring, and the fifth to sixteenth upper wirings 685, 686, 688, 722, 724, 729, 728, 725, 726, 772, 774 and 776 includes, for example, at least one of a metal, a metal nitride, or a metal silicide, etc. Each of the first to third upper vias 662, 664 and 669, the fourth upper via, the fifth to tenth upper vias 665, 666, 668, 702, 704 and 709, the eleventh upper via, twelfth to eighteenth upper vias 705, 706, 708, 742, 744, 745 and 746, the first to third upper wirings 682, 684 and 689, the fourth upper wiring, and the fifth to sixteenth upper wirings 685, 686, 688, 722, 724, 729, 728, 725, 726, 772, 774 and 776 has a metal pattern that includes a metal and a barrier pattern that includes a metal nitride and covers a lower surface and a sidewall of the metal pattern.

In exemplary embodiments, the transistor included in the page buffer may be electrically connected to the eleventh upper wiring 728 through the eighth and ninth lower wirings 222 and 226, the first through via 642, the fourth upper via, the fourth upper wirings, and the eleventh upper via. The eleventh upper wiring 728 may extend in the third direction D3 to be electrically connected to the channel 412 through the fourteenth upper via 708, the seventh upper wiring 688, the seventh upper via 668, and the capping pattern 452.

A transistor in the page buffer can apply an electrical signal to the channel 412 through the eleventh upper wiring 728. In exemplary embodiments, the eleventh upper wiring 728 is a bit line, and a plurality of bit lines are spaced apart from each other in the second direction D2.

In exemplary embodiments, a transistor in the CSL drive is electrically connected to the fifteenth upper wiring 774 through the eighth and ninth lower wirings 222 and 226, the second through via 644, the fifth upper via 665, the fifth upper wiring 685, the twelfth upper via 705, the twelfth upper wiring 725, and the seventeenth upper via 745. The fifteenth upper wiring 774 is electrically connected to the CSP 240 through the sixteenth upper via 744, the ninth upper wiring 724, the ninth upper via 704, the second upper wiring 684, the second upper via 664, and fourth upper contact plug 638. Accordingly, the transistor in the CSL driver can apply an electrical signal to the CSP 240 through the fifteenth upper wiring 774.

In exemplary embodiments, a transistor in the decoder is electrically connected to the sixteenth upper wiring 776 through the eighth and ninth lower wirings 222 and 226, the third through via 646, the sixth upper via 666, the sixth upper wiring 686, the thirteenth upper via 706, the thirteenth upper wiring 726 and the eighteenth upper via 746. The first to third upper contact plugs 632, 634 and 636 that contact the pads of the first to third gate electrodes 752, 754 and 756, respectively, are electrically connected to the fourteenth upper wiring 772 through the first upper via 662, the first upper wiring 682, the eighth upper via 702, the eighth upper wiring 722, and the fifteenth upper via 742.

In exemplary embodiments, the fourteenth and sixteenth upper wirings 772 and 776 may directly or indirectly contact each other to be electrically connected to each other, and accordingly, a transistor in the decoder transmits an electrical signal to each of the first to third gate electrodes 752, 754 and 756 through the fourteenth and sixteenth upper wirings 772 and 776.

In exemplary embodiments, the fifth upper contact plug 639 electrically connected to the CSP 240 is connected to the third upper via 669, the third upper wiring 689, the tenth upper via 709 and the tenth upper wiring 729, but the tenth upper wiring 729 is not electrically connected to an additional upper wiring. Thus, the tenth upper wiring 729 is not electrically connected to the lower circuit pattern, such as the CSL driver, through the additional upper wiring. For example, electrical signals from other circuit patterns are not transmitted to the fifth upper contact plug 639, the third upper via 669, the third upper wiring 689, the tenth upper via 709 and the tenth upper wiring 729 that are connected to the CSP 240, and thus the fifth upper contact plug 639, the third upper via 669, the third upper wiring 689, the tenth upper via 709 and the tenth upper wiring 729 form a dummy wiring structure.

Each of the first to fifth upper contact plugs 632, 634, 636, 638 and 639, the first to third through vias 642, 644 and 646, the first to third upper vias 662 and 664, the fourth upper via, the fifth to tenth upper vias 665, 666, 668, 702, 704 and 709, the eleventh upper via, the twelfth to eighteenth upper vias 705, 706, 708, 742, 744, 745 and 746, the first to third upper wirings 682, 684 and 689, the fourth upper wiring, and the fifth to sixteenth upper wirings 685, 686, 688, 722, 724, 729, 728, 725, 726, 772, 774 and 776, is formed by a damascene process, such as a deposition process and a planarization process, or a patterning process, such as a deposition process and an etching process.

Hydrogen is generated in a deposition process, a planarization process, and/or an etching process, and contact plugs, vias, and upper wirings connected to the CSP 240 serve as paths for the generated hydrogen. The channel 412 connected to the CSP 240 through the channel connection pattern 510 can be damaged by the deposition process, the etching process, and/or various thermal processes that form other structures thereafter, and electrical properties of the channel 412 can be degraded. However, the hydrogen that moves through the contact plugs, the vias, and the upper wirings connected to the CSP 240 moves to the channel 412 through the channel connection pattern 510, and thus polysilicon in the channel 412 is cured, so that the electrical characteristics of the channel 412 are improved.

As described above, the fourth upper contact plug 638, the second upper via 664, the second upper wiring 684, the ninth upper via 704, and the ninth upper wiring 724, the sixteenth upper via 744, and the fifteenth upper wiring 774 are connected to the CSP 240, and serve as a path for hydrogen to cure the channel 412. The fifteenth upper wiring 774 is electrically connected to the CSL driver through the seventeenth upper via 745, the twelfth upper wiring 725, the twelfth upper via 705, the fifth upper wiring 685, the fifth upper via 665, the second through via 644, and the eighth and ninth lower wirings 222 and 226, and receives and transmits an electrical signal thereto/from.

However, the fifth upper contact plug 639, the third upper via 669, the third upper wiring 689, the tenth upper via 709 and the tenth upper wiring 729 connected to the CSP 240 can also serve as a path for the hydrogen to cure the channel 412, but are not electrically connected to a lower circuit pattern such as the CSL driver, and thus form a dummy wiring structure that does not transmit an electrical signal. For example, the dummy wiring structure does not transmit an electrical signal to the CSP 240, although it contacts the CSP 240, but can cure the channel 412 connected to the CSP 240. Accordingly, the dummy wiring structure does not affect a voltage applied to each of a plurality of memory blocks electrically connected to the CSL driver through the CSP 240 and a current flowing therein.

However, the fifth upper contact plug 639, the third upper via 669, the third upper wiring 689, the tenth upper via 709 and the tenth upper wiring 729 are not part of the dummy wiring structure, but instead, form a wiring structure that is electrically connected to the CSL driver that receives and transmits a signal.

For example, if CSL noise changes in the semiconductor device, skew occurs between the memory blocks or within each of the memory block, and the circuit pattern needs to be modified. To modify the circuit pattern, the number of the contact plugs, the vias, and the upper wirings electrically connected to the CSP 240 may need to increase or decrease, which incurs additional cost and time.

To improve distortion caused by CSL noise change, the number of the eighth and ninth lower wirings 222 and 226, the second through via 644, the fifth upper via 665, the fifth upper wiring 685, the twelfth upper via 705, the twelfth upper wiring 725, the seventeenth upper via 745 and the fifteenth upper wiring 774 electrically connected to the CSL driver, or the number of the sixteenth upper via 744, the ninth upper wiring 724, the ninth upper via 704, the second upper wiring 684, the second upper via 664 and the fourth upper contact plug 638 electrically connected to the CSL driver should be increased or decreased.

However, in exemplary embodiments, a semiconductor device includes the dummy wiring structure that includes the third upper via 669, the third upper wiring 689, the tenth upper via 709 and the tenth upper wiring 729 that are electrically connected to the CSP 240 but not to the CSL driver. If skew due to the noise change of the CSL needs improving, a portion of the dummy wiring structure can be connected to an upper wiring structure that is electrically connected to the CSL driver. For example, the tenth upper wiring 729 can be connected to the ninth upper wiring 724 or the twelfth upper wiring 725 at a same level, or alternatively, the third upper wiring 689 can be connected to the second upper wiring 684 or the fifth upper wiring 685 at a same level, so that the skew due to the CSL noise change can be easily improved, and the cost and time can be reduced.

The upper circuit pattern is formed in the sixth to eleventh insulating interlayers 650, 670, 690, 710, 730 and 760, and the upper wirings are formed at three levels, but embodiments of the inventive concept are not necessarily limited thereto. For example, in embodiment, the upper wirings are formed at more or fewer than three levels.

The manufacturing of a semiconductor device is completed by performing the above-described processes, A semiconductor device manufactured by an above-described processes has the following structural characteristics.

Referring to FIGS. 28 and 32 to 35, a semiconductor device includes a lower circuit pattern on the substrate 100, the CSP 240 on the lower circuit pattern, the filling layer 250 at the same level as and that extends through the CSP 240, a gate electrode structure that includes the first, second, and third gate electrodes 752, 754, and 756, each of which extends in the second direction D2 and are spaced apart from each other on the CSP 240 in the first direction D1, the memory channel structure 462 that extends through the gate electrode structure on the CSP 240 and is connected to the CSP 240, a first upper wiring structure that contacts the upper surface of the CSP 240, a second upper wiring structure that contacts the upper surface of the CSP 240 and is spaced apart from the first upper wiring structure, the second through via 644 that extends through the CSP 240 in the first direction D1 on the substrate 100 and is electrically connected to the lower circuit pattern, the first through via 642 that extends through the filling layer 250 in the first direction D1 on the substrate 100 and is electrically connected to the lower circuit pattern, a third upper wiring structure that is electrically connected to the gate electrode structure, a fourth upper wiring structure that contacts the upper surface of the first through via 642, and the bit line that is electrically connected to the memory channel structure 462 and the first through via 642, such as the fourth upper wiring structure. The first upper wiring structure is connected to the second through via 644, and the second upper wiring structure is not connected to the second through via 644 and does not to receive an electric signal from the lower circuit pattern.

In exemplary embodiments, the lower circuit pattern includes the page buffer, the decoder, and the CSL driver. The first through via 642 is electrically connected to the page buffer, the second through via 644 is electrically connected to the CSL driver, and the third upper wiring structure is electrically connected to the decoder.

In exemplary embodiments, the first upper wiring structure includes the fourth upper contact plug 638, the second upper via 664, the second upper wiring 684, the ninth upper via 704, the ninth upper wiring 724, the sixteenth upper via 744 and the fifteenth upper wirings 774 that are sequentially stacked in the first direction D1. The first upper wiring structure receives a signal from the CSL driver through the fifth upper via 665, the fifth upper wiring 685, the twelfth upper via 705, the twelfth upper wiring 725 and the seventeenth upper via 745 that are sequentially stacked on the second through via 644 in the first direction D1.

The second upper wiring structure includes the fifth upper contact plug 639, the third upper via 669, the third upper wiring 689, the tenth upper via 709 and the tenth upper wiring 729 that are sequentially stacked in the first direction D1, and the second upper wiring structure is a dummy wiring structure that does not receive electrical signals from the CSL driver.

In exemplary embodiments, the third upper wiring structure includes the first to third upper contact plugs 632, 634 and 636 that contact pads of the first to third gate electrodes 752, 754 and 756, respectively, and the first upper via 662, the first upper wiring 682, the eighth upper via 702, the eighth upper wiring 722, the fifteenth upper via 742 and the fourteenth upper wiring 772 are sequentially stacked on each of the first to third upper contact plugs 632, 634 and 636.

In exemplary embodiments, the fourth wiring structure includes the fourth upper via, the fourth upper wiring and the eleventh upper via that are sequentially stacked in the first direction D1 and that are electrically connected to the eleventh upper wiring 728 that serves as a bit line. The eleventh upper wiring 728 is electrically connected to the channel 412 through the capping pattern 452, the seventh upper via 668, the seventh upper wiring 688 and the fourteenth upper via 708 that are sequentially stacked on the channel 412 in the first direction D1.

In exemplary embodiments, the third and tenth upper wirings 689 and 729 in the second upper wiring structure are formed at substantially the same levels as but are not connected to the second and ninth upper wirings 684 and 724, respectively, in the first upper wiring structure.

In exemplary embodiments, a plurality of first upper wiring structures are spaced apart from each other on an edge of the CSP 240 and/or a portion of the CSP 240 adjacent to the filling layer 250, and a plurality of second upper wiring structures are formed between the first upper wiring structures.

In exemplary embodiments, the memory channel structure 462 includes the channel 412 that extends in the first direction D1 and includes polysilicon, and the charge storage structure 402 that covers the outer sidewall of the channel 412.

In exemplary embodiments, the channel connection pattern 510 includes polysilicon and is formed on the CSP 240, and the channel 412 is connected to the CSP 240 through the channel connection pattern 510.

Figure 36:
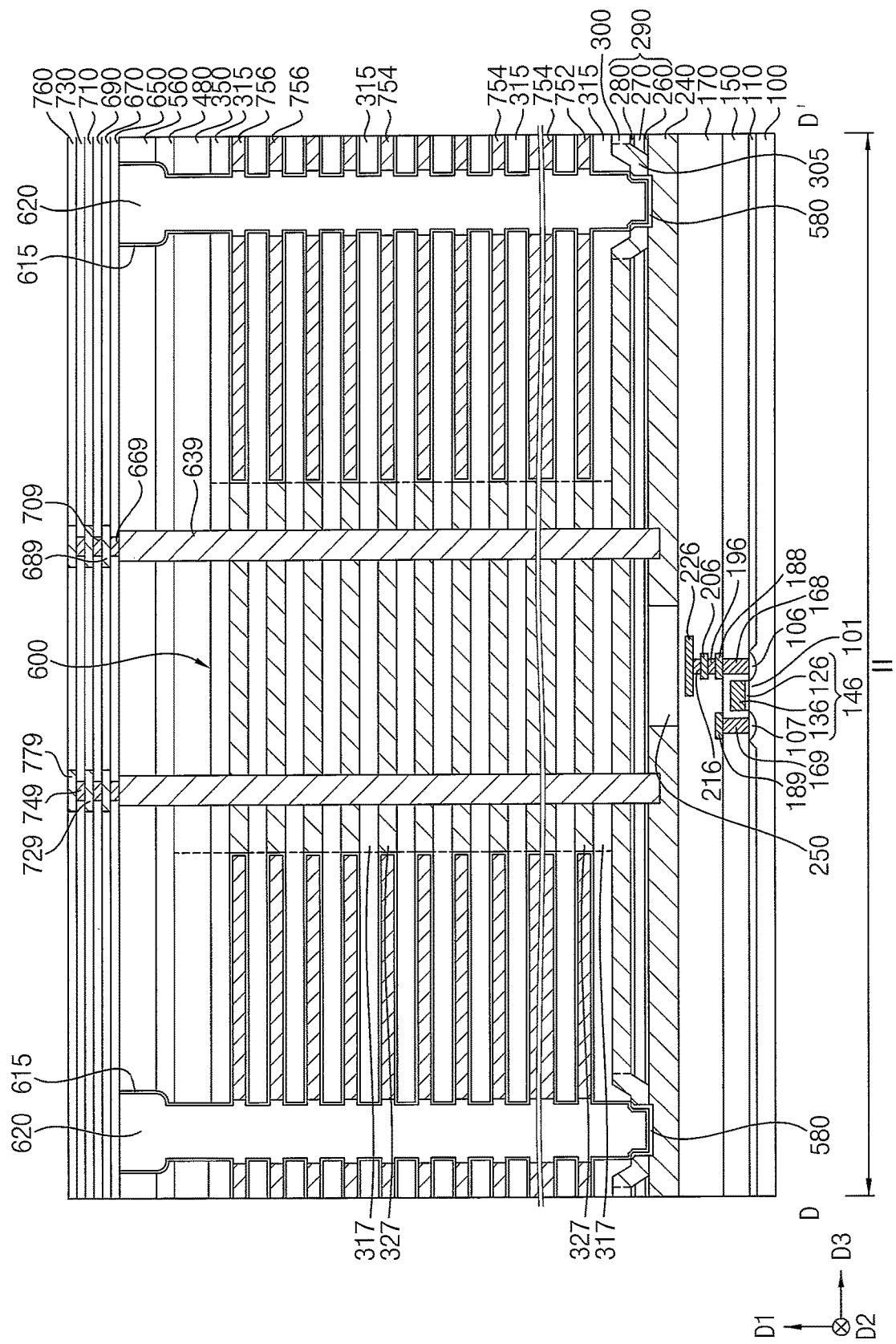
FIGS. 36 and 37 are cross-sectional views of a semiconductor device in accordance with exemplary embodiments, which correspond to the cross-sectional view of FIG. 35.
Figure 37:
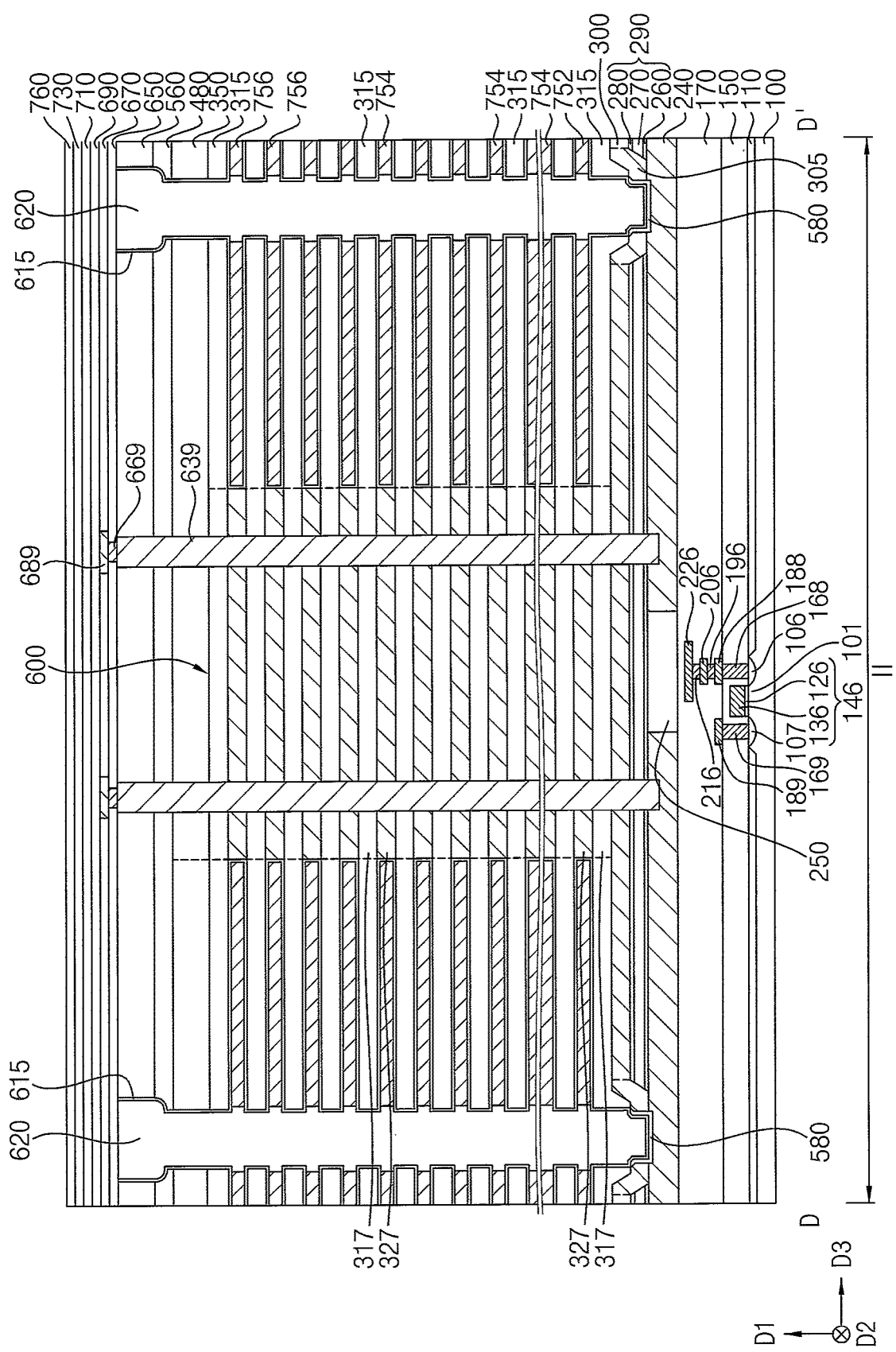

FIGS. 36 and 37 are cross-sectional views that illustrate a semiconductor device according to exemplary embodiments that corresponds to FIG. 35. A semiconductor device of FIGS. 36 and 37 is substantially the same as or similar to a semiconductor device shown in FIGS. 28 and 32 to 35, except for elements of a dummy wiring structure, and repeated explanations thereof may be omitted hereinbelow.

Referring to FIG. 36, in an embodiment, the dummy wiring structure further includes a nineteenth upper via 749 that extends through the tenth insulating interlayer 730 and contacts an upper surface of the tenth upper wiring 729, and a seventeenth upper wiring 779 that extends through the eleventh insulating interlayer 760 and contacts an upper surface of the nineteenth upper via 749.

The dummy wiring structure contacts the CSP 240, but is not electrically connected to the CSL driver. In addition, the dummy wiring structure can be connected to the upper wiring structure that is electrically connected to the CSL driver, if necessary. A semiconductor device shown in FIG. 35 includes the third and tenth upper wirings 689 and 729 at two respective levels, and, for example, the tenth upper wiring 729 can be electrically connected to the ninth upper wiring 724 or the twelfth upper wiring 725 at a same level, if necessary. A semiconductor device shown in FIG. 36 includes the third, tenth, and seventeenth upper wirings 689, 729 and 779 at three respective levels, and, for example, the seventeenth upper wiring 779 can be electrically connected to the fifteenth upper wiring 774 at a same level, if necessary.

Referring to FIG. 37, in an embodiment, the dummy wiring structure does not include the tenth upper via 709 and the tenth upper wiring 729.

The dummy wiring structure can be easily connected to the upper wiring structure electrically connected to the CSL driver, if necessary. Thus, a semiconductor device includes the third upper wiring 689 at one level, and the third upper wiring 689 can be electrically connected to the second upper wiring 684 or the fifth upper wiring 685 at a same level, if necessary As illustrated in FIGS. 35 to 37, the dummy wiring structure may include an upper wiring at one level or a plurality of upper wirings at two or three respective levels, and some or all of the upper wirings may be formed depending on the region. In some embodiments, dummy wiring structure includes upper wirings at more than three respective levels.

FIGS. 38 to 43 are plan views of a layout of the fourth and fifth upper contact plugs 638 and 639 in a semiconductor device that corresponds to FIG. 28.

For ease of illustration, FIGS. 38 to 43 only show the filling layer 250 in the CSP 240 and the fourth and fifth upper contact plugs 638 and 639 that contact the upper surface of the CSP 240, and two filling layers 250 spaced apart from each other in the third direction D3, however, embodiments of the inventive concepts are not necessarily limited thereto. In addition, for ease of distinction fourth upper contact plug 638 is illustrated in a circular shape, and the fifth upper contact plug 639 is illustrated in a rectangular shape.

Figure 38:
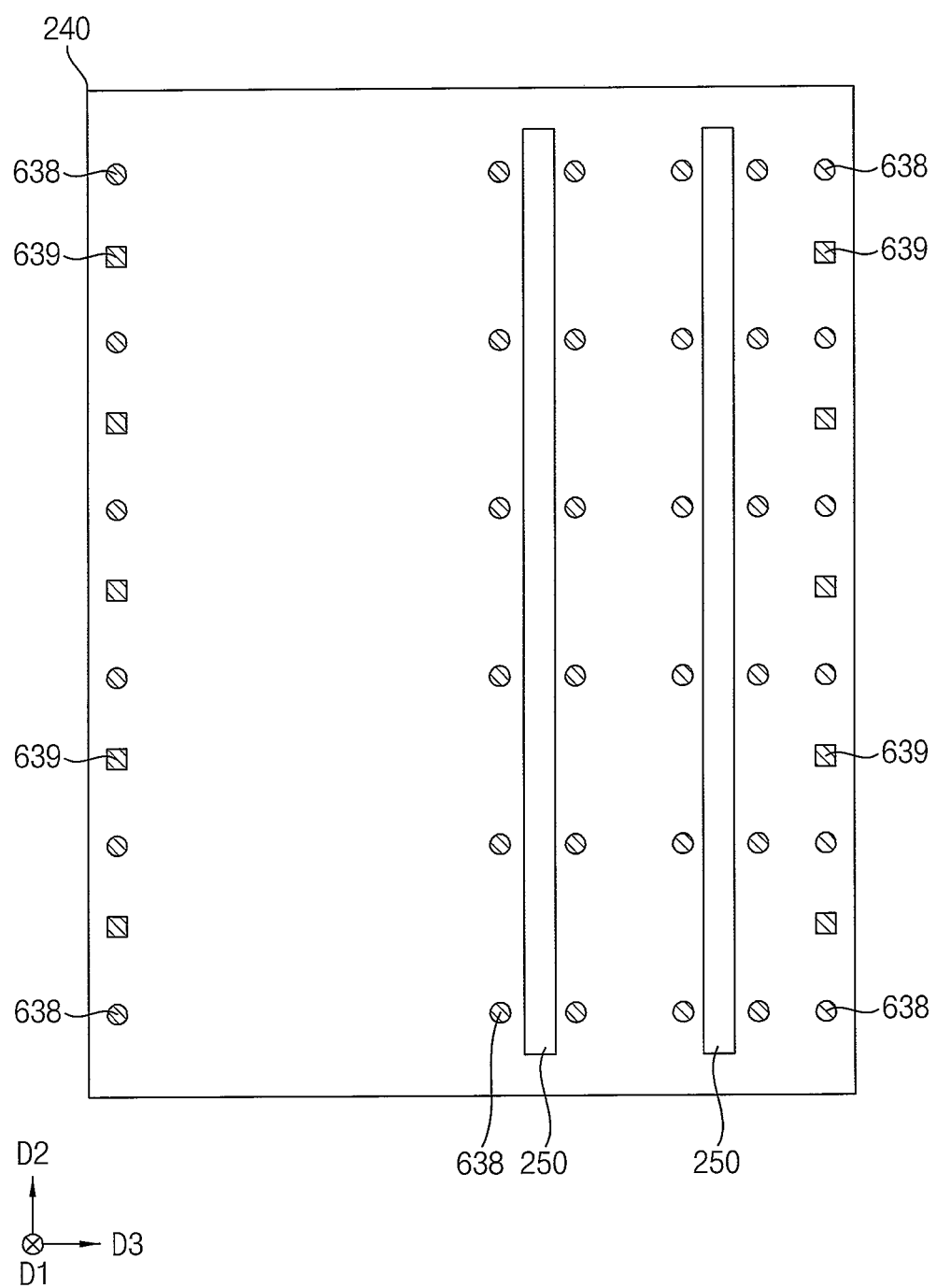
FIGS. 38 to 43 are plan views of fourth and fifth upper contact plugs 638 and 639 in a semiconductor device, which correspond to the cross-sectional view of FIG. 28.

Referring to FIG. 38, in an embodiment, the fourth upper contact plug 638 that contacts the upper surface of the CSP 240 and is electrically connected to the CSL driver is formed on each of opposite edges of the CSP 240 in the third direction D3 and on a portion of the CSP 240 that is adjacent to each of the filling layers 250 in the third direction D3. A plurality of fifth upper contact plugs 639 that contact the upper surface of the CSP 240 but are not electrically connected to the CSL driver are formed between adjacent fourth upper contact plugs 638 on the opposite edges of the CSP 240 in the third direction D3.

Figure 39:
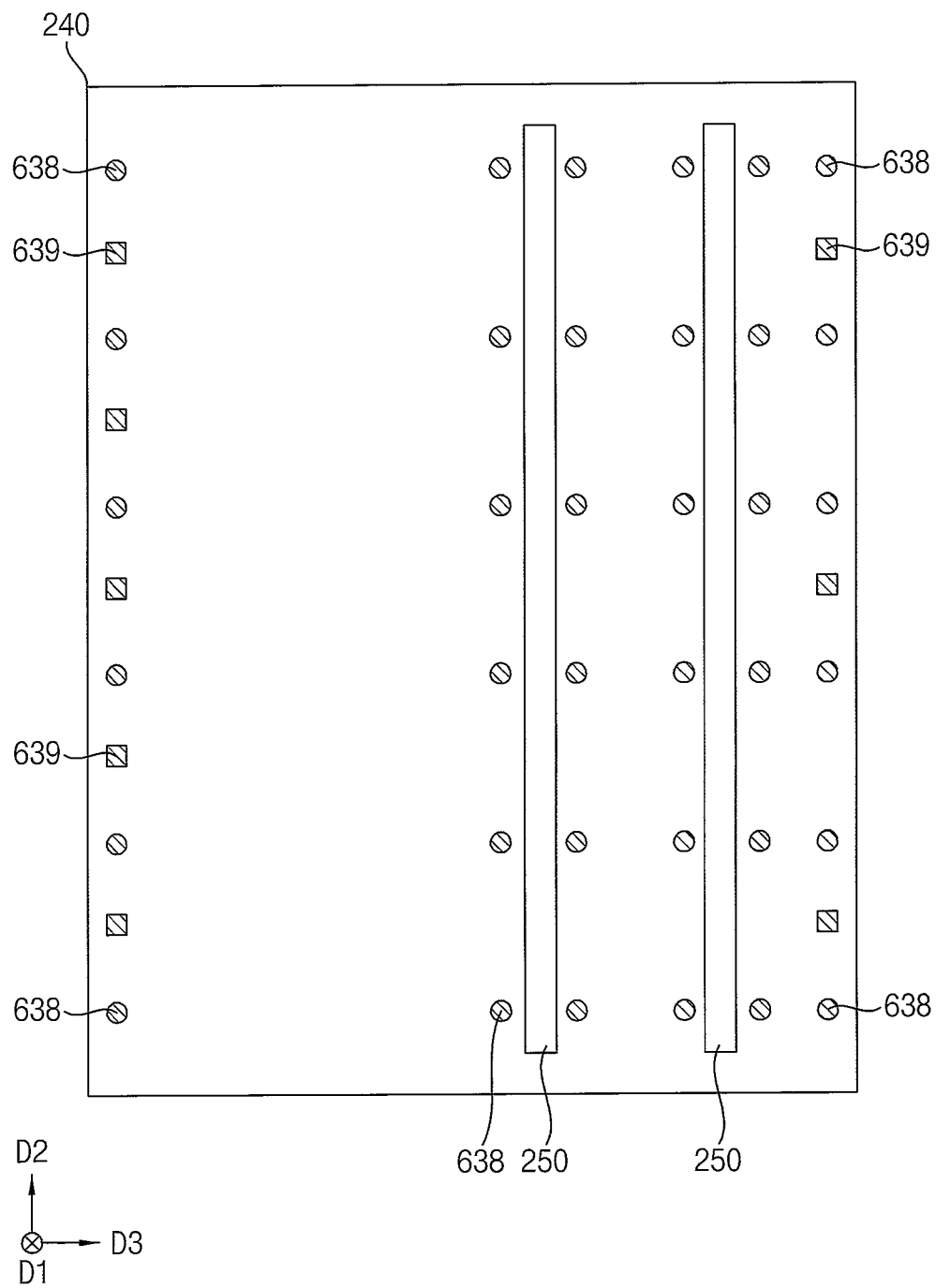

Referring to FIG. 39, in an embodiment, some of the fifth upper contact plugs 639 on an edge of the CSP 240 that extends in the second direction D2 and is closest to a filling layer 250 are omitted. Thus, on this edge, the fifth upper contact plugs 639 are formed between every other adjacent pair of fourth upper contact plugs 638 and are omitted between every other adjacent pair of fourth upper contact plugs 638, so that a period of the fifth upper contact plugs 639 is substantially double that of the fourth upper contact plugs 638.

Figure 40:
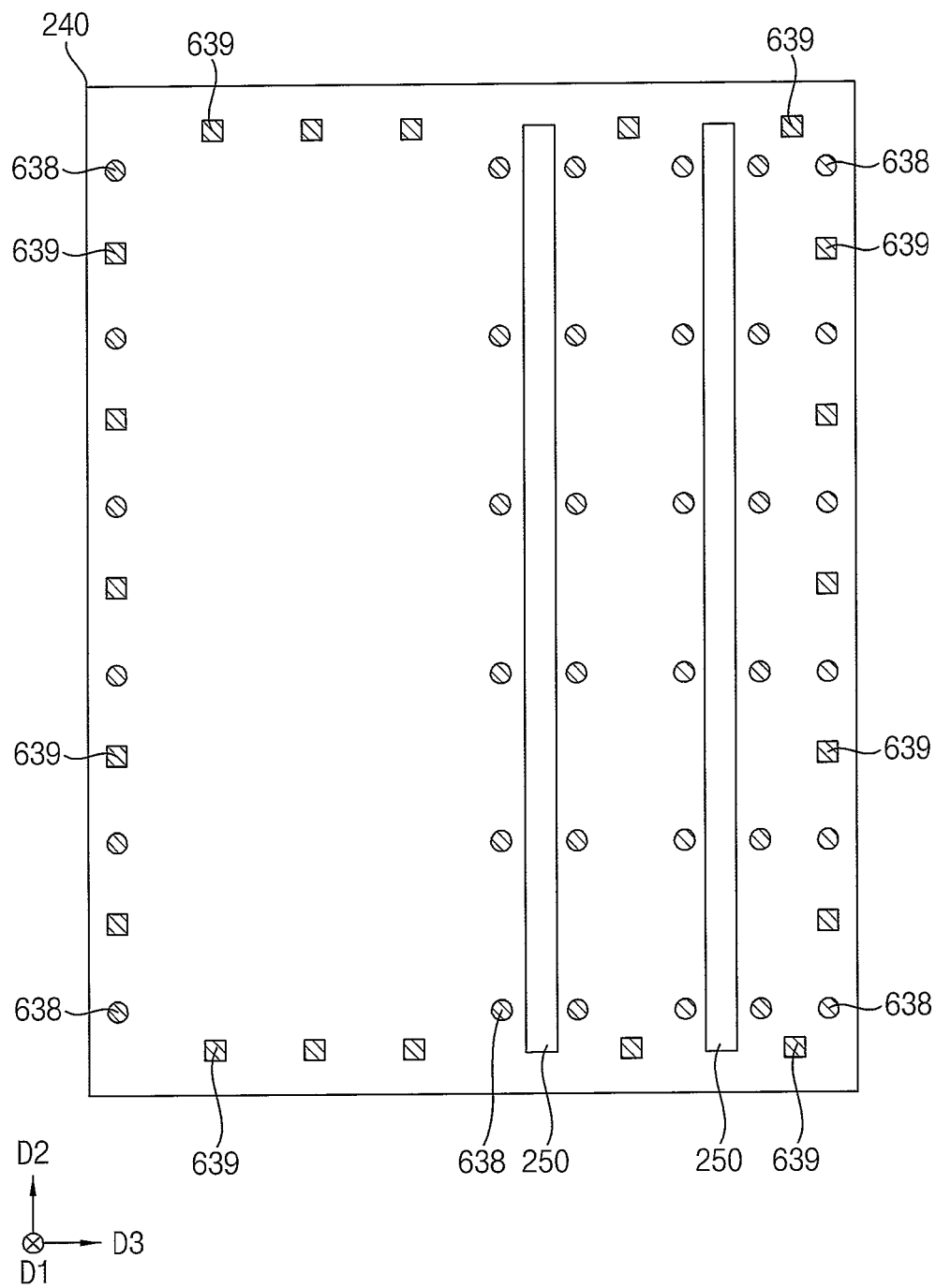

Referring to FIG. 40, in an embodiment, the fifth upper contact plugs 639 are formed on opposite edges of the CSP 240 that extends in the third direction D3 and are spaced apart from each other in the third direction D3.

Figure 41:
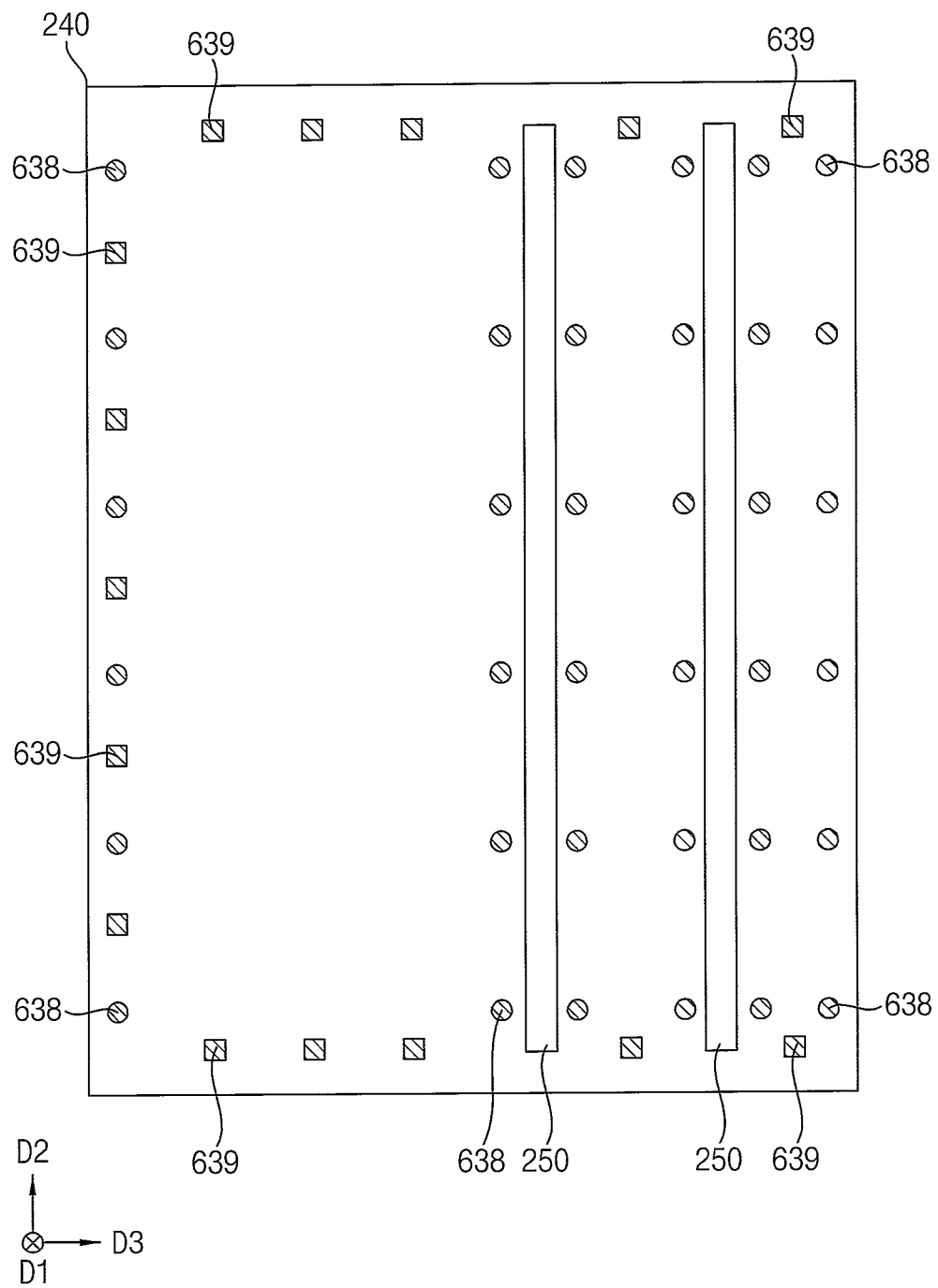

Referring to FIG. 41, in an embodiment, the fifth upper contact plugs 639 illustrated in FIG. 40 are omitted from an edge of the CSP 240 that extends in the second direction D2 and is closest to a filling layer 250.

Figure 42:
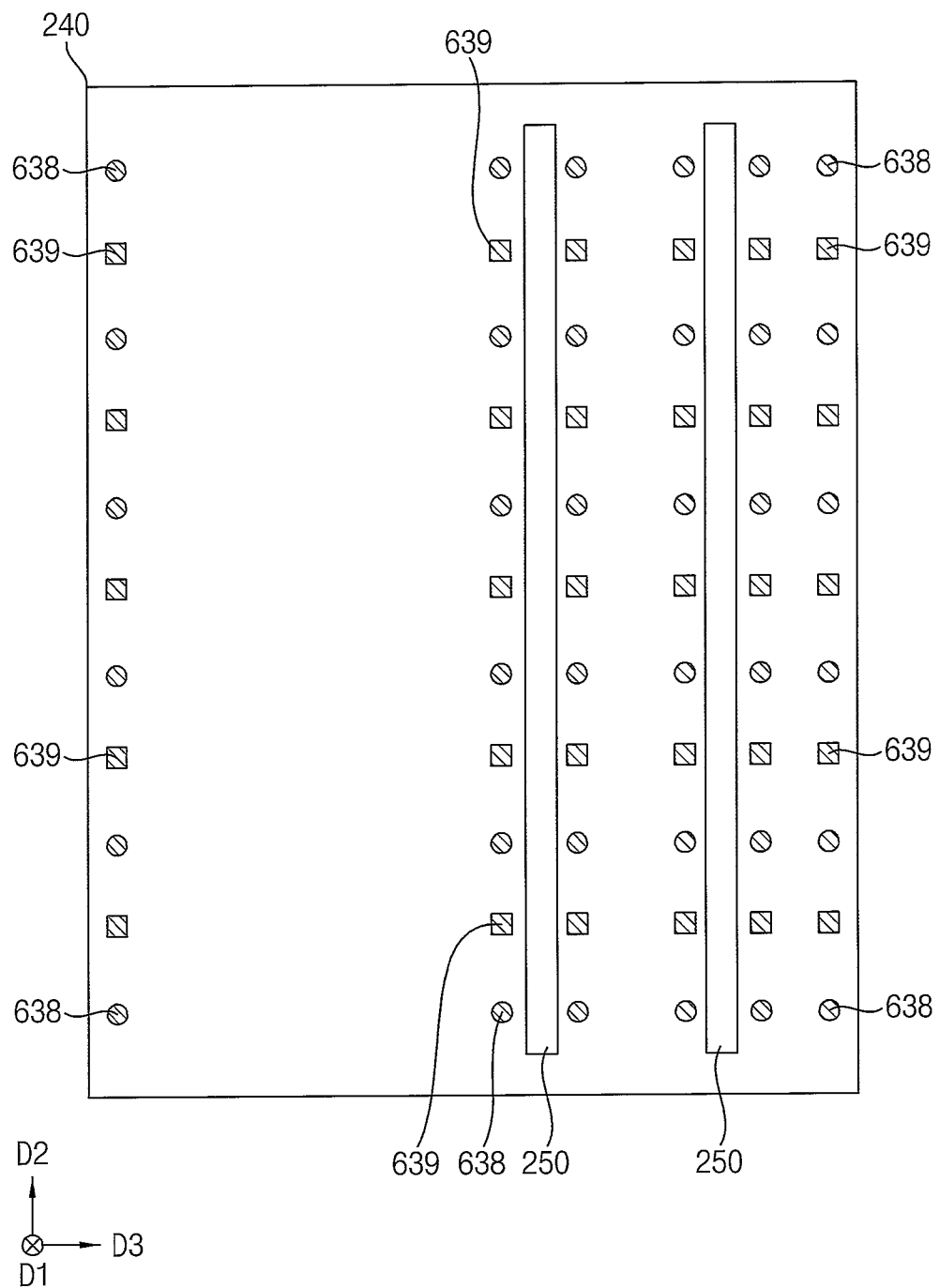

Referring to FIG. 42, in an embodiment, in addition to the fifth upper contact plugs 639 illustrated in FIG. 38, the fifth upper contact plugs 639 are further formed between the fourth contact plugs 638 adjacent to each other in the second direction D2 on opposite sides of the filling layer 250 in the third direction D3.

Figure 43:
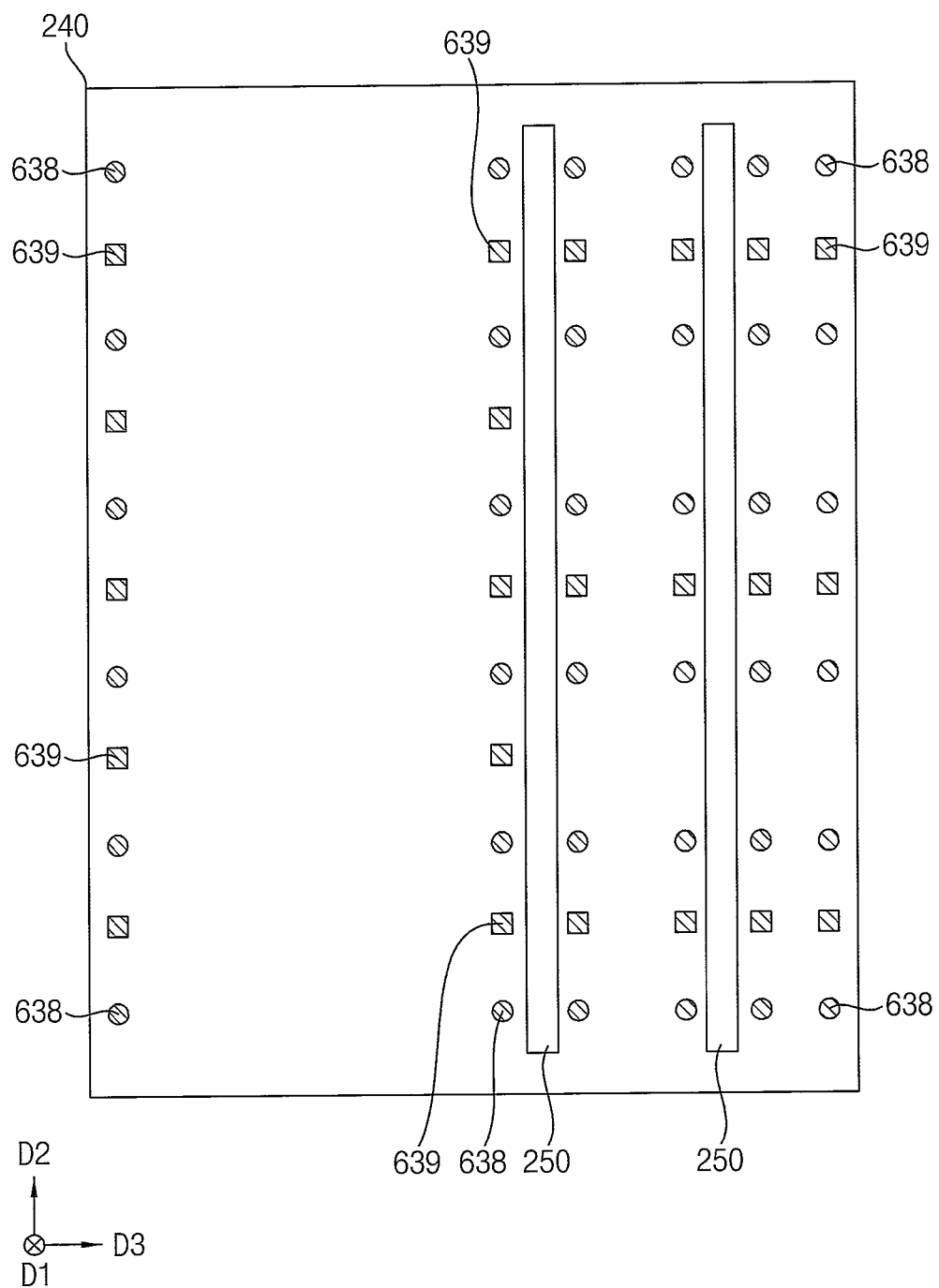

Referring to FIG. 43, in an embodiment, some of the fifth upper contact plugs 639 on one or opposite sides of the filling layer 250 in the third direction D3 illustrated in FIG. 42 are not formed. Thus, on these edges, the fifth upper contact plugs 639 are formed between every other adjacent pair of fourth upper contact plugs 638 and are omitted between every other adjacent pair of fourth upper contact plugs 638, so that a period of the fifth upper contact plugs 639 is substantially double that of the fourth upper contact plugs 638.

As illustrated with reference to FIGS. 38 to 43, the fifth upper contact plugs 639 that contact the upper surface of the CSP 240 but are not electrically connected to the CSL driver may be arranged in various layouts on the CSP 240, and the fifth upper contact plugs 639 are disposed in consideration of positions of the fourth upper contact plugs 638 and/or other upper contact plugs that are electrically connected to the CSP driver, an area of the CSP 240 divided by the filling layer 250, etc.

Figure 33:
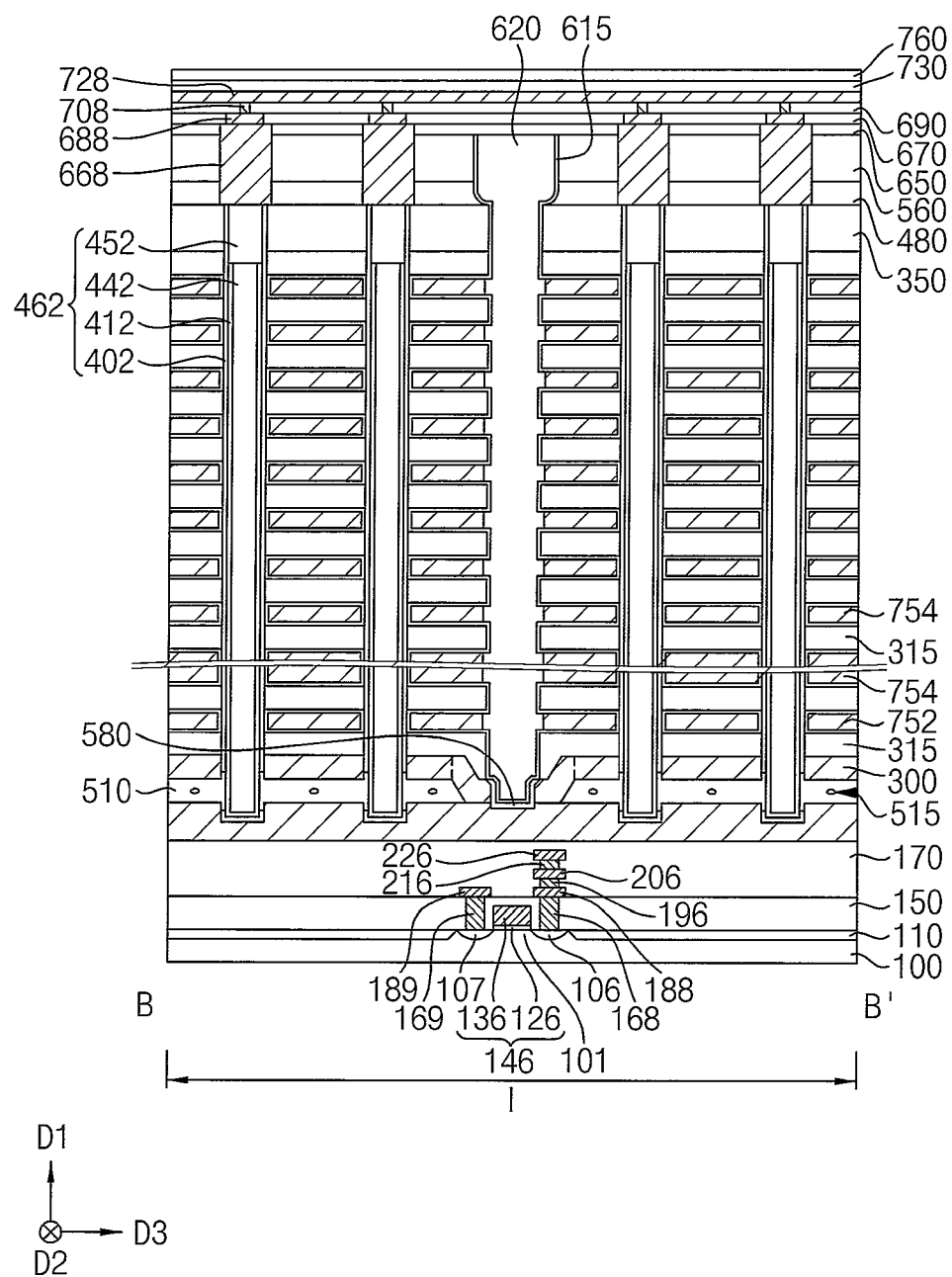
Figure 34:
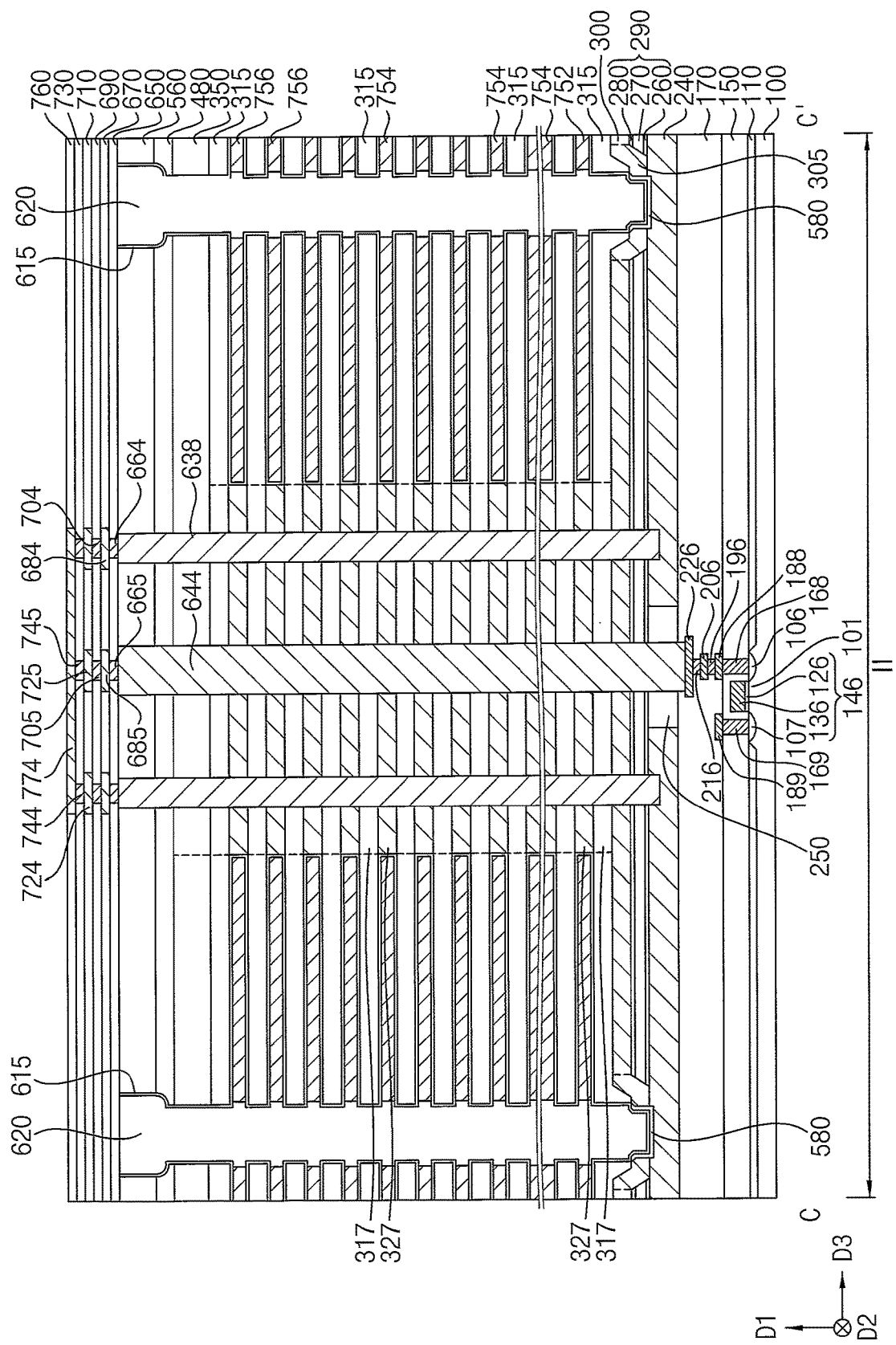
Figure 44:
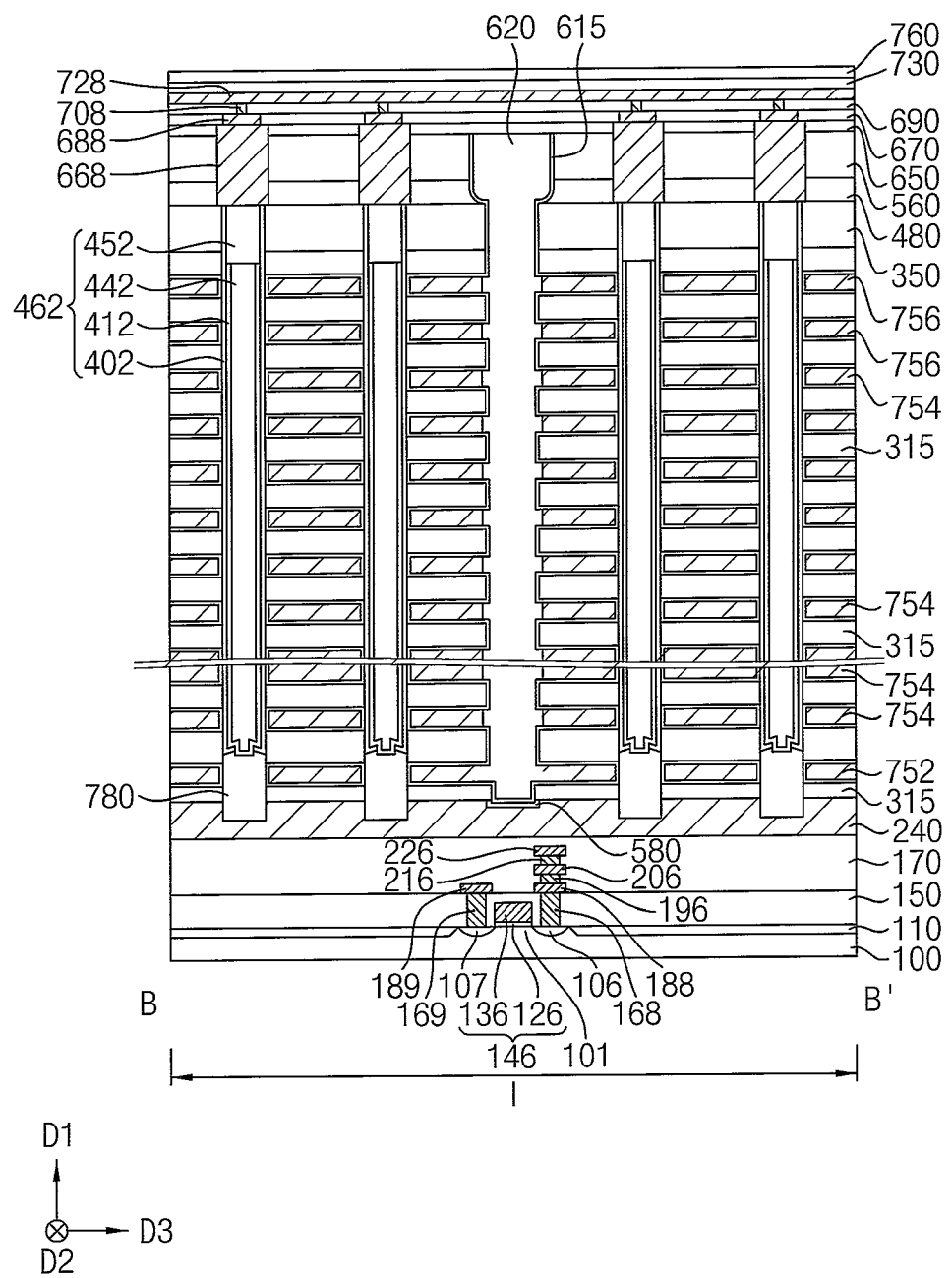
FIG. 44 is a cross-sectional view of a semiconductor device in accordance with exemplary embodiments, which corresponds to the cross-sectional view of FIG. 33.

FIG. 44 is a cross-sectional view of a semiconductor device in accordance with exemplary embodiments, which corresponds to FIG. 33. A semiconductor device of FIG. 44 is substantially the same as or similar to a semiconductor device illustrated in FIGS. 28 and 32 to 35, except for the memory channel structure 462, the channel connection pattern 510, the first support layer 300, the support pattern 305, and the protection layer 580.

Referring to FIG. 44, in an embodiment, the memory channel structure 462 further includes a semiconductor pattern 780 on the substrate 100, and the charge storage structure 402, the channel 412, the filling pattern 442 and the capping pattern 452 are formed on the semiconductor pattern 780.

The semiconductor pattern 780 includes, for example, a single crystalline silicon or polysilicon. In an exemplary embodiment, a level of an upper surface of the semiconductor pattern 780 is located between levels of the lower and upper surfaces of the first insulating pattern 315 disposed between the first and second gate electrodes 752 and 754. The charge storage structure 402 has a cup-like shape of which a central lower surface is open on the upper surface of the semiconductor pattern 780, and contacts an edge of an upper surface of the semiconductor pattern 780. The channel 412 has a cup-like shape, and contacts a central upper surface of the semiconductor pattern 780. Thus, the channel 412 is electrically connected to the CSP 240 through the semiconductor pattern 780.

In exemplary embodiments, hydrogen that moves through the contact plugs, the vias, and the upper wirings connected to the CSP 240 can move into the channel 412 through the semiconductor pattern 780, and thus polysilicon in the channel 412 can be cured and the electrical characteristics of the channel 412 can be improved.

The channel connection pattern 510, the first support layer 300 and the support pattern 305 are not formed between the CSP 240 and the first gate electrode 752, and the protection layer 580 is also not formed. In an exemplary embodiment, the first insulating patterns 315 between the first and second gate electrodes 752 and 754 are thicker than the upper first insulating patterns 315.

Figure 45:
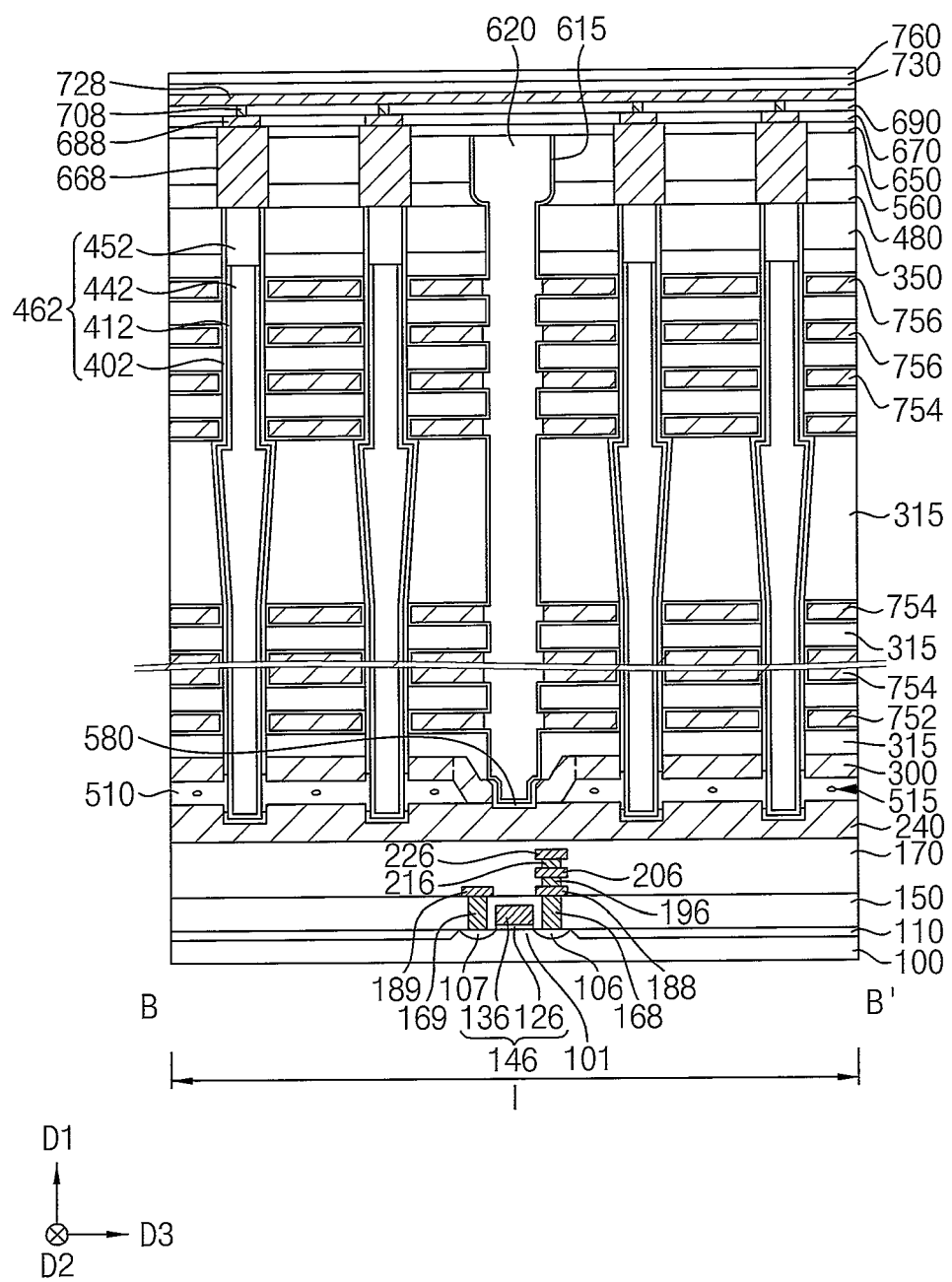
FIG. 45 is a cross-sectional view of a semiconductor device in accordance with exemplary embodiments, which corresponds to the cross-sectional view of FIG. 33.
Figure 46:
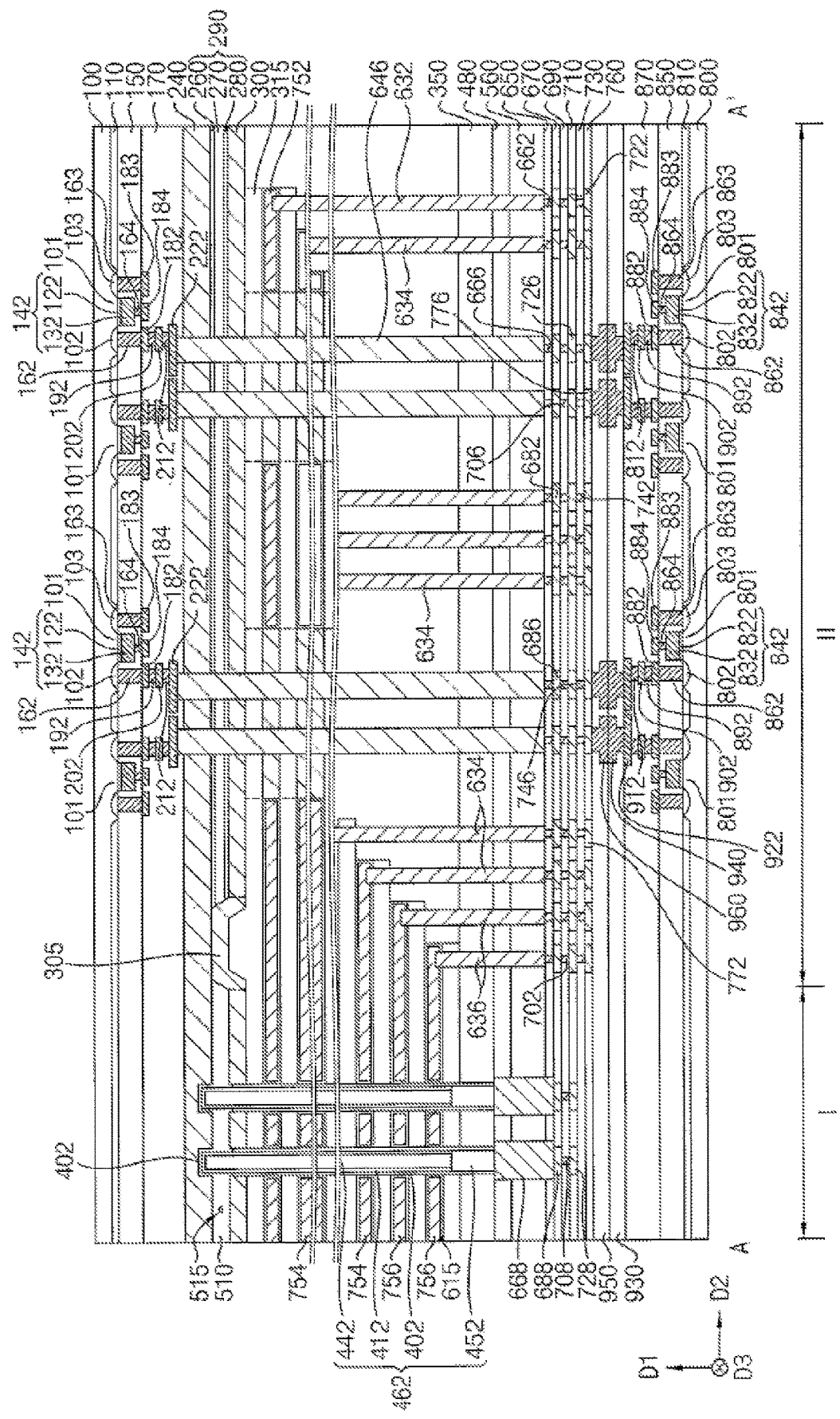
FIGS. 46 to 49 are cross-sectional views of a semiconductor device in accordance with exemplary embodiments, which correspond to the cross-sectional views of FIGS. 32 to 35, respectively.
Figure 47:
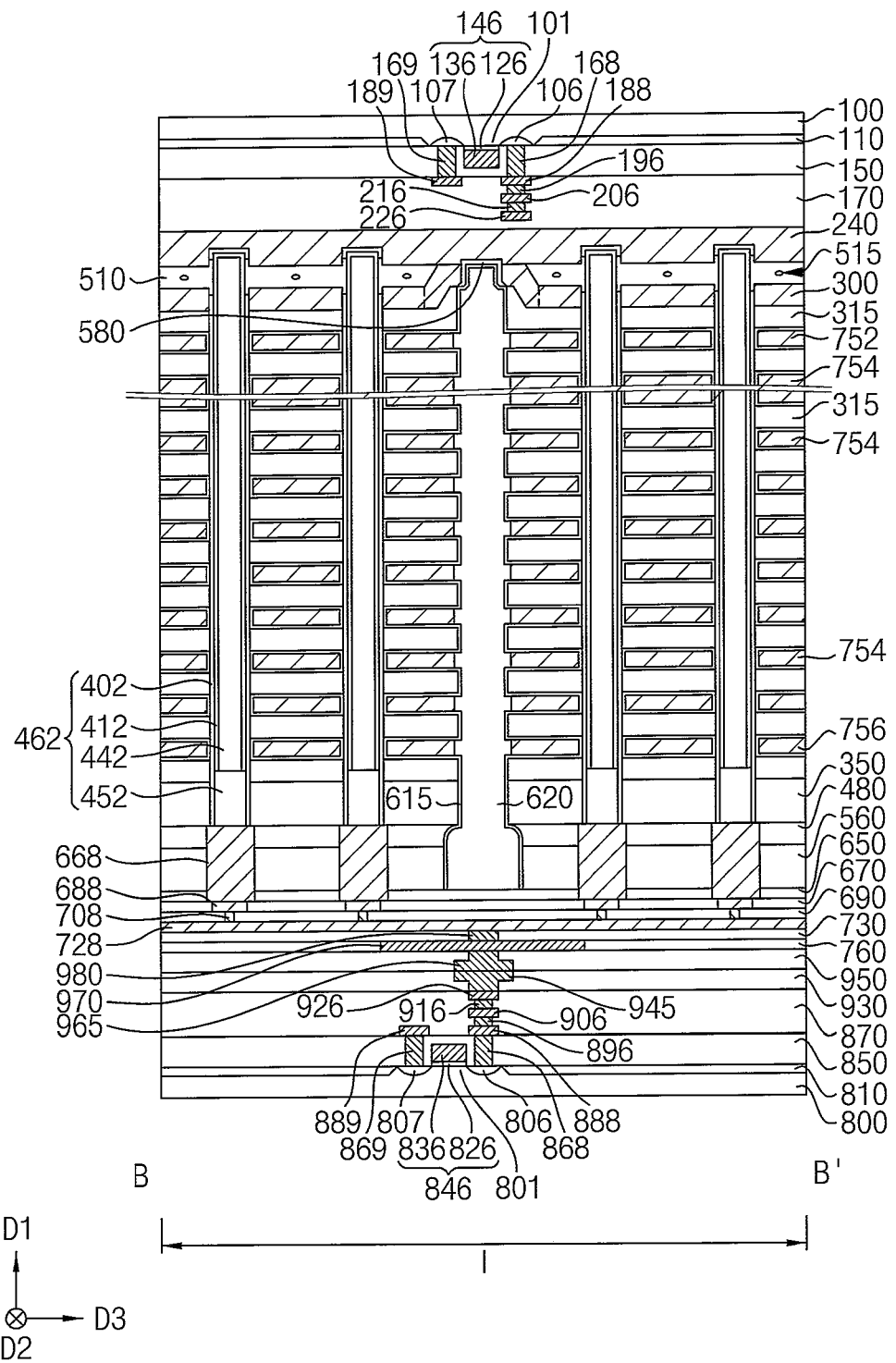
Figure 48:
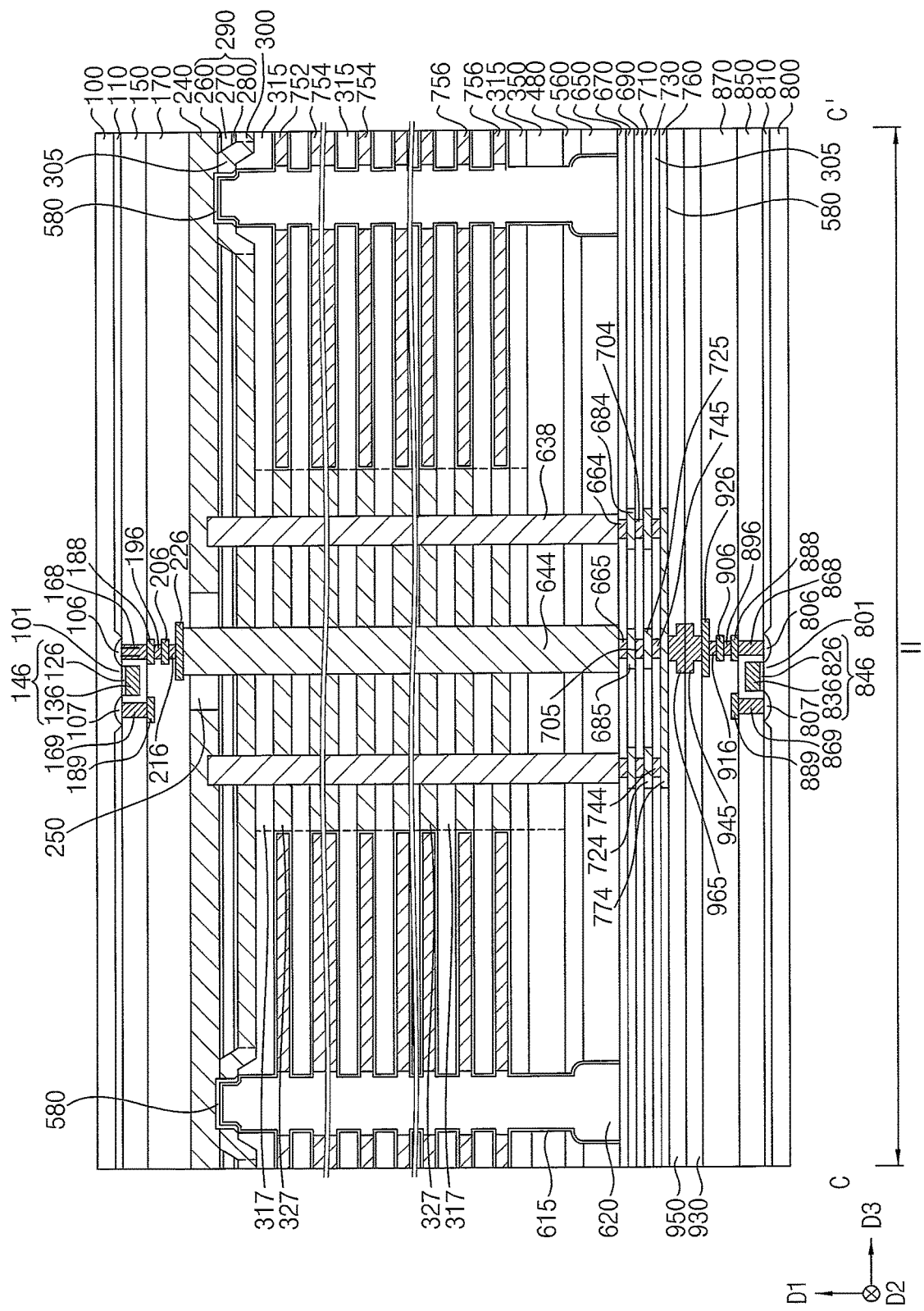
Figure 49:
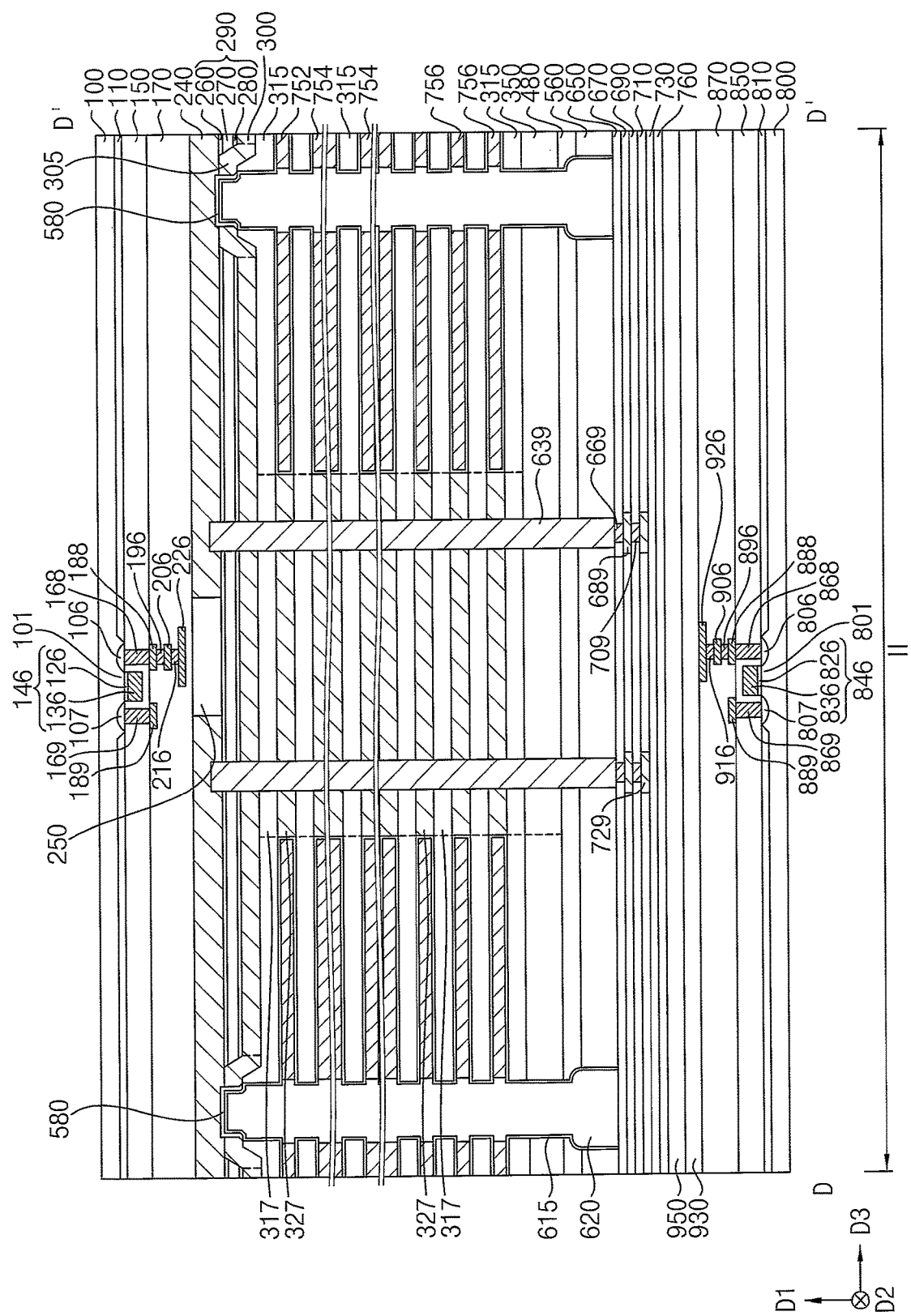

FIG. 45 is a cross-sectional view of a semiconductor device in accordance with exemplary embodiments, which corresponds to FIG. 33. A semiconductor device of FIG. 44 is substantially the same as or similar to that of FIGS. 28 and 32 to 35, except for the shape of the memory channel structure 462.

Referring to FIG. 45, in an embodiment, the memory channel structure 462 in a semiconductor device includes sequentially stacked lower and upper portions, and each of the lower and upper portions has a width that gradually decreases from a top toward a bottom thereof. In exemplary embodiments, an upper surface of the lower portion of the memory channel structure 462 is wider than a lower surface of the upper portion of the memory channel structure 462.

FIG. 45 shows that the memory channel structure 462 includes two portions, such as the lower and upper portions, but embodiments of the inventive concept are not necessarily limited thereto, and in other embodiment, the memory channel structure 462 includes three or more portions that are sequentially stacked. Each of the portions of the memory channel structure 462 has a width that gradually decreases from a top toward a bottom thereof, and an upper surface of a lower portion is wider than a lower surface of an upper portion that is directly over the lower portion.

FIGS. 46 to 49 are cross-sectional views of a semiconductor device in accordance with exemplary embodiments, which correspond to FIGS. 32 to 35, respectively. In an semiconductor device illustrated in FIGS. 46 to 49, a central portion in a vertical direction is omitted when compared to a semiconductor device illustrated in FIGS. 32 to 35.

A semiconductor device of FIGS. 46-49 is substantially the same as or similar to a semiconductor device illustrated in FIGS. 28 and 32 to 35, except that the structures in a semiconductor device of FIGS. 46-49 are upside down, and a semiconductor device of FIGS. 46-49 further includes a lower substrate, a lower circuit pattern and bonding patterns.

A semiconductor device of FIGS. 46-49 is formed by forming a circuit pattern, a bonding pattern and an insulating interlayer that covers the circuit pattern and the bonding pattern on a lower substrate 800, forming a bonding pattern and an insulating interlayer that covers the bonding pattern on the semiconductor device shown in FIGS. 32 to 35, overturning the semiconductor device of FIGS. 32 to 35, and bonding the substrate 100 and the lower substrate 800 so that the bonding patterns of the substrate 100 and the lower substrate 800 contact each other.

Hereinafter, the following description is based on a state in which a top and bottom of the structures on the substrate 100 are inverted. For example, the lower circuit pattern on the substrate 100 may be referred to as an upper circuit pattern under the substrate 100.

Regions of the lower substrate 800 that overlap the first and second regions I and II, respectively, of the substrate 100 in a substantially vertical direction may be defined as first and second regions I and II, respectively.

In exemplary embodiments, a lower circuit pattern that includes a transistor, a lower contact plug, a lower wiring, and a lower via is formed on the lower substrate 800. The substrate 800 includes a field region on which an isolation pattern 810 is formed, and an active region 801 on which no isolation pattern 810 is formed.

For example, third and fourth transistors are formed on the second and first regions II and I, respectively, of the lower substrate 800. The third transistor includes a third lower gate structure 842 on the lower substrate 800 and fifth and sixth impurity regions 802 and 803 that serve as source/drain regions, at respective upper portions of the active region 801 adjacent to the third lower gate structure 842. The fourth transistor includes a fourth lower gate electrode 846 on the lower substrate 800 and seventh and eighth impurity regions 806 and 807 that serve as source/drain regions, at respective upper portions of the active region 801 adjacent to the fourth lower gate electrode 846.

The third lower gate structure 842 includes a third lower gate insulation pattern 822 and a third lower gate electrode 832 that are sequentially stacked on the lower substrate 800, and the fourth lower gate electrode 846 includes a fourth lower gate insulation pattern 826 and a fourth lower gate electrode 836 that are sequentially stacked on the lower substrate 800.

A twelfth insulating interlayer 850 is formed on the lower substrate 800 that covers the third and fourth transistors. Seventh, eighth, tenth, and eleventh lower contact plugs 862, 863, 868 and 869 extend through the twelfth insulating interlayer 850 and contact the fifth to eighth impurity regions 802, 803, 806 and 807, respectively, and a ninth lower contact plug 864 extends through the twelfth insulating interlayer 850 and contacts the third lower gate electrode 832. A twelfth lower contact plug is further formed that extends through the twelfth insulating interlayer 850 and contacts the fourth lower gate electrode 836.

Tenth to fourteenth lower wirings 882, 883, 884, 888 and 889 are formed on the twelfth insulating interlayer 850 and contact upper surfaces of seventh to eleventh lower contact plugs 862, 863, 864, 868 and 869, respectively. A fifth lower via 892, a fifteenth lower wiring 902, a seventh lower via 912 and a seventeenth lower wiring 922 are sequentially stacked on the tenth lower wiring 882, and a sixth lower via 896, a sixteenth lower wiring 906, an eighth lower via 916 and an eighteenth lower wiring 926 are sequentially stacked on the thirteenth lower wiring 888.

A thirteenth insulating interlayer 870 is formed on the twelfth insulating interlayer 850 and covers the tenth to eighteenth lower wirings 882, 883, 884, 888, 889, 902, 906, 922 and 926, and the fifth to eighth lower vias 892, 896, 912 and 916.

Each of the third and fourth transistors is a part of the lower circuit pattern, such as a page buffer, a decoder, or a common source line driver (CSL driver) circuit, etc.

Fourteenth and fifteenth insulating interlayers 930 and 950 are sequentially stacked on the seventeenth and eighteenth lower wirings 922 and 926 and the thirteenth insulating interlayer 870.

A first bonding pattern 940 that extends through the fourteenth insulating interlayer 930 and contacts the seventeenth lower wiring 922 is formed in the fourteenth insulating interlayer 930, and a third bonding pattern 960 that extends through the fifteenth insulating interlayer 950 and contacts the first bonding pattern 940 is formed in the fifteenth insulating interlayer 950. A second bonding pattern 945 that extends through the fourteenth insulating interlayer 930 and contacts the eighteenth lower wiring 926 is formed in the fourteenth insulating interlayer 930, and a fourth bonding pattern 965 that extends through the fifteenth insulating interlayer 950 and contacts the second bonding pattern 945 is formed in the fifteenth insulating interlayer 950. The first to fourth bonding patterns 940, 945, 960 and 965 include, for example, a metal such as copper or aluminum, and are formed by, for example, a dual damascene process.

An eighteenth upper wiring 970 that extends through the eleventh insulating interlayer 760 and contacts the fourth bonding pattern 965 is formed in the eleventh insulating interlayer 760, and a twentieth upper via 980 that extends through the tenth insulating interlayer 730 and contacts the eighteenth upper wiring 970 is formed.

The eleventh wiring 728 that serves as the bit line is electrically connected to the eighteenth lower wiring 926 of the lower circuit pattern through the twentieth upper via 980, the eighteenth upper wiring 970, the fourth bonding pattern 965 and the second bonding pattern 945.

The second through via 644 and the fourth upper contact plug 638 that are electrically connected to a transistor in the CSL driver under the substrate 100 are electrically connected to the eighteenth lower wiring 926 of the lower circuit pattern through the fourth bonding pattern 965 and the second bonding pattern 945, and a transistor that is electrically connected to the eighteenth lower wiring 926 on the lower substrate 800 also serves as a CSL driver.

Alternatively, in an embodiment, the tenth upper wiring 729 that is electrically connected to the fifth upper contact plug 639 is not electrically connected to the lower circuit pattern, such as the CSL driver, on the lower substrate 800.

In addition, at least some of the fourteenth to sixteenth upper wirings 772, 774 and 776 are electrically connected to the lower circuit pattern through the first and third bonding patterns 940 and 960 or the second and fourth bonding patterns 945 and 965.

Figure 50:
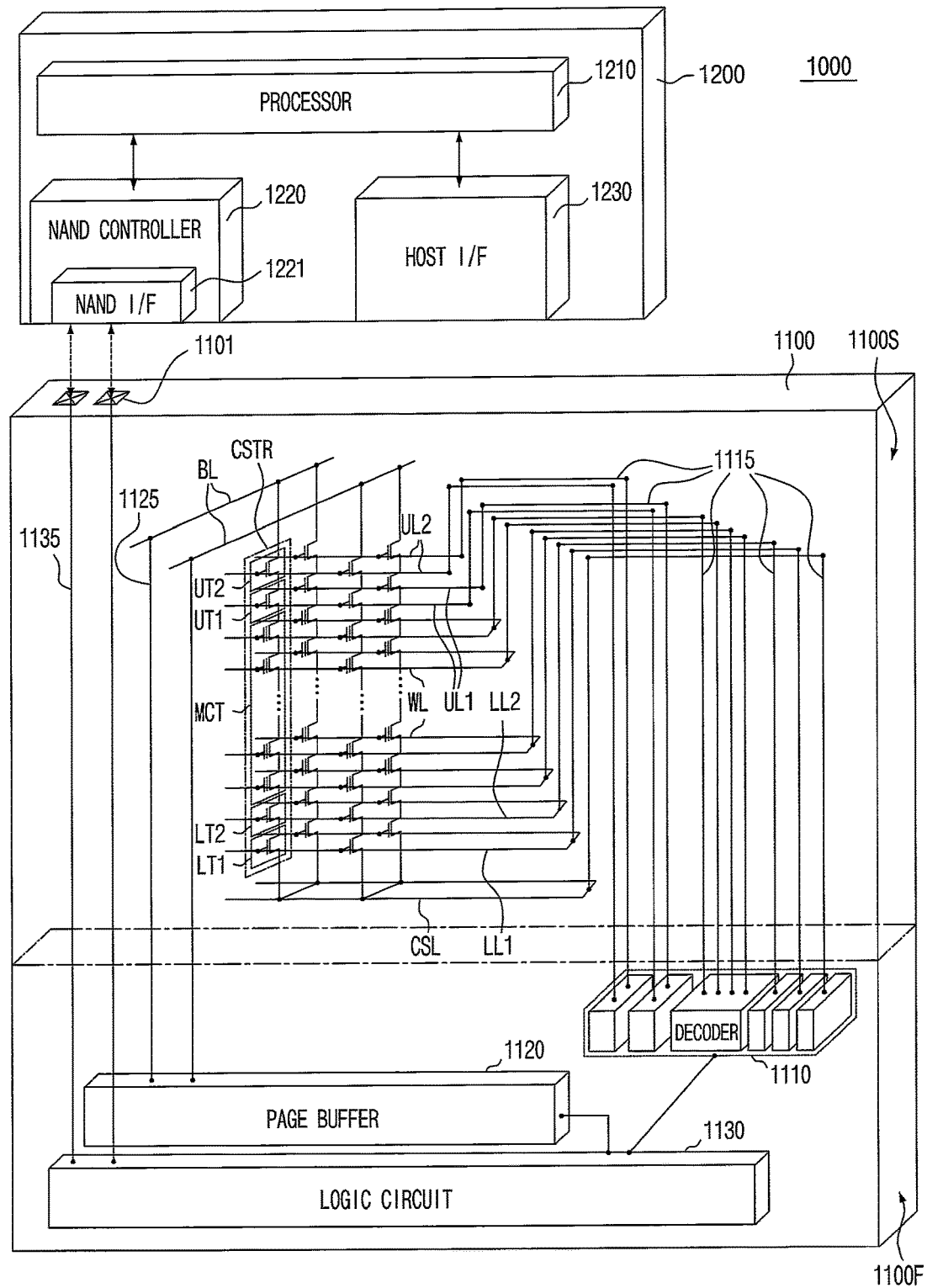
FIG. 50 is a schematic diagram of an electronic system that includes a semiconductor device in accordance with exemplary embodiments.

FIG. 50 is a schematic diagram of an electronic system that includes a semiconductor device in accordance with exemplary embodiments.

Referring to FIG. 50, in an embodiment, an electronic system 1000 includes a semiconductor device 1100 and a controller 1200 electrically connected to the semiconductor device 1100. The electronic system 1000 may be a storage device that includes one or a plurality of semiconductor devices 1100, or an electronic device that includes a storage device. For example, the electronic system 1000 is one of a solid state drive (SSD) device, a universal serial bus (USB), a computing system, a medical device, or a communication device that includes one or a plurality of semiconductor devices 1100.

In an embodiment, the semiconductor device 1100 is a non-volatile memory device, such as a NAND flash memory device that is illustrated with reference to FIG. 28 and FIGS. 32 to 35. The semiconductor device 1100 includes a first structure 1100F and a second structure 1100S on the first structure 1100F. The first structure 1100F is a peripheral circuit structure that includes a decoder circuit 1110, a page buffer 1120, and a logic circuit 1130. The second structure 1100S is a memory cell structure that includes a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR includes lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 can vary, depending on embodiments.

In exemplary embodiments, the upper transistors UT1 and UT2 include string selection transistors, and the lower transistors LT1 and LT2 include ground selection transistors. The lower gate lines LL1 and LL2 are gate electrodes of the lower transistors LT1 and LT2, respectively. The word lines WL are gate electrodes of the memory cell transistors MCT, respectively, and the upper gate lines UL1 and UL2 are gate electrodes of the upper transistors UT1 and UT2, respectively.

In exemplary embodiments, the lower transistors LT1 and LT2 include a lower erase control transistor LT1 and a ground selection transistor LT2 that are serially connected with each. The upper transistors UT1 and UT2 include a string selection transistor UT1 and an upper erase control transistor UT2. At least one of the lower erase control transistor LT1 or the upper erase control transistor UT2 is used in an erase operation that erases data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 are electrically connected to the decoder circuit 1110 through first connection wirings 1115 that extend to the second structure 1110S from the first structure 1100F. The bit lines BL are electrically connected to the page buffer 1120 through second connection wirings 1125 that extend to the second structure 1100S from the first structure 1100F.

In the first structure 1100F, the decoder circuit 1110 and the page buffer 1120 perform control operations for at least one selected memory cell transistor of the plurality of memory cell transistors MCT. The decoder circuit 1110 and the page buffer 1120 are controlled by the logic circuit 1130. The semiconductor device 1100 communicates with the controller 1200 through an input/output pad 1101 that is electrically connected to the logic circuit 1130. The input/output pad 1101 is electrically connected to the logic circuit 1130 through an input/output connection wiring 1135 that extending to the second structure 1100S from the first structure 1100F.

The controller 1200 includes a processor 1210, a NAND controller 1220, and a host interface 1230. The electronic system 1000 includes a plurality of semiconductor devices 1100, and in this case, the controller 1200 controls the plurality of semiconductor devices 1100.

The processor 1210 controls operations of the electronic system 1000 that includes the controller 1200. The processor 1210 is operated by firmware, and controls the NAND controller 1220 to access the semiconductor device 1100. The NAND controller 1220 includes a NAND interface 1221 that communicates with the semiconductor device 1100. Through the NAND interface 1221, control commands that control the semiconductor device 1100, data to be written to the memory cell transistors MCT of the semiconductor device 1100, data to be read from the memory cell transistors MCT of the semiconductor device 1100, etc., may be transmitted. The host interface 1230 provides communication between the electronic system 1000 and an outside host. When a control command is received from the outside host through the host interface 1230, the processor 1210 controls the semiconductor device 1100 in response to the control command.

Figure 51:
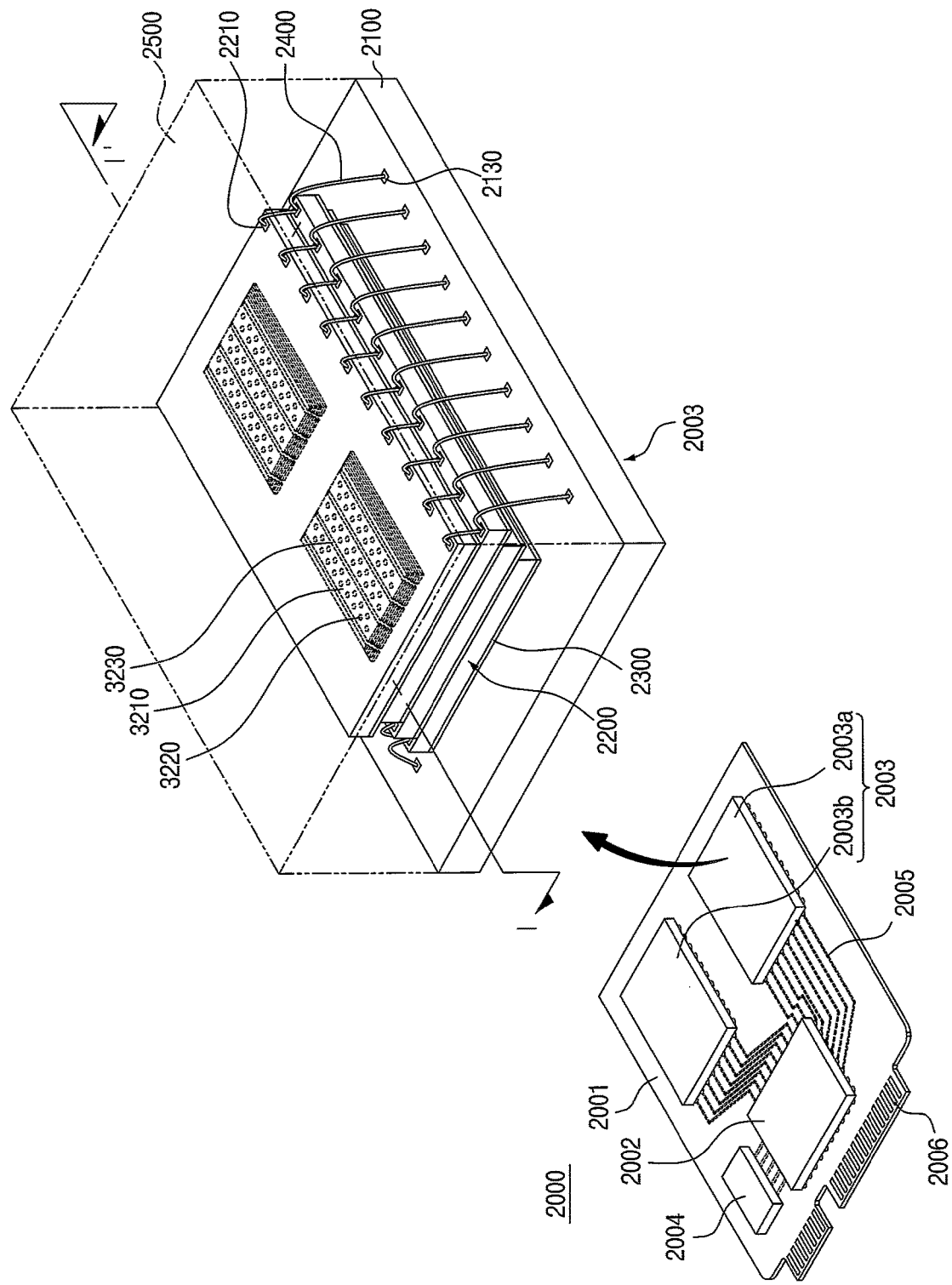
FIG. 51 is a schematic perspective view of an electronic system that includes a semiconductor device in accordance with exemplary embodiments.

FIG. 51 is a schematic perspective view of an electronic system that includes a semiconductor device in accordance with exemplary embodiments.

Referring to FIG. 51, in an embodiment, an electronic system 2000 includes a main substrate 2001, a controller 2002 mounted on the main substrate 2001, at least one semiconductor package 2003, and a dynamic random access memory (DRAM) device 2004. The semiconductor package 2003 and the DRAM device 2004 are connected to the controller 2002 by wiring patterns 2005 on the main substrate 2001.

The main substrate 2001 includes a connector 2006 that includes a plurality of pins that can be connected to an outside host. The number and layout of the plurality pins in the connector 2006 can change depending on the communication interface between the electronic system 2000 and the outside host. In exemplary embodiments, the electronic system 2000 communicates with the outside host according to one of a USB, a peripheral component interconnect express (PCI-Express), a serial advanced technology attachment (SATA), an M-Phy for universal flash storage (UFS), etc. In exemplary embodiments, the electronic system 2000 is operated by power source provided from the outside host through the connector 2006. The electronic system 2000 further includes a power management integrated circuit (PMIC) that distributes the power source received from the outside host to the controller 2002 and the semiconductor package 2003.

The controller 2002 writes data to the semiconductor package 2003 or reads data from the semiconductor package 2003, and enhances an operation speed of the electronic system 2000.

The DRAM device 2004 is a buffer memory that reduces the speed difference for storing data between the semiconductor package 2003 and the outside host. The DRAM device 2004 of the electronic system 2000 may serve as a cache memory, and may temporarily store data during control operations of the semiconductor package 2003. If the electronic system 2000 includes the DRAM device 2004, the controller 2002 further includes a DRAM controller that controls the DRAM device 2004, in addition to a NAND controller that controls the semiconductor package 2003.

The semiconductor package 2003 includes first and second semiconductor packages 2003a and 2003b that are spaced apart from each other. The first and second semiconductor packages 2003a and 2003b are semiconductor packages each of which includes a plurality of semiconductor chips 2200. Each of the first and second semiconductor packages 2003a and 2003b includes a package substrate 2100, the semiconductor chips 2200, bonding layers 2300 disposed under the semiconductor chips 2200, a connection structure 2400 that electrically connects the semiconductor chips 2200 and the package substrate 2100, and a mold layer 2500 that covers the semiconductor chips 2200 and the connection structure 2400 on the package substrate 2100.

The package substrate 2100 is a printed circuit board (PCB) that includes package upper pads 2130. Each semiconductor chip 2200 includes an input/output pad 2210. The input/output pad 2210 corresponds to the input/output pad 1101 of FIG. 50. Each semiconductor chip 2200 includes gate electrode structures 3210, memory channel structures 3220 that extend through the gate electrode structures 3210, and division structures 3230 that divide the gate electrode structures 3210. Each semiconductor chip 2200 includes a semiconductor device illustrated with reference to FIG. 28 and FIGS. 32 to 35.

In exemplary embodiments, the connection structure 2400 is a bonding wire that electrically connects the input/output pad 2210 and the package upper pads 2130. Thus, in each of the first and second semiconductor packages 2003a and 2003b, the semiconductor chips 2200 are electrically connected with each other by a bonding wire method, and are electrically connected to the package upper pads 2130 of the package substrate 2100. Alternatively, in some embodiments, in each of the first and second semiconductor packages 2003a and 2003b, the semiconductor chips 2200 are electrically connected with each other by a connection structure that includes a through silicon via (TSV), instead of the connection structure 2400 of the bonding wire method.

In exemplary embodiments, the controller 2002 and the semiconductor chips 2200 are included in one package. In exemplary embodiments, the controller 2002 and the semiconductor chips 2200 are mounted on an interposer substrate that differs from the main substrate 2001, and the controller 2002 and the semiconductor chips 2200 are connected with each other by a wiring on the interposer substrate.

Figure 52:
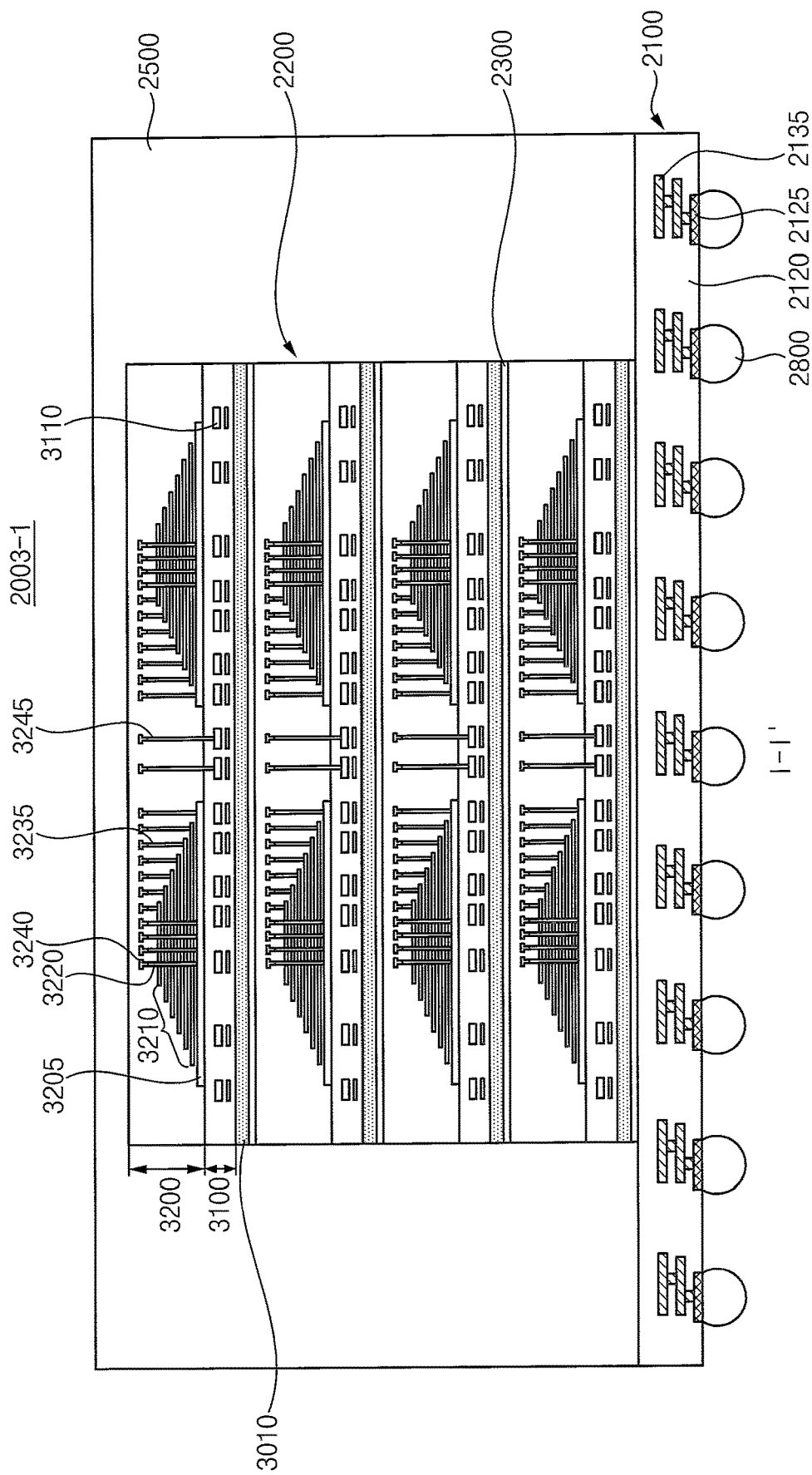
FIGS. 52 to 53 are schematic cross-sectional views of an electronic system that includes a semiconductor device in accordance with exemplary embodiments.
Figure 53:
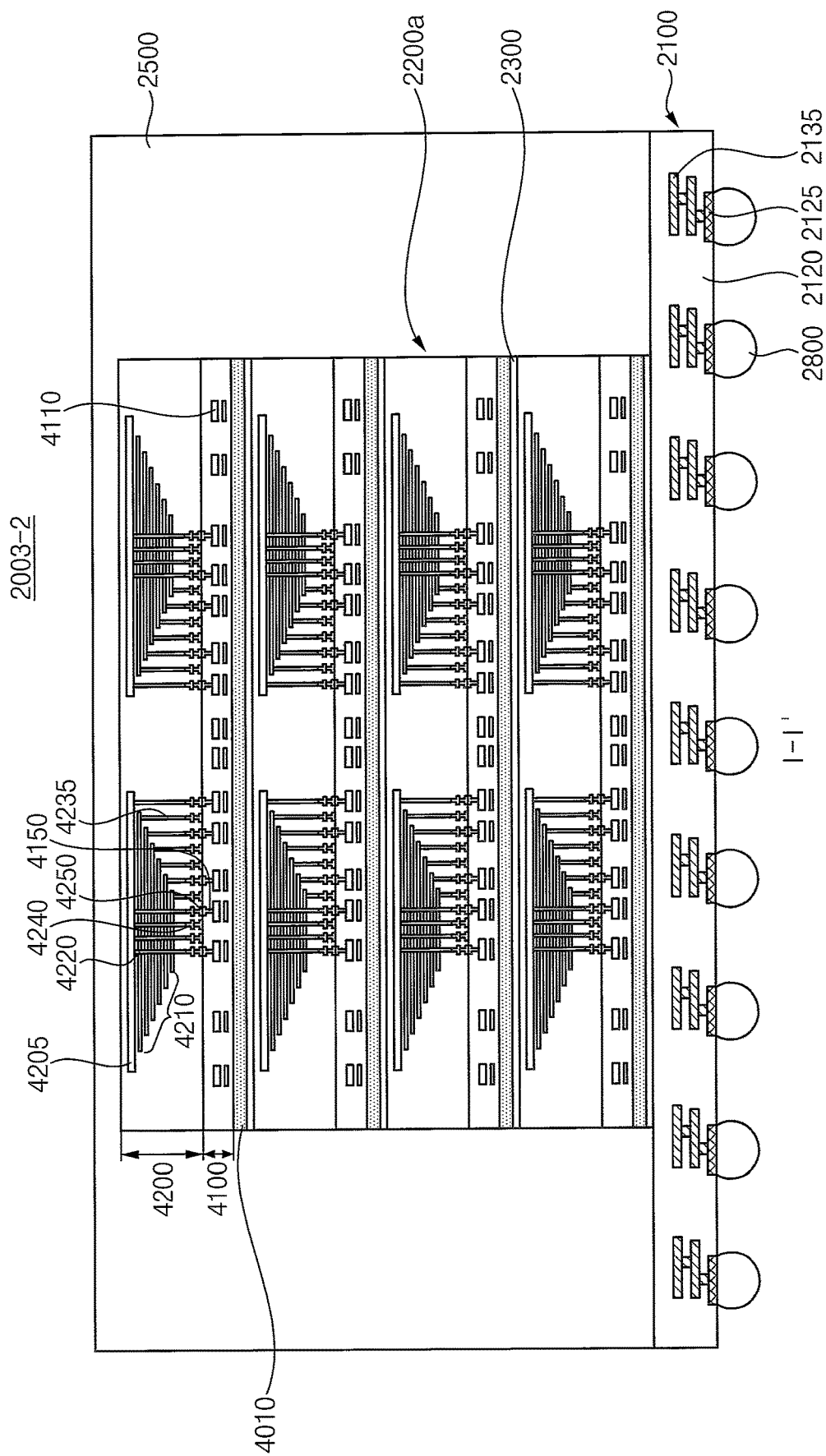

FIGS. 52 and 53 are schematic cross-sectional views of a semiconductor package that includes a semiconductor device in accordance with exemplary embodiments. FIGS. 52 and 53 illustrate exemplary embodiments of the semiconductor package 2003 shown in FIG. 51, and are cross-sections taken along a line I-I' of the semiconductor package 2003 in FIG. 51.

Referring to FIG. 52, in an embodiment, in the semiconductor package 2003-1, the package substrate 2100 is a PCB. The package substrate 2100 includes a substrate body part 2120, upper pads 2130 (refer to FIG. 51) on an upper surface of the substrate body part 2120, lower pads 2125 on a lower surface of the substrate body part 2120 or exposed through the lower surface of the substrate body part 2120, and inner wirings 2135 that electrically connect the upper pads 2130 and the lower pads 2125 inside of the substrate body part 2120. The upper pads 2130 are electrically connected to the connection structures 2400. The lower pads 2125 are connected to wiring patterns 2005 (refer to FIG. 51) of the main substrate 2010 in the electronic system 2000 through conductive connection parts 2800.

Each semiconductor chip 2200 includes a semiconductor substrate 3010, and a first structure 3100 and a second structure 3200 that are sequentially stacked on the semiconductor substrate 3010. The first structure 3100 includes a peripheral circuit region in which peripheral circuit wirings 3110 are formed. The second structure 3200 includes a common source line 3205, a gate electrode structure 3210 on the common source line 3205, memory channel structures 3220 and division structures 3230 (refer to FIG. 51) that extend through the gate electrode structure 3210, bit lines 3240 that are electrically connected to the memory channel structures 3220, and gate connection wirings 3235 that are electrically connected to the word lines WL of the gate electrode structure 3210 (refer to FIG. 51).

Each semiconductor chip 2200 includes a through wiring 3245 that is electrically connected to the peripheral circuit wirings 3110 of the first structure 3100 and extends in the second structure 3200. The through wiring 3245 are disposed outside of the gate electrode structure 3210, and the through wirings 3245 extend through the gate electrode structure 3210. Each semiconductor chip 2200 further includes the input/output pad 2210 (refer to FIG. 51) that is electrically connected to the peripheral circuit wirings 3110 of the first structure 3100.

Referring to FIG. 53, in an embodiment, in a semiconductor package 2003-2, each semiconductor chip 2200a includes a semiconductor substrate 4010, a first structure 4100 on the semiconductor substrate 4010, and a second structure 4200 on and bonded with the first structure 4100 by a wafer bonding method.

The first structure 4100 includes a peripheral circuit region in which a peripheral circuit wiring 4110 and first bonding structures 4150 may be formed. The second structure 4200 includes a common source line 4205, a gate electrode structure 4210 between the common source line 4205 and the first structure 4100, memory channel structures 4220 and the division structure 3230 (refer to FIG. 51) that extend through the gate electrode structure 4210, and second bonding structures 4250 that are electrically connected to the memory channel structures 4220 and the word lines WL (refer to FIG. 50) of the gate electrode structure 4210. For example, the second bonding structures 4250 are electrically connected to the memory channel structures 4220 and the word lines WL (refer to FIG. 50) through bit lines 4240 that are electrically connected to the memory channel structures 4220 and the gate connection wirings 4235 that are electrically connected to the word lines WL (refer to FIG. 50), respectively. The first bonding structures 4150 of the first structure 4100 and the second bonding structures 4250 of the second structure 4200 contact each other and are bonded with each other. The first bonding structures 4150 and the second bonding structures 4250 include, for example, copper.

Each semiconductor chip 2200a further includes the input/output pad 2210 (refer to FIG. 51) that are electrically connected to the peripheral circuit wirings 4110 of the first structure 4100.

The semiconductor chips 2200 of FIG. 52 and the semiconductor chips 2200a of FIG. 53 are electrically connected with each other by the connection structures 2400 in a bonding wire method. However, in exemplary embodiments, semiconductor chips such as the semiconductor chips 2200 of FIG. 52 and the semiconductor chips 2200a of FIG. 4 in the same semiconductor package are electrically connected with each other by a connection structure including a TSV.

While exemplary embodiments have been particularly shown and described, it will be understood by one of ordinary skill in the art that variations in form and detail may be made therein without departing from the spirit and scope of the claims.

What is claimed is:

1. A semiconductor device, comprising:
a common source line (CSL) driver disposed on a substrate;
a common source plate (CSP) disposed on the CSL driver;
a gate electrode structure disposed on the CSP and that includes gate electrodes that are spaced apart from each other in a first direction substantially perpendicular to an upper surface of the substrate, wherein each of the gate electrodes extends in a second direction that is substantially parallel to the upper surface of the substrate;
a memory channel structure disposed on the CSP, wherein the memory channel structure extends through the gate electrode structure and is connected to the CSP;
a first upper wiring structure that contacts an upper surface of the CSP;
a first through via disposed on the substrate, wherein the first through via extends through the CSP in the first direction, is electrically connected to the first upper wiring structure and the CSL driver, but does not contact the CPS; and
a dummy wiring structure that contacts the upper surface of the CSP but is not electrically connected to the CSL driver.

2. The semiconductor device of claim 1, wherein the dummy wiring structure includes:
a first upper contact plug that contacts the upper surface of the CSP and extends in the first direction;
a first upper via that contacts an upper surface of the first upper contact plug; and
a first upper wiring that contacts an upper surface of the first upper via.

3. The semiconductor device of claim 2, wherein the dummy wiring structure further includes:
a second upper via that contacts an upper surface of the first upper wiring; and
a second upper wiring that contacts an upper surface of the second upper via.

4. The semiconductor device of claim 3, wherein the dummy wiring structure further includes:
a third upper via that contacts an upper surface of the second upper wiring; and
a third upper wiring that contacts an upper surface of the third upper via.

5. The semiconductor device of claim 4, wherein the first upper wiring structure includes:
a second upper contact plug that contacts the upper surface of the CSP and extends in the first direction;
a fourth upper via that contacts an upper surface of the second upper contact plug;
a fourth upper wiring that contacts an upper surface of the fourth upper via;
a fifth upper via that contacts an upper surface of the fourth upper wiring;
a fifth upper wiring that contacts an upper surface of the fifth upper via;
a sixth upper via that contacts an upper surface of the fifth upper wiring; and
a sixth upper wiring that contacts an upper surface of the sixth upper via.

6. The semiconductor device of claim 5, wherein the fourth, the fifth, and the sixth upper wirings are formed at substantially a same level as but are not connected to the first, the second, and the third upper wirings, respectively.

7. The semiconductor device of claim 1, wherein the first upper wiring structure includes:
a first upper contact plug that contacts the upper surface of the CSP and extending in the first direction;
a first upper via that contacts an upper surface of the first upper contact plug;
a first upper wiring that contacts an upper surface of the first upper via;
a second upper via that contacts an upper surface of the first upper wiring;
a second upper wiring that contacts an upper surface of the second upper via;
a third upper via that contacts an upper surface of the second upper wiring; and
a third upper wiring that contacts an upper surface of the third upper via.

8. The semiconductor device of claim 7, further comprising a second upper wiring structure that contacts an upper surface of the first through via, wherein the second upper wiring is electrically connected to the first upper wiring structure.

9. The semiconductor device of claim 8, wherein the second upper wiring structure includes:
a fourth upper via that contacts an upper surface of the first through via;
a fourth upper wiring that contacts an upper surface of the fourth upper via;
a fifth upper via that contacts an upper surface of the fourth upper wiring;
a fifth upper wiring that contacts an upper surface of the fifth upper via;
a sixth upper via that contacts an upper surface of the fifth upper wiring; and
a sixth upper wiring that contacts an upper surface of the sixth upper via.

10. The semiconductor device of claim 9, wherein the third and the sixth upper wirings are formed at a same level and are connected to each other.

11. The semiconductor device of claim 1, wherein the first upper wiring structure is formed on an edge of the CSP.

12. The semiconductor device of claim 11, wherein the first upper wiring structure is one of a plurality of first upper wiring structures on the CSP that are spaced apart from each other.

13. The semiconductor device of claim 12, wherein the dummy wiring structure is formed on the CSP between the plurality of first upper wiring structures.

14. The semiconductor device of claim 1, further comprising:
a filling layer formed at a same level as the CSP, wherein the filling layer extends through the CSP and includes an insulating material,
wherein the first through via extends through the filling layer.

15. The semiconductor device of claim 14, wherein the first upper wiring structure is formed on a portion of the CSP adjacent to the filling layer.

16. A semiconductor device, comprising:
a lower circuit pattern disposed on a substrate;
a common source plate (CSP) disposed on the lower circuit pattern;
a gate electrode structure disposed on the CSP, wherein the gate electrode structure includes gate electrodes spaced apart from each other in a first direction substantially perpendicular to an upper surface of the substrate, wherein each of the gate electrodes extends in a second direction substantially parallel to the upper surface of the substrate;

a memory channel structure disposed on the CSP and that extends through the gate electrode structure, wherein the memory channel structure is connected to the CSP;

a first upper wiring structure that contacts an upper surface of the CSP;

a second upper wiring structure that contacts the upper surface of the CSP, wherein the second upper wiring structure is spaced apart from the first upper wiring structure;

a through via disposed on the substrate, wherein the through via extends through the CSP in the first direction and is electrically connected to the lower circuit pattern but does not contact the CSP; and a third upper wiring structure that contacts an upper surface of the through via, wherein the first upper wiring structure is connected to the third upper wiring structure, and wherein the second upper wiring structure is not connected to the third upper wiring structure, and does not receive an electric signal from the lower circuit pattern.

17. The semiconductor device of claim 16, wherein the first upper wiring structure includes:

a first upper contact plug that contacts the upper surface of the CSP and extends in the first direction;

a first upper via that contacts an upper surface of the first upper contact plug;

a first upper wiring that contacts an upper surface of the first upper via;

a second upper via that contacts an upper surface of the first upper wiring;

a second upper wiring that contacts an upper surface of the second upper via;

a third upper via that contacts an upper surface of the second upper wiring; and a third upper wiring that contacts an upper surface of the third upper via.

18. The semiconductor device of claim 17, wherein the second upper wiring structure includes:

a second upper contact plug that contacts the upper surface of the CSP and extends in the first direction;

a fourth upper via that contacts an upper surface of the second upper contact plug; and a fourth upper wiring that contacts an upper surface of the fourth upper via.

19. The semiconductor device of claim 18, wherein the second upper wiring structure further includes:

a fifth upper via that contacts an upper surface of the fourth upper wiring; and a fifth upper wiring that contacts an upper surface of the fifth upper via.

20. A semiconductor device, comprising:

a common source line (CSL) driver disposed on a substrate;

a page buffer disposed on the substrate;

a common source plate (CSP) disposed on the CSL driver and the page buffer, a filling layer formed at a same level as and that extends through the CSP;

a gate electrode structure disposed on the CSP, wherein the gate electrode structure includes gate electrodes that are spaced apart from each other in a first direction that is substantially perpendicular to an upper surface of the substrate, wherein each of the gate electrodes extends in a second direction substantially parallel to the upper surface of the substrate;

a memory channel structure disposed on the CSP, wherein the memory channel structure extends through the gate electrode structure and is connected to the CSP;

a first upper wiring structure that contacts an upper surface of the CSP;

a second upper wiring structure that contacts the upper surface of the CSP, wherein the second upper wiring structure is spaced apart from the first upper wiring structure;

a first through via disposed on the substrate, wherein first through via extends through the filling layer in the first direction and is electrically connected to the CSL driver;

a second through via disposed on the substrate, wherein second through via extends through the filling layer in the first direction and is electrically connected to the page buffer;

a third upper wiring structure electrically connected to the gate electrode structure; and a bit line electrically connected to the second through via and the memory channel structure, wherein the first upper wiring structure is connected to the first though via, and wherein the second upper wiring structure is not connected to the first though via, and does not receive an electric signal from the lower circuit pattern.

* * * * *